(12) United States Patent
Itai et al.

(10) Patent No.: US 9,057,966 B2
(45) Date of Patent: *Jun. 16, 2015

(54) INFORMATION PROCESSING APPARATUS, INFORMATION PROCESSING METHOD, AND MEMORY MEDIUM

(75) Inventors: Daisuke Itai, Utsunomiya (JP);
Yoshihiro Kawauchi, Utsunomiya (JP);
Kunitaka Ozawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 824 days.

This patent is subject to a terminal disclaimer.

(21) Appl. No.: 12/356,251

(22) Filed: Jan. 20, 2009

(65) Prior Publication Data
US 2009/0187379 A1   Jul. 23, 2009

(30) Foreign Application Priority Data

Jan. 21, 2008 (JP) ................................. 2008-010997
Feb. 27, 2008 (JP) ................................. 2008-046901

(51) Int. Cl.
G06F 17/18  (2006.01)
G03F 7/20   (2006.01)

(52) U.S. Cl.
CPC .................................. G03F 7/70525 (2013.01)

(58) Field of Classification Search
USPC ........................................................ 702/179
See application file for complete search history.

(56) References Cited

U.S. PATENT DOCUMENTS

| | | |
|---|---|---|
| 5,528,043 A | 6/1996 | Spivey et al. |
| 5,805,866 A | 9/1998 | Magome et al. |
| 5,989,761 A | 11/1999 | Kawakubo et al. |
| 6,163,030 A | 12/2000 | Johnson et al. |
| 6,489,176 B2 | 12/2002 | Ninomiya |

(Continued)

FOREIGN PATENT DOCUMENTS

| | | |
|---|---|---|
| JP | 04-282820 A | 10/1992 |
| JP | 2000-243794 A | 9/2000 |
| TW | 200519430 A | 6/2005 |
| TW | 200739371 A | 10/2007 |

OTHER PUBLICATIONS

Nitin Chopra, Control of Multiwalled Carbon Nanotube Diameter by Selective Growth on the Exposed Edge of a Thin Film Multilayer Structure, Aug. 30, 2002, © 2002 American Chemical Society, p. 1177-1181.*

(Continued)

*Primary Examiner* — Tung S Lau
(74) *Attorney, Agent, or Firm* — Canon USA Inc. IP Division

(57) ABSTRACT

An information processing apparatus for processing information generated by an exposure apparatus which exposes a substrate to radiant energy, comprises an information collecting unit configured to collect first apparatus information obtained by the exposure apparatus via an operation thereof with respect to each of a plurality of first regions which form a first array defined on the substrate, a converting unit configured to convert at least a part of the first apparatus information collected with respect to each of the plurality of first regions by the information collecting unit into second apparatus information with respect to each of a plurality of second regions which form a second array, a statistical processing unit configured to statistically process the second apparatus information, and an analyzing unit configured to analyze the statistical processing result obtained by the statistical processing unit.

10 Claims, 59 Drawing Sheets

(56) References Cited

U.S. PATENT DOCUMENTS

| | | |
|---|---|---|
| 6,594,334 B1 | 7/2003 | Ota |
| 2008/0208498 A1 | 8/2008 | Itai |
| 2008/0215295 A1 | 9/2008 | Shiraishi |
| 2009/0187379 A1 | 7/2009 | Itai et al. |

OTHER PUBLICATIONS

Peter O'Dette, Optimization of Dry Etch Process Conditions for HgCdTe Detector Arrays, Journal of Electronic Materials, vol. 28, No. 6, 1999, p. 821-825.*

Sharad Saxena, Test Structures and Analysis Techniques for Estimation of the Impact of Layout on MOSFET Performance and Variability, IEEE 2004 Int. Conference on Microelectronic Test Structures, vol. 17, Mar. 2004, 4 Pages.*

Akira Hamamatsu, Statistical Threshold Method for Semiconductor Inspection, 12th A-PCNDT 2006—Asia-Pacific Conference on NDT, Nov. 5-10, 2006, Auckland, New Zealand, 8 pages.*

Non-Final Rejection Office Action, Notification Date Feb. 23, 2010, U.S. Appl. No. 12/036,499.

* cited by examiner

FIG. 3E

| | |
|---|---|
| MAXIMUM VALUE OF FOCUS/LEVELING MEASUREMENT VALUE IN SHOT REGION | MAXIMUM VALUE OF MA IN X DIRECTION IN SHOT REGION |
| MINIMUM VALUE OF FOCUS/LEVELING MEASUREMENT VALUE IN SHOT REGION | MINIMUM VALUE OF MA IN X DIRECTION IN SHOT REGION |
| AVERAGE OF FOCUS/LEVELING MEASUREMENT VALUE IN SHOT REGION | AVERAGE OF MA IN X DIRECTION IN SHOT REGION |
| STANDARD DEVIATION OF FOCUS/LEVELING MEASUREMENT VALUE IN SHOT REGION | STANDARD DEVIATION OF MA IN X DIRECTION IN SHOT REGION |
| MAXIMUM VALUE OF X MEASUREMENT VALUE IN SHOT REGION | MAXIMUM VALUE OF MA IN Y DIRECTION IN SHOT REGION |
| MINIMUM VALUE OF X MEASUREMENT VALUE IN SHOT REGION | MINIMUM VALUE OF MA IN Y DIRECTION IN SHOT REGION |
| AVERAGE OF X MEASUREMENT VALUE IN SHOT REGION | AVERAGE OF MA IN Y DIRECTION IN SHOT REGION |
| STANDARD DEVIATION OF X MEASUREMENT VALUE IN SHOT REGION | STANDARD DEVIATION OF MA IN Y DIRECTION IN SHOT REGION |
| MAXIMUM VALUE OF Y MEASUREMENT VALUE IN SHOT REGION | MAXIMUM VALUE OF MA IN θ DIRECTION IN SHOT REGION |
| MINIMUM VALUE OF Y MEASUREMENT VALUE IN SHOT REGION | MINIMUM VALUE OF MA IN θ DIRECTION IN SHOT REGION |
| AVERAGE OF Y MEASUREMENT VALUE IN SHOT REGION | AVERAGE OF MA IN θ DIRECTION IN SHOT REGION |
| STANDARD DEVIATION OF Y MEASUREMENT VALUE IN SHOT REGION | STANDARD DEVIATION OF MA IN θ DIRECTION IN SHOT REGION |
| MAXIMUM VALUE OF FOCUS/LEVELING FOLLOWABILITY IN SHOT REGION | MAXIMUM VALUE OF MSD IN X DIRECTION IN SHOT REGION |
| MINIMUM VALUE OF FOCUS/LEVELING FOLLOWABILITY IN SHOT REGION | MINIMUM VALUE OF MSD IN X DIRECTION IN SHOT REGION |
| AVERAGE OF FOCUS/LEVELING FOLLOWABILITY IN SHOT REGION | AVERAGE OF MSD IN X DIRECTION IN SHOT REGION |
| STANDARD DEVIATION OF FOCUS/LEVELING FOLLOWABILITY IN SHOT REGION | STANDARD DEVIATION OF MSD IN X DIRECTION IN SHOT REGION |
| MAXIMUM VALUE OF X FOLLOWABILITY IN SHOT REGION | MAXIMUM VALUE OF MSD IN Y DIRECTION IN SHOT REGION |
| MINIMUM VALUE OF X FOLLOWABILITY IN SHOT REGION | MINIMUM VALUE OF MSD IN Y DIRECTION IN SHOT REGION |
| AVERAGE OF X FOLLOWABILITY IN SHOT REGION | AVERAGE OF MSD IN Y DIRECTION IN SHOT REGION |
| STANDARD DEVIATION OF X FOLLOWABILITY IN SHOT REGION | STANDARD DEVIATION OF MSD IN Y DIRECTION IN SHOT REGION |
| MAXIMUM VALUE OF Y FOLLOWABILITY IN SHOT REGION | MAXIMUM VALUE OF MSD IN θ DIRECTION IN SHOT REGION |
| MINIMUM VALUE OF Y FOLLOWABILITY IN SHOT REGION | MINIMUM VALUE OF MSD IN θ DIRECTION IN SHOT REGION |
| AVERAGE OF Y FOLLOWABILITY IN SHOT REGION | AVERAGE OF MSD IN θ DIRECTION IN SHOT REGION |
| STANDARD DEVIATION OF Y FOLLOWABILITY IN SHOT REGION | STANDARD DEVIATION OF MSD IN θ DIRECTION IN SHOT REGION |

324 SHOT REGION EXPOSURE CONTROL RESULT

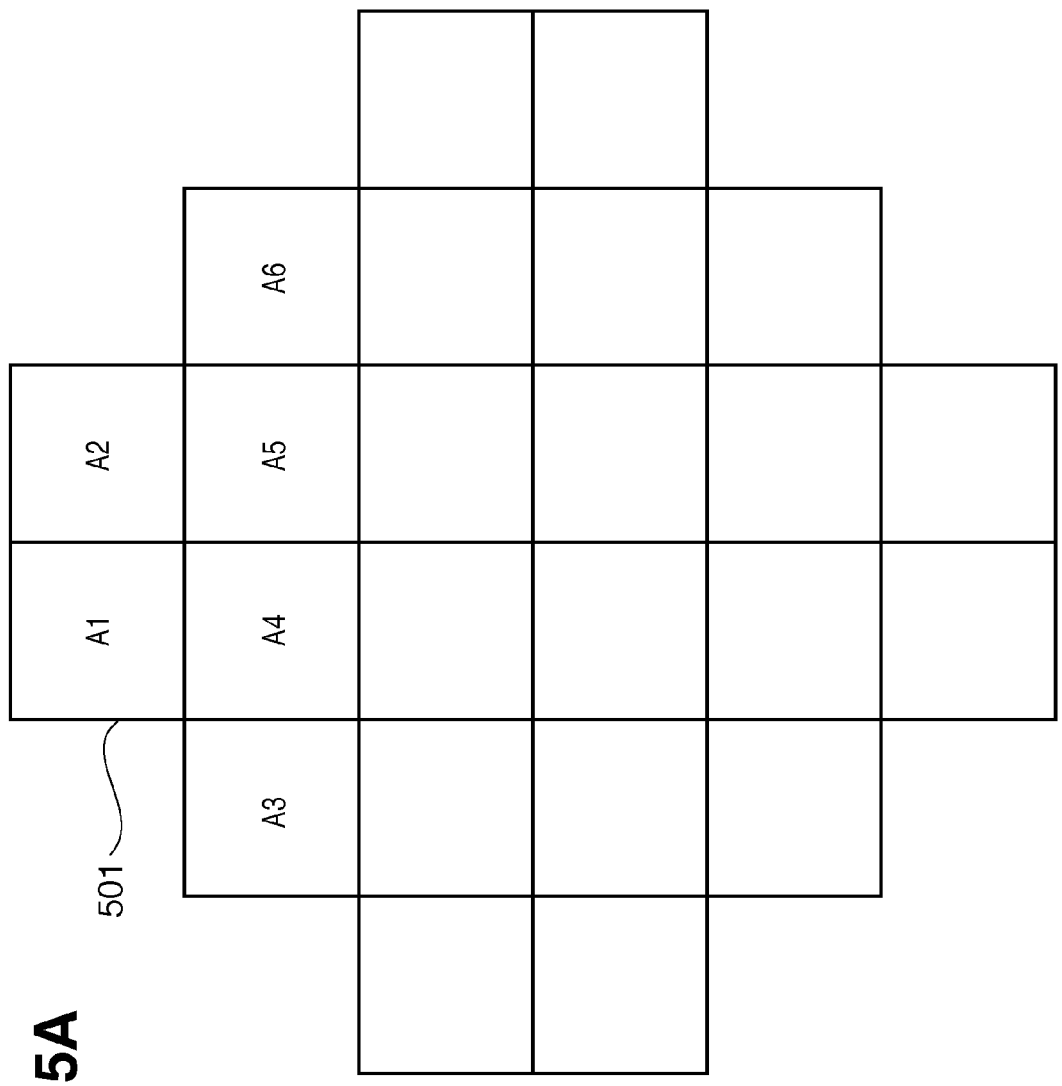

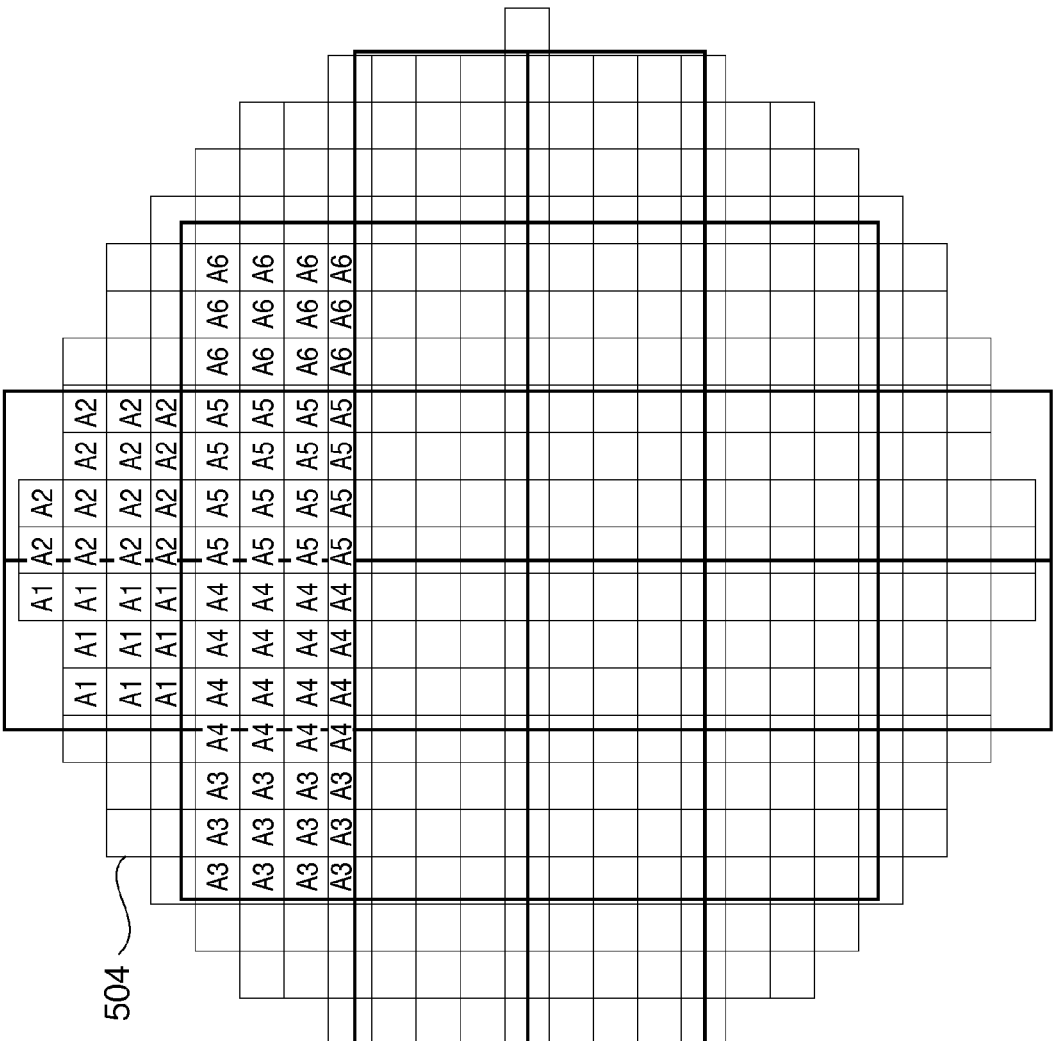

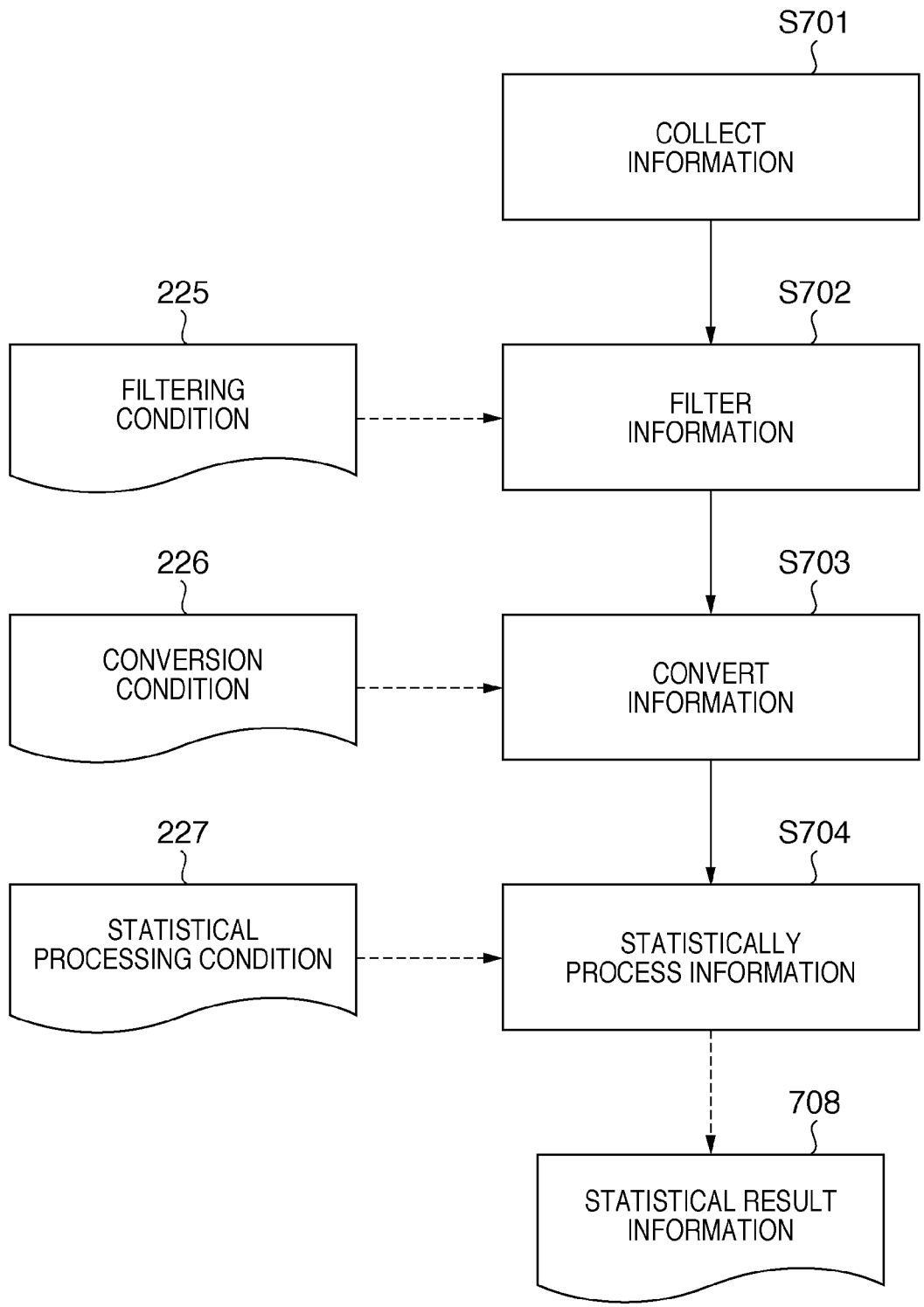

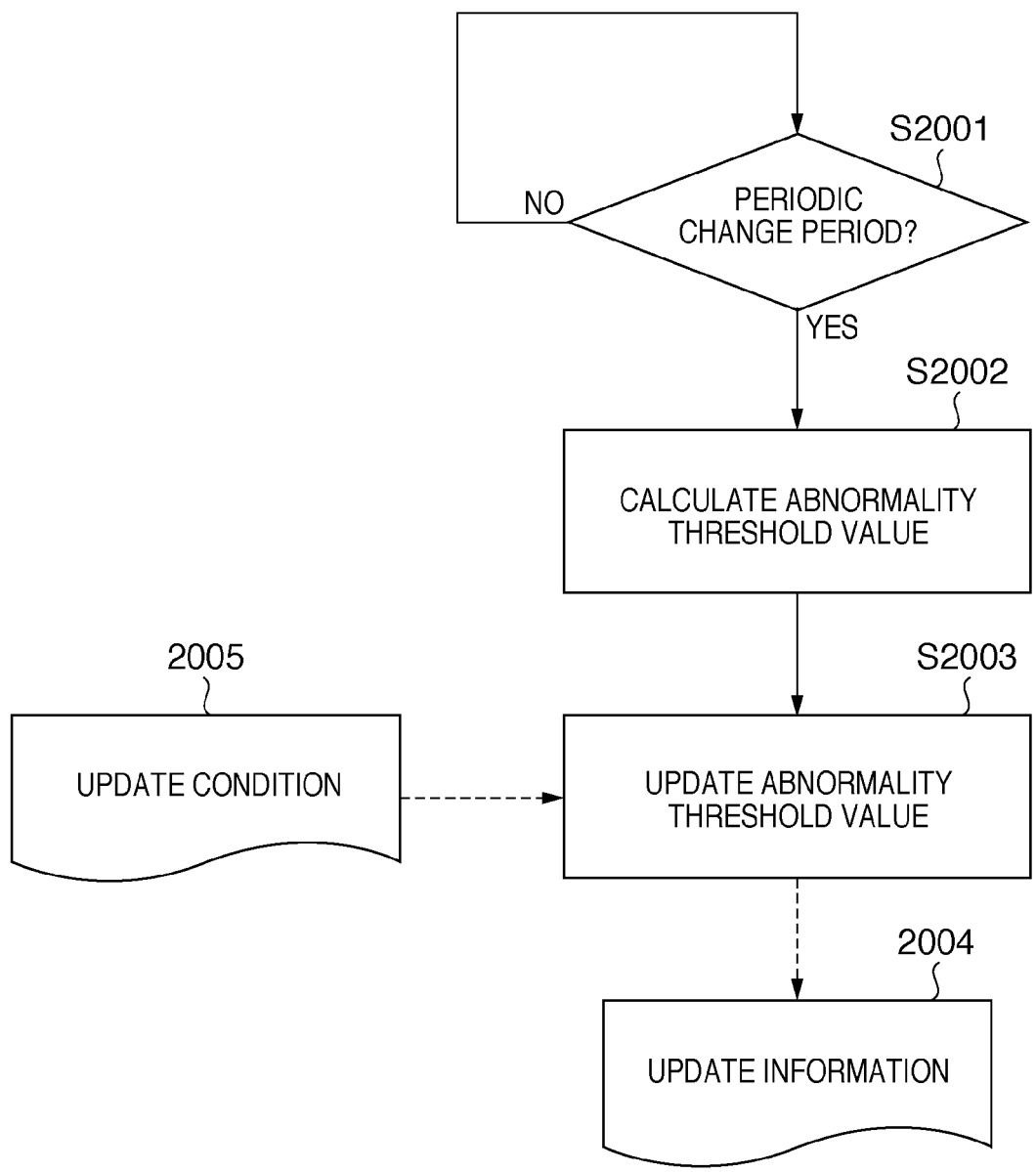
F I G. 22B

F I G. 23

| X begin (mm) | X end (mm) | Y begin (mm) | Y end (mm) | Z CORRECTION VALUE(μm) |
|---|---|---|---|---|
| 50 | 40 | −50 | −40 | 3 |
| 50 | 40 | −40 | −30 | 2 |
| 50 | 40 | −30 | −20 | 4 |
| 50 | 40 | −20 | −10 | 5 |
| ⋮ | ⋮ | ⋮ | ⋮ | ⋮ |
| 50 | 40 | 40 | 50 | 2 |
| 40 | 30 | −50 | −40 | 2 |
| 40 | 30 | −40 | −30 | 4 |
| 40 | 30 | −30 | −20 | 5 |
| ⋮ | ⋮ | ⋮ | ⋮ | ⋮ |

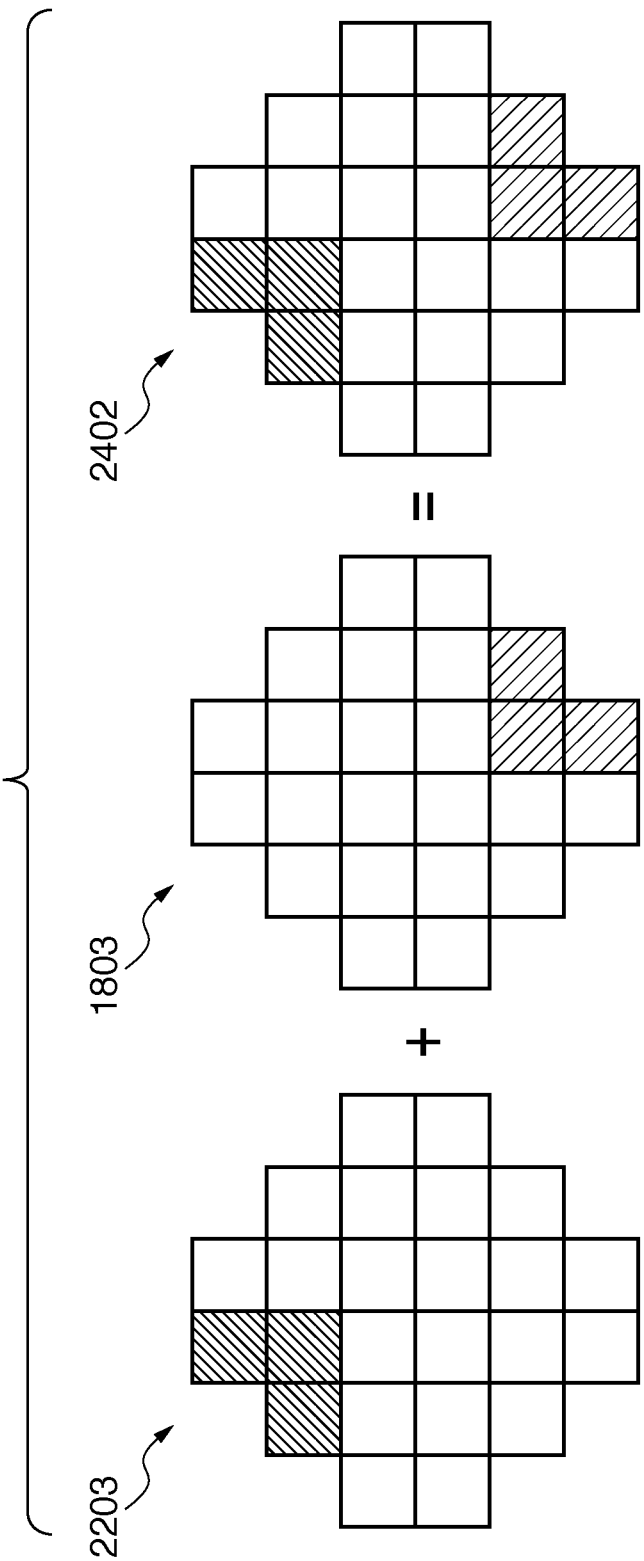

F I G. 32C
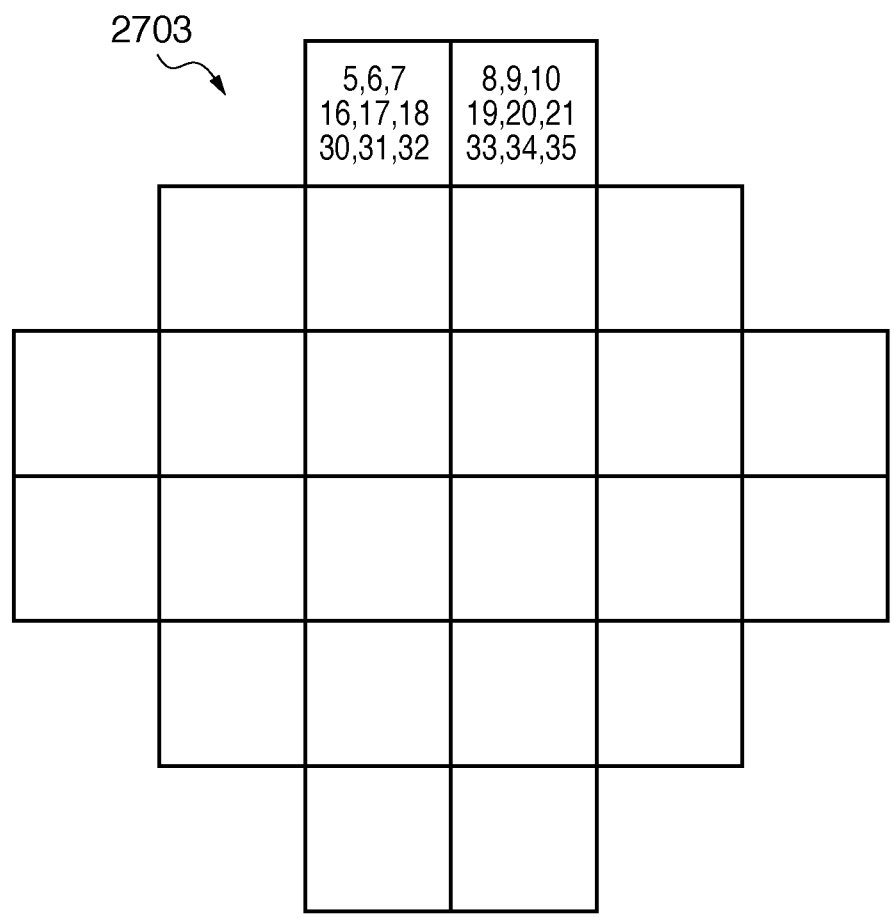

F I G. 32D
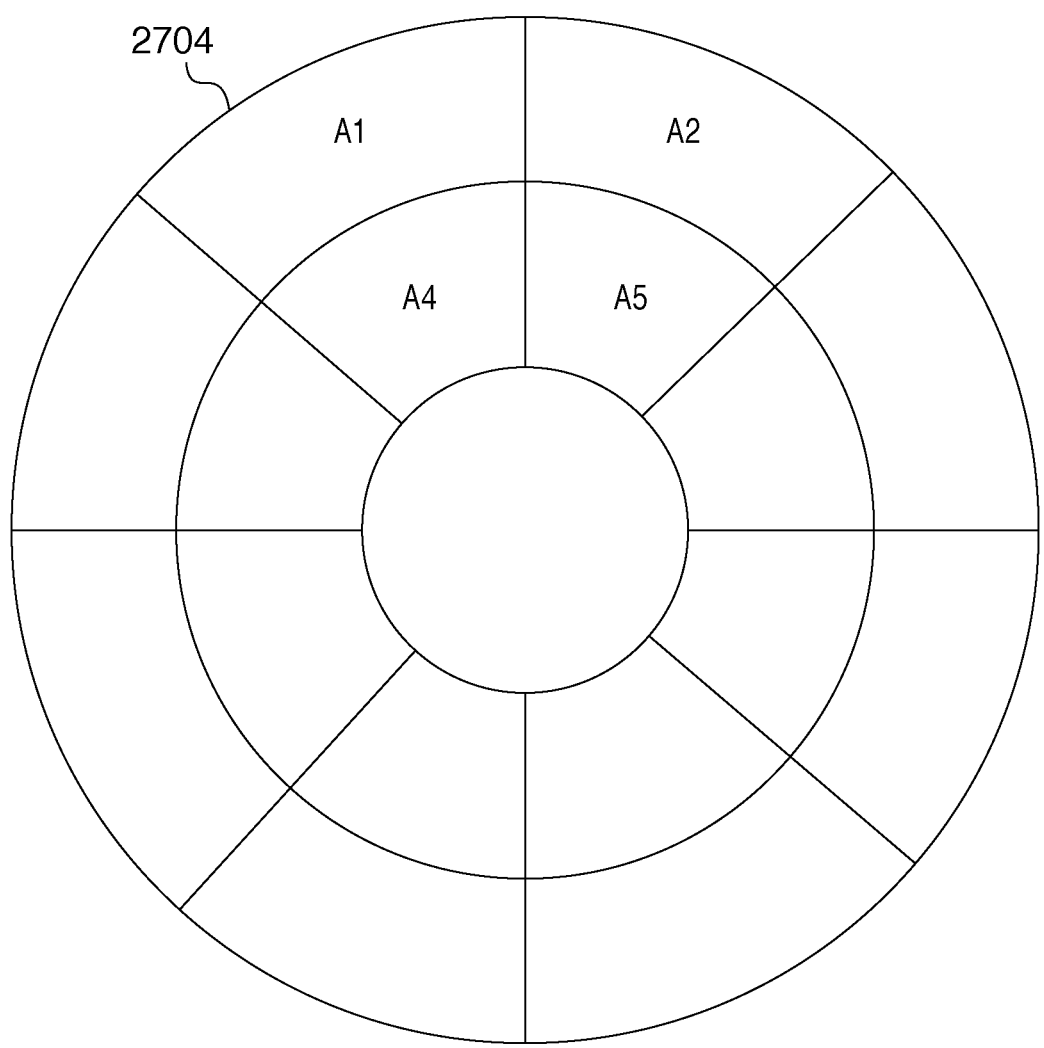

F I G. 32E
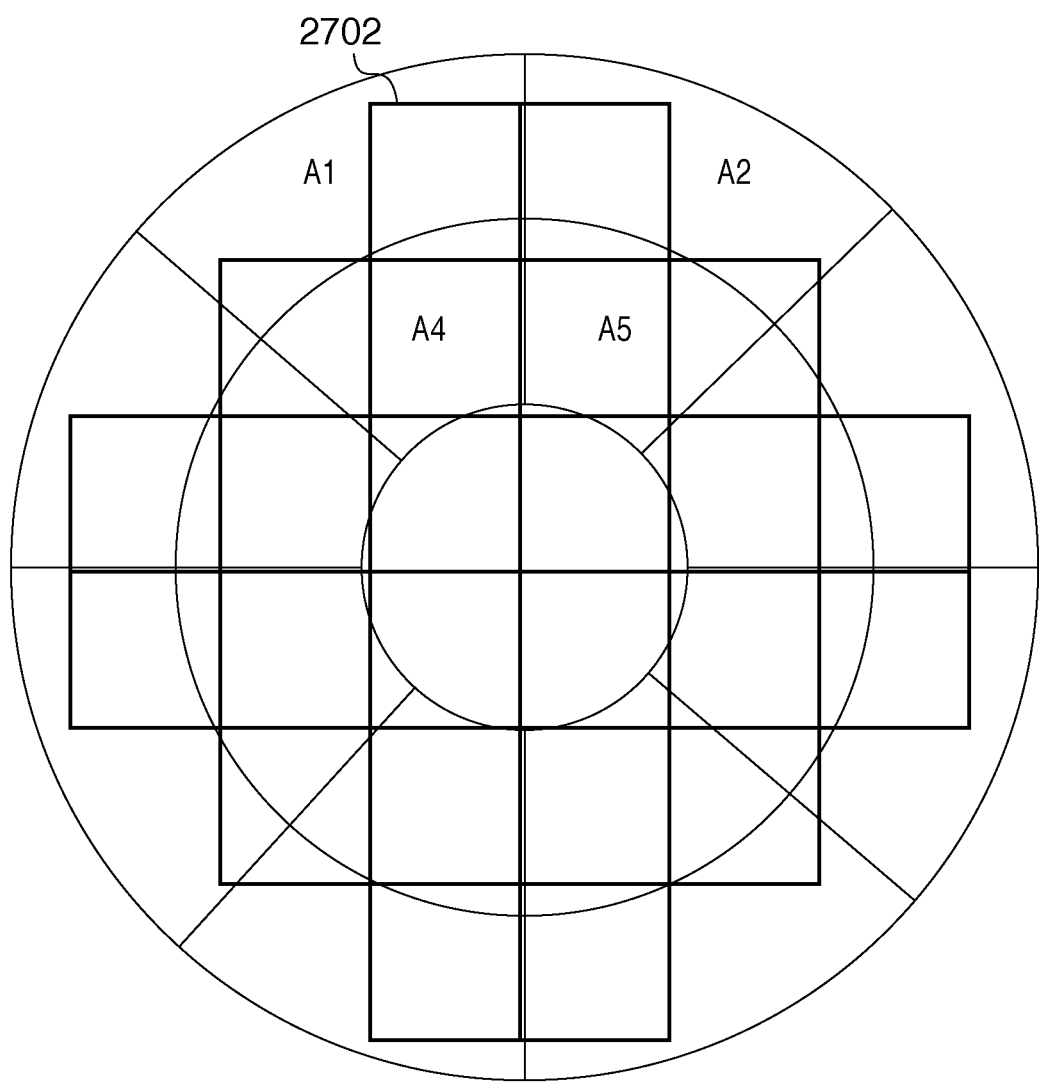

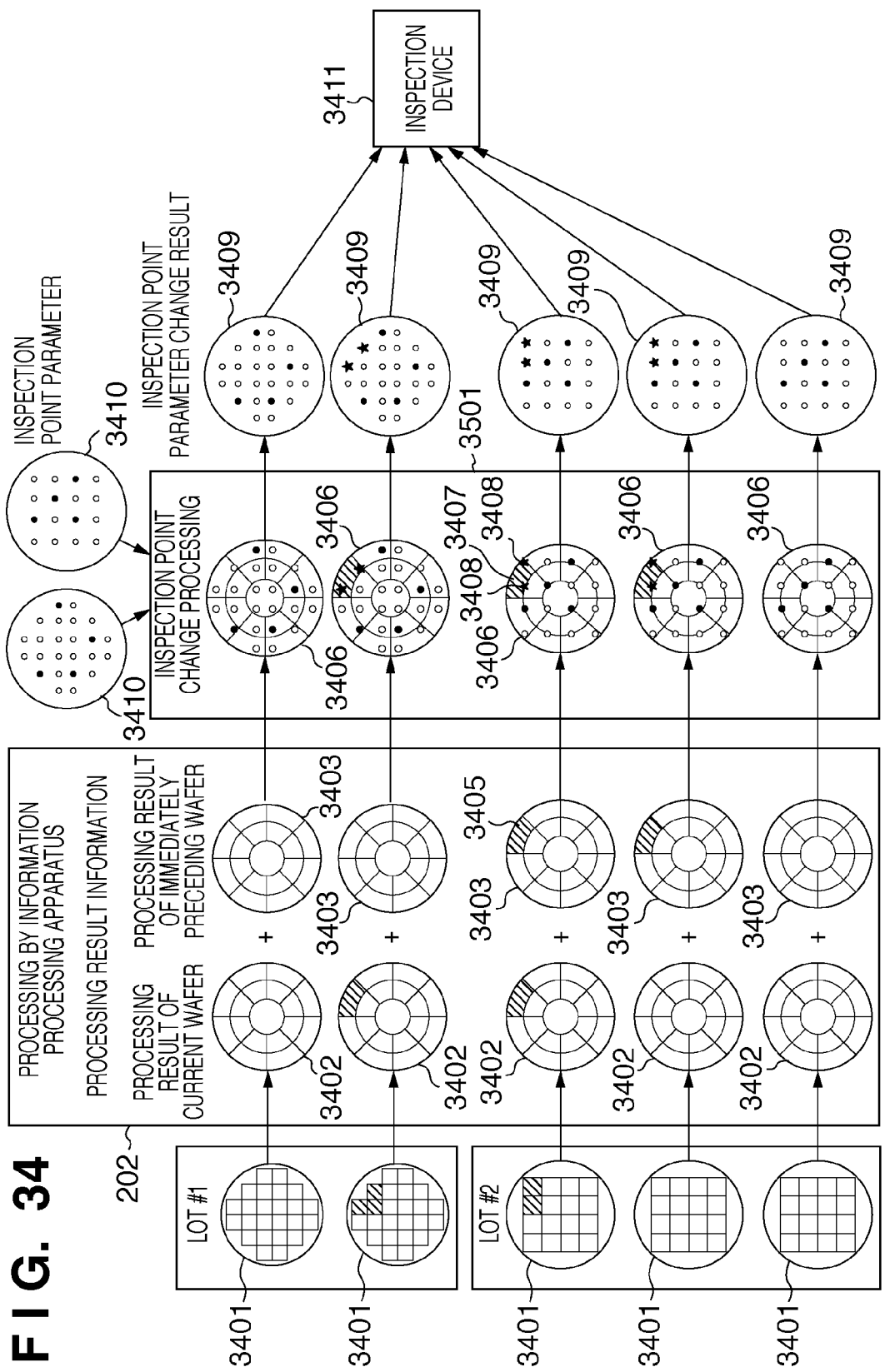

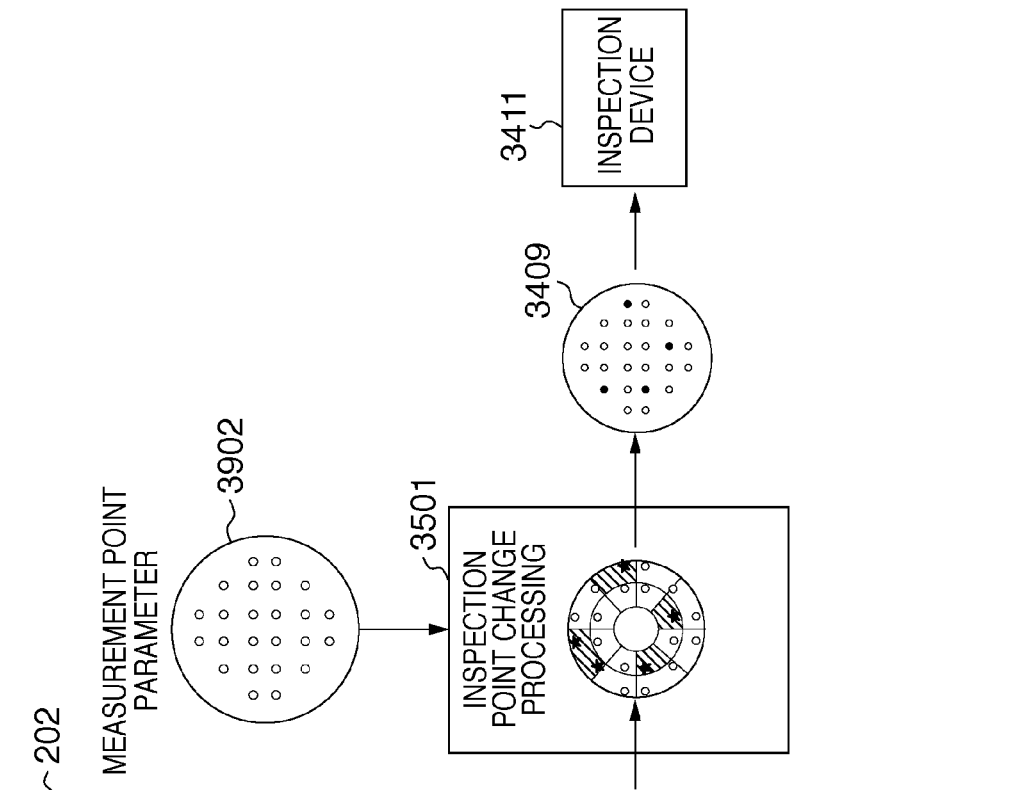
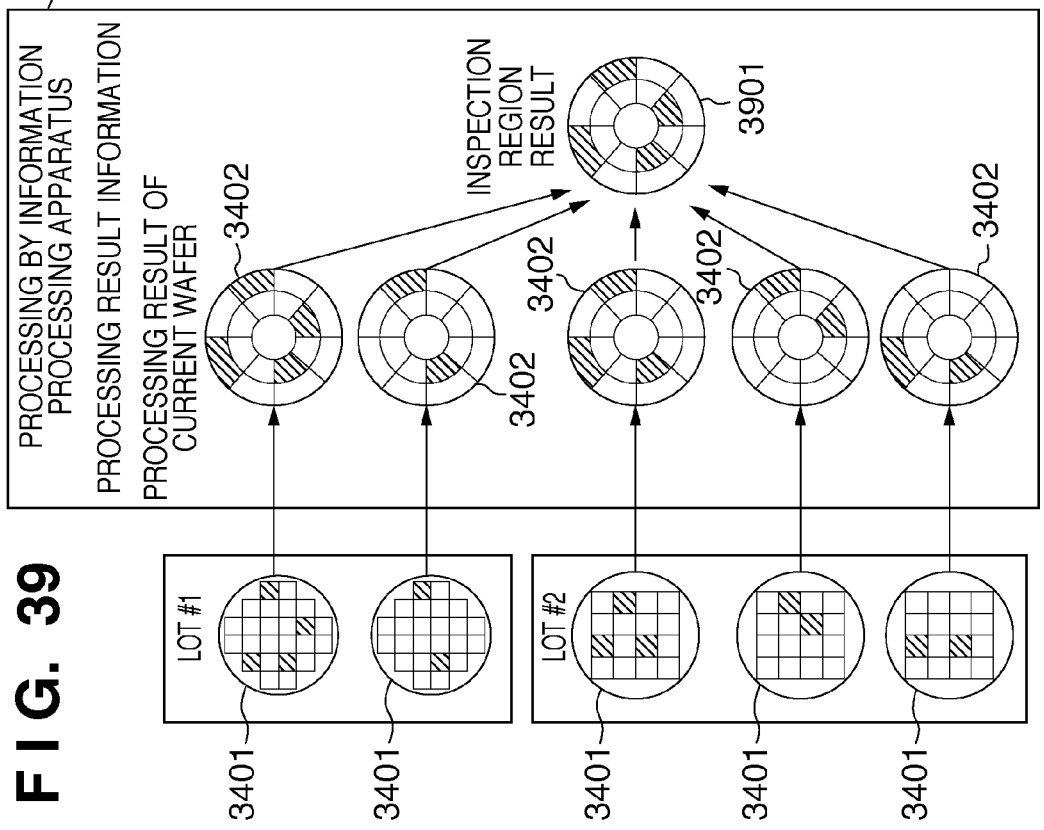
FIG. 39

INFORMATION PROCESSING APPARATUS, INFORMATION PROCESSING METHOD, AND MEMORY MEDIUM

BACKGROUND OF THE INVENTION

1. Field of the Invention

The present invention relates to an information processing apparatus, information processing method, and memory medium for processing information generated by an exposure apparatus.

2. Description of the Related Art

In manufacturing a semiconductor device, it is constantly demanded to improve the resolving power of a pattern and the overlay accuracy. In recent years, as the shortening of the exposure light wavelength is approaching a limit, a demand for a high-performance exposure apparatus is increasing.

Since the life cycles of electronic devices have shortened over time, the production mode is naturally shifting to high-variety, low-volume production for which trial production must be performed and commercial production must begin within a short period of time. To improve the productivity even in the high-variety, low-volume production, it is demanded to decrease the fraction of defective products.

To meet the above-described demands, it is necessary to know errors for their respective factors classified into apparatus, process, wafer, and shot factors, detect an abnormality at the shot level, and detect a temporal change in abnormality. These results are fed back to an apparatus, production process, and even a design pattern, thereby promising an improvement in productivity from a total point of view.

At present, however, data measured by exposure apparatuses during production cannot serve to uniformly compare and determine their performances from a difference in operating parameter or shot region array. To confirm the apparatus performance, an evaluation exposure job is executed using a common parameter and standard shot region array and various data involved are measured in this job. An inspection method of this kind must be executed after stopping the production of a semiconductor device, resulting in a waste of production time.

SUMMARY OF THE INVENTION

The present invention has been made based on the above-described situation, and has as its exemplary object to effectively use information obtained by an exposure apparatus via an operation thereof.

According to the first aspect of the present invention, there is provided an information processing apparatus for processing information generated by an exposure apparatus which exposes a substrate to radiant energy, the information processing apparatus comprising an information collecting unit configured to collect first apparatus information obtained by the exposure apparatus via an operation thereof with respect to each of a plurality of first regions which form a first array defined on the substrate, a converting unit configured to convert at least a part of the first apparatus information collected with respect to each of the plurality of first regions by the information collecting unit into second apparatus information with respect to each of a plurality of second regions which form a second array, a statistical processing unit configured to statistically process the second apparatus information; and an analyzing unit configured to analyze the statistical processing result obtained by the statistical processing unit.

According to the second aspect of the present invention, there is provided an information processing apparatus for processing information generated by an exposure apparatus which exposes a substrate to radiant energy, the information processing apparatus comprising an information collecting unit configured to collect first apparatus information obtained by the exposure apparatus via an operation thereof with respect to each of a plurality of first regions which form a first array defined on the substrate, a converting unit configured to convert at least a part of the first apparatus information collected with respect to each of the plurality of first regions by the information collecting unit into second apparatus information with respect to each of a plurality of second regions which form a second array, a statistical processing unit configured to statistically process the second apparatus information, and a feedback unit configured to determine information to be fed back to the exposure apparatus based on the statistical processing result obtained by the statistical processing unit, and feed back the information to the exposure apparatus.

According to the third aspect of the present invention, there is provided an information processing apparatus for processing information generated by an exposure apparatus which exposes a substrate to radiant energy, the information processing apparatus comprising an information collecting unit configured to collect first apparatus information obtained by the exposure apparatus via an operation thereof with respect to each of a plurality of first regions which form a first array defined on the substrate, a converting unit configured to convert at least a part of the first apparatus information collected with respect to each of the plurality of first regions by the information collecting unit into second apparatus information with respect to each of a plurality of second regions which form a second array, a statistical processing unit configured to statistically process the second apparatus information, and an inspection condition determining unit configured to determine an inspection condition of the substrate processed by the exposure apparatus, based on the statistical processing result obtained by the statistical processing unit.

According to the fourth aspect of the present invention, there is provided an information processing apparatus for processing information generated by an exposure apparatus which exposes a substrate to radiant energy, the information processing apparatus comprising an information collecting unit configured to collect, from the exposure apparatus, first apparatus information obtained via an exposure operation with respect to each of a plurality of regions which form an arbitrary array defined on the substrate, a converting unit configured to convert at least a part of the first apparatus information collected by the information collecting unit into second apparatus information with respect to each of a plurality of standard regions which form a standard region array, and a statistical processing unit configured to statistically process the second apparatus information, wherein the converting unit executes processing of converting the statistical processing result obtained by the statistical processing unit into apparatus information with respect to each of a plurality of regions which form a designated array.

According to the fifth aspect of the present invention, there is provided an exposure system comprising an exposure apparatus configured to expose a substrate to radiant energy, and any one of the above information processing apparatuses for processing information generated by the exposure apparatus.

According to the sixth aspect of the present invention, there is provided a method of processing information generated by an exposure apparatus which exposes a substrate to radiant energy, the method comprising a collection step of collecting, from the exposure apparatus, first apparatus information obtained via an exposure operation with respect to each of a plurality of regions which form an arbitrary array defined on the substrate, a conversion step of converting at least a part of the first apparatus information collected in the collection step into second apparatus information with respect to each of a plurality of standard regions which form a standard region array, and a statistical processing step of statistically processing the second apparatus information, wherein in the conversion step, processing of converting the statistical processing result obtained by the statistical processing unit into apparatus information with respect to each of a plurality of regions which form a designated array is executed.

According to the seventh aspect of the present invention, there is provided a memory medium storing a program for causing a computer to process information generated by an exposure apparatus which exposes a substrate to radiant energy, the program causing the computer to execute a collection step of collecting, from the exposure apparatus, first apparatus information obtained via an exposure operation with respect to each of a plurality of regions which form an arbitrary array defined on the substrate, a conversion step of converting at least a part of the first apparatus information collected in the collection step into second apparatus information with respect to each of a plurality of standard regions which form a standard region array, and a statistical processing step of statistically processing the second apparatus information, wherein in the conversion step, processing of converting the statistical processing result obtained by the statistical processing unit into apparatus information with respect to each of a plurality of regions which form a designated array is executed.

Further features of the present invention will become apparent from the following description of exemplary embodiments with reference to the attached drawings.

BRIEF DESCRIPTION OF THE DRAWINGS

FIGS. 3A to 3E are views showing an example of one shot region information collected by an information collecting unit;

FIGS. 5A to 5F are views schematically showing the first example of conversion processing by the converting unit;

FIG. 7 is a flowchart illustrating the sequence of processing of analyzing design-dependent apparatus information (first apparatus information) according to the preferred embodiment of the present invention;

FIG. 22B is a flowchart illustrating an example in which the abnormality threshold value is calculated periodically;

FIG. 23 is a table illustrating a data table of the control correction value;

FIG. 31 is a view for explaining a method of obtaining the control value in a specific process in a specific exposure apparatus;

FIGS. 32A to 32F are views illustrating conversion processing;

FIG. 34 is a view illustrating a method of determining the inspection region;

FIG. 39 is a view for exemplifying determination of inspection points.

DESCRIPTION OF THE EMBODIMENTS

Figure 1:
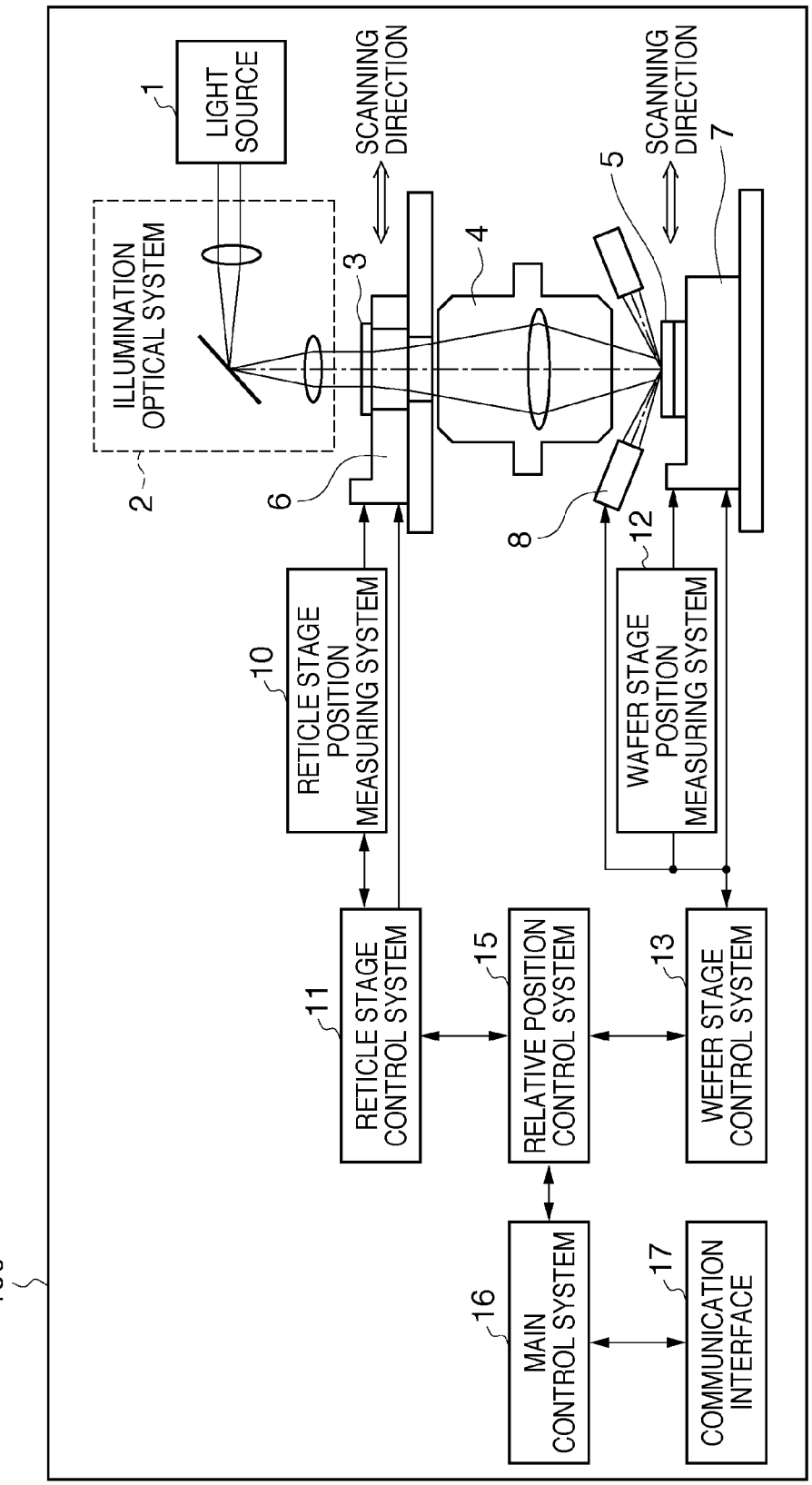
FIG. 1 is a block diagram schematically showing the arrangement of an exposure apparatus according to a preferred embodiment of the present invention.

FIG. 1 is a block diagram schematically showing the arrangement of an exposure apparatus according to a preferred embodiment of the present invention. An exposure apparatus 100 according to this embodiment is of a scanning type. However, the exposure apparatus according to the present invention is not particularly limited to a scanning exposure apparatus.

In the exposure apparatus 100, a light beam emitted by a light source 1 is shaped into a slit via an illumination optical system 2, undergoes light intensity distribution adjustment, and illuminates a reticle 3 held by a reticle stage 6. The pattern of the reticle 3 is transferred, via a projection optical system 4, onto a wafer (substrate) 5 which is coated with a photosensitive agent (resist) and held by a wafer stage (substrate stage) 7. With this operation, a latent image pattern is formed on the photosensitive agent. The latent image pattern is developed into a mask pattern (resist pattern) in a development process.

The illumination optical system 2 can comprise an aperture stop such as an aperture stop including a plurality of circular apertures having different areas to set the value of a coherence factor σ. The illumination optical system 2 can also comprise a ring-like stop for zonal illumination, a quadrupolar stop, and a mechanism (e.g., a plurality of ND filters and a mechanism for switching between them) for adjusting the illumination light intensity. The illumination optical system 2 can also comprise a light intensity detector for measuring the light intensity, a blind inserted at a position conjugate to the reticle 3 to ensure a slit-like illumination range, and a driving mechanism for driving it. The projection optical system 4 can comprise a numerical aperture setting mechanism for setting the numerical aperture, and a lens driving mechanism for correcting the aberration.

Light which illuminates a slit-like illumination region of the pattern of the reticle 3 and is reflected by it is projected onto the wafer 5 via the projection optical system 4. The position of the reticle stage 6 (as a result, the reticle 3) is measured by a reticle stage position measuring system 10 and controlled by a reticle stage control system 11.

The position of the wafer 5 can be measured by a wafer stage position measuring system 12 and focus/leveling measuring system 14. The wafer stage position measuring system 12 measures, for example, the position of the wafer 5 in the optical axis direction (i.e., the Z direction) of the projection optical system 4, two orthogonal axial directions (i.e., the X and Y directions) in a plane perpendicular to the optical axis, and rotational directions about the X-, Y-, and Z-axes. The focus/leveling measuring system 14 measures the surface position of the wafer 5 in the optical axis direction (Z direction) of the projection optical system 4. The focus/leveling measuring system 14 can measure the surface position of the wafer 5 in exposing it. A wafer stage control system 13 controls the position of the wafer stage 7 based on the pieces of information provided from the wafer stage position measuring system 12 and focus/leveling measuring system 14. The measurement value obtained by the focus/leveling measuring system 14 will be referred to as a focus/leveling measurement value hereinafter. The exposure apparatus 100 may also comprise a measuring system for measuring the position of the reticle stage 6 (reticle 3) in the optical axis direction of the projection optical system 4.

To transfer the entire pattern of the reticle 3 with a slit-like illumination light beam onto the wafer 5, the reticle 3 held by the reticle stage 6 is driven in the "scanning direction" shown in FIG. 1. At the same time, the wafer 5 held by the wafer stage 7 is also driven in the "scanning direction" shown in FIG. 1. The reticle 3 and wafer 5 are driven at a speed ratio matching the projection magnification of the projection optical system 4. If the relative position between the reticle 3 and the wafer 5 shifts, a deformed pattern is transferred onto the wafer 5. To avoid this situation, a relative position control system 15 calculates the relative positional shift between the reticle 3 and the wafer 5, and controls the reticle stage control system 11 and wafer stage control system 13 so that it becomes zero.

A main control system 16 controls constituent elements of the exposure apparatus 100, such as the relative position control system 15, reticle stage control system 11, wafer stage control system 13, and illumination optical system 2.

The scanning exposure operation of the exposure apparatus 100 will be explained. First, the main control system 16 acquires setting parameters which define the exposure operation of the exposure apparatus 100 via a communication interface 17. The setting parameters include the position of each shot region, the exposure field angle (the dimension of each shot region), the exposure scanning speed, the exposure scanning direction, the target focus/leveling value, and the target shot alignment value.

Next, the main control system 16 controls the constituent elements of the exposure apparatus 100 based on the above-described setting parameters, and exposes a plurality of shot regions on the wafer by a step & scan scheme.

The main control system 16 has a function of transmitting design-dependent apparatus information (first apparatus information) indicating the performance of the exposure apparatus 100 in the scanning exposure operation for each shot region to an information processing apparatus 202 (to be described later) via the communication interface 17. The design-dependent apparatus information (first apparatus information) can contain a plurality of pieces of shot region information (first region information) obtained by exposing a plurality of shot regions which form a shot region array (first array) defined on the wafer. The shot region array can be defined for each device to be manufactured, in accordance with its design pattern (e.g., its dimension), that is, its process. Each shot region information contains information associated with the control of the exposure apparatus 100, such as the synchronization accuracy, focus/leveling measurement value, and focus/leveling followability. The synchronization accuracy is information associated with the accuracy of synchronously moving (synchronously scanning) the reticle 3 (reticle stage 6) and the wafer 5 (wafer stage 7) in the scanning exposure operation. Information associated with a following error (X, Y) of the reticle stage 6 with respect to the wafer stage 7 in the scanning exposure can be obtained based on the positional information of the reticle stage 6 and wafer stage 7 in exposing each shot region on the wafer 5. Based on this information, the moving average (MA) and moving standard deviation (MSD) can be calculated as the synchronization accuracy.

When the shot region array is changed, pieces of shot region information which constitute design-dependent apparatus information, in turn, change. For example, design-dependent apparatus information in a certain shot region array will be referred to as first apparatus information, and that in a shot region array different from the certain shot region array will be referred to as third apparatus information hereinafter. Design-dependent apparatus information as the third apparatus information can contain a plurality of pieces of shot region information (third region information) obtained via an exposure operation with respect to a plurality of shot regions which form a shot region array (third array) defined on a wafer.

The focus/leveling measurement value is information indicating the position or shape of the wafer surface. The focus/leveling followability is an error of the focus/leveling measurement value with respect to the target focus/leveling position.

Figure 2:
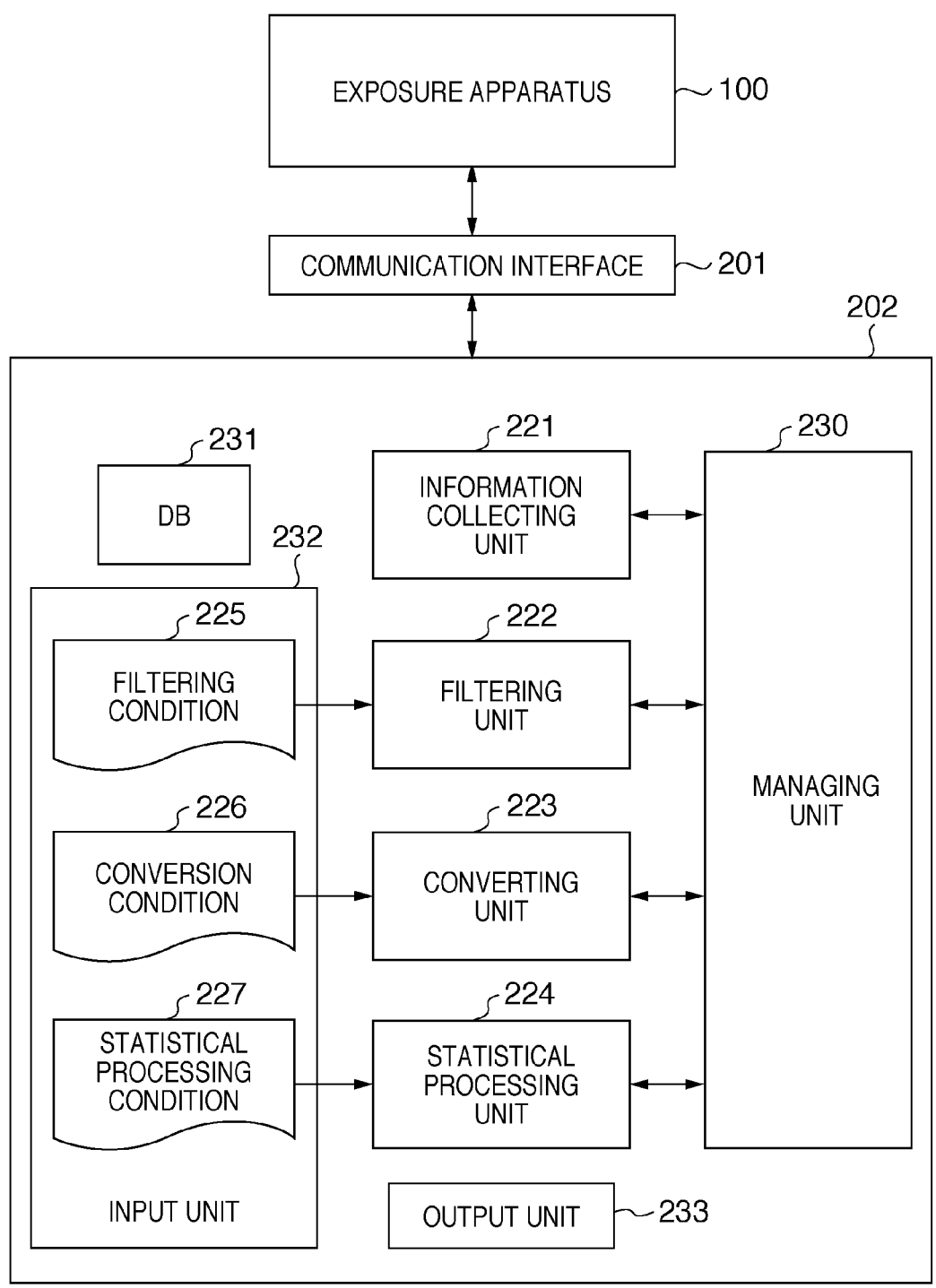
FIG. 2 is a block diagram schematically showing the configuration of an exposure system according to the preferred embodiment of the present invention.
Figure 3A:
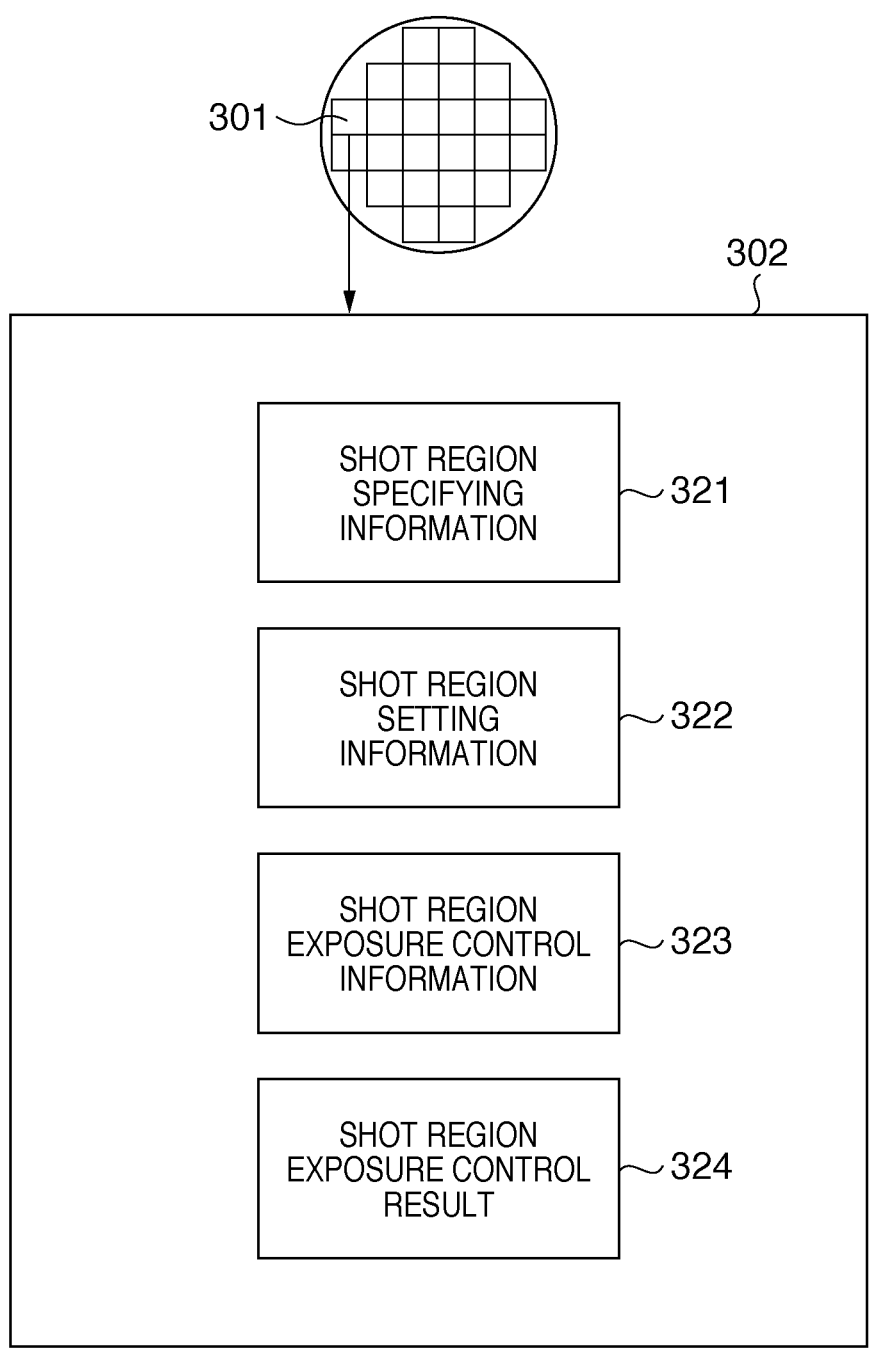
Figure 3B:
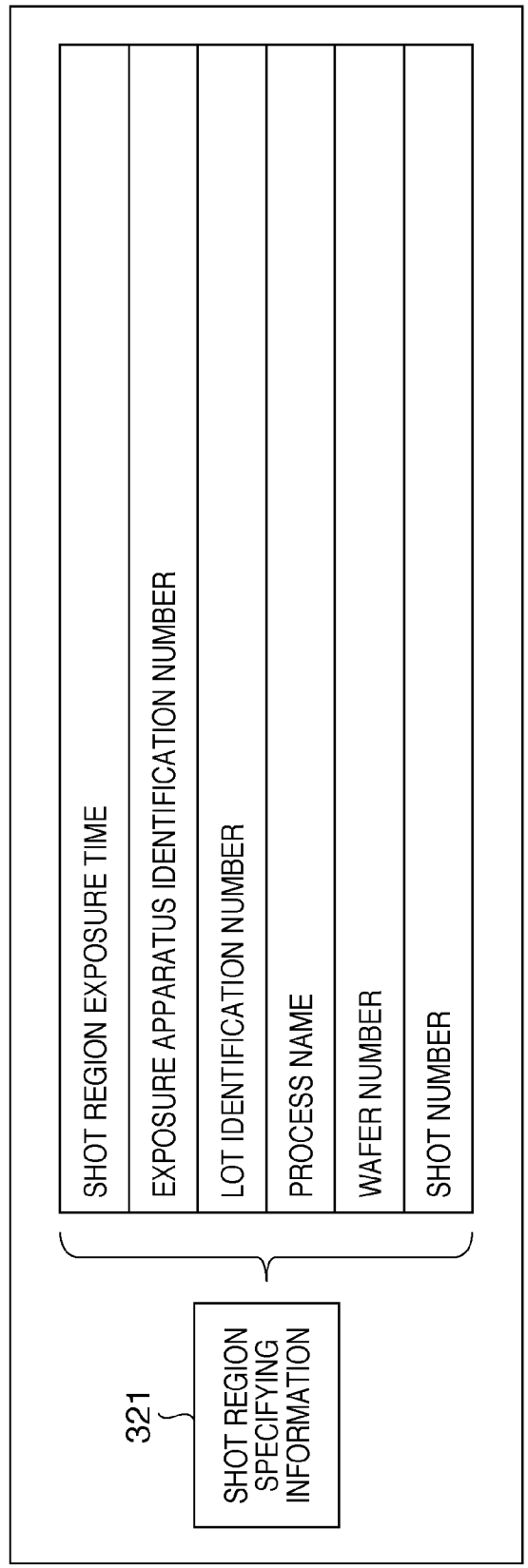
Figure 3C:
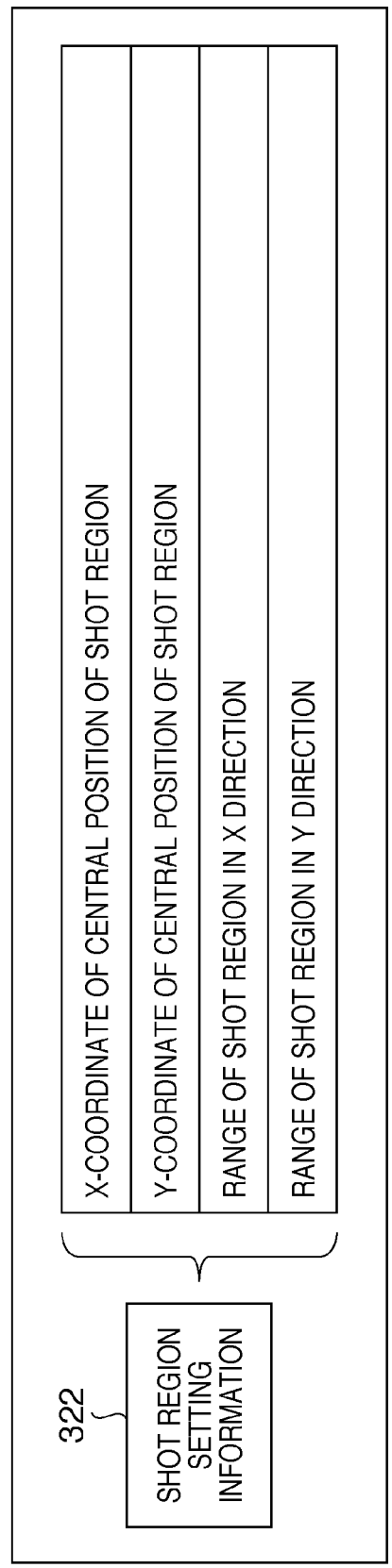
Figure 3D:
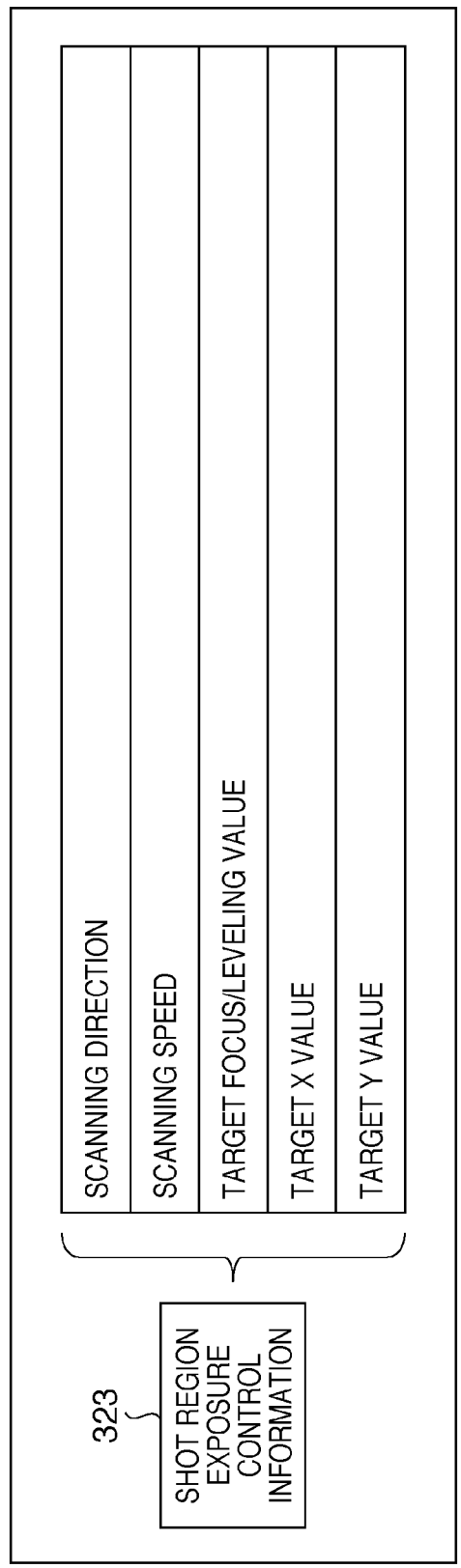

FIG. 2 is a block diagram schematically showing the configuration of an exposure system according to the preferred embodiment of the present invention. The exposure system can comprise the exposure apparatus 100, and the information processing apparatus 202 connected to the exposure apparatus 100 via a communication interface 201. The information processing apparatus 202 can also serve as a managing apparatus or managing system which manages the exposure apparatus 100.

The information processing apparatus 202 is configured to process the design-dependent apparatus information (first apparatus information) provided from the exposure apparatus 100. When the information processing apparatus 202 has a specific function to be described hereinafter, it can be configured by, for example, installing a program in a general-purpose computer. By installing the program in the information processing apparatus 202, it operates as, for example, an apparatus which comprises a database 231, information collecting unit 221, filtering unit 222, converting unit 223, statistical processing unit 224, input unit 232, output unit 233, and managing unit 230. An information processing method executed by such an information processing apparatus can include an information collection step, filtering step, conversion step, statistical processing step, input step, output step, and management step.

The information collecting unit 221 collects the design-dependent apparatus information (first apparatus information) associated with the control of the exposure apparatus 100 via the communication interface 201, and stores it in the database (DB) 231.

The filtering unit 222 extracts information which meets a filtering condition 225 provided from the input unit 232 from the design-dependent apparatus information stored in the database 231, and provides the extracted information to the converting unit 223. The converting unit 223 converts the design-dependent apparatus information stored in the database 231 or the information extracted from the design-dependent apparatus information by the filtering unit 222 into standardized apparatus information (second apparatus information) in accordance with a conversion condition 226. That is, the converting unit 223 converts at least a part of the first apparatus information collected by the information collecting unit 221 into standardized apparatus information (second apparatus information). The standardized apparatus information contains a plurality of pieces of standard region information (second region information) for a plurality of standard regions (second regions) which form a standard region array (second array). The conversion condition 226 can be provided from the input unit 232 to the converting unit 223. The conversion condition 226 includes, for example, the definition of the above-described second array.

Consider a case in which an exposure operation according to a first shot region array and that according to a second shot region array are executed. The converting unit 223 converts first design-dependent apparatus information obtained by the exposure operation according to the first shot region array into first standardized apparatus information according to a standard region array. The converting unit 223 also converts second design-dependent apparatus information obtained by the exposure operation according to the second shot region array into second standardized apparatus information according to the standard region array. The first standardized apparatus information contains a plurality of pieces of standard region information for a plurality of standard regions which form a second array. The second standardized apparatus information also contains a plurality of pieces of standard region information for the plurality of standard regions. Since both the pieces of standard region information of the first standardized apparatus information and those of the second standardized apparatus information are associated with common standard regions, they can be easily, statistically processed.

The statistical processing unit 224 statistically processes the plurality of pieces of standardized apparatus information converted by the converting unit 223. The output unit 233 includes, for example, a display device and/or storage device as an output device, and outputs the processing result obtained by the statistical processing unit 224 to the output device.

The managing unit 230 manages (controls) the constituent elements of the information processing apparatus 202, that is, the database 231, information collecting unit 221, filtering unit 222, converting unit 223, statistical processing unit 224, input unit 232, and output unit 233.

FIG. 3 is a view showing an example of one shot region information 302 collected by the information collecting unit 221. Since the design-dependent apparatus information contains pieces of shot region information 302 for the plurality of shot regions, it contains pieces of shot region information 302 the number of which is equal to that of the plurality of shot regions. Each piece of shot region information 302 can contain shot region specifying information 321, shot region setting information 322, shot region exposure control information 323, and a shot region exposure control result 324.

The shot region specifying information 321 contains, for example, the exposure apparatus identification number, lot identification number, process name, wafer number, and shot number.

The shot region setting information 322 contains, for example, the central position (X-coordinate) of a shot region, the central position (Y-coordinate) of the shot region, the range of the shot region in the X direction, and the range of the shot region in the Y direction.

The shot region exposure control information 323 contains, for example, the scanning direction, the scanning speed, the target focus/leveling value, the target X value (the target position in the X direction), and the target Y value (the target position in the Y direction).

The shot region exposure control result 324 can contain, for example, the maximum value, minimum value, average, and standard deviation of the focus/leveling measurement value in a shot region. The control result 324 can also contain, for example, the maximum values, minimum values, averages, and standard deviations of the X and Y measurement values in the shot region. The control result 324 can also contain, for example, the maximum value, minimum value, average, and standard deviation of the focus/leveling followability in the shot region. The control result 324 can also contain, for example, the maximum values, minimum values, averages, and standard deviations of the X and Y followabilities (the followability of position control in the X direction and that in the Y direction). The control result 324 can also contain, for example, the maximum values, minimum values, averages, and standard deviations of the moving averages MA in the X, Y, and θ directions and the moving standard deviations MSD in the X, Y, and θ directions in the shot region.

Figure 4:
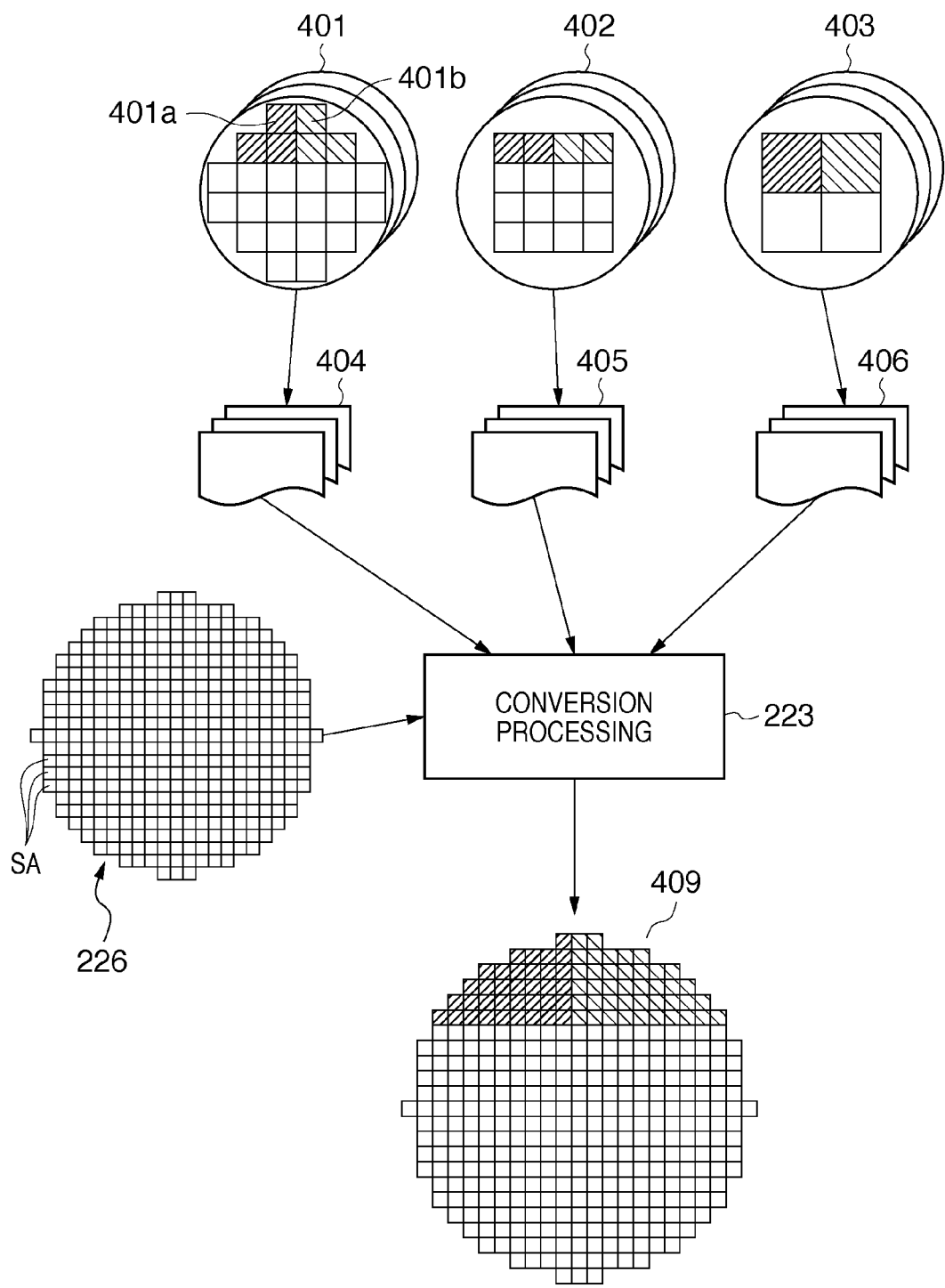
FIG. 4 is a view schematically showing an example of conversion processing by a converting unit.

FIG. 4 is a view schematically showing an example of conversion processing by the converting unit 223. Assume that exposure operations according to a plurality of design patterns 401, 402, and 403 having different shot region arrays are executed to obtain a plurality of pieces of exposure apparatus information 404, 405, and 406. The converting unit 223 receives a standard region array formed by a plurality of standard regions SA as the conversion condition 226.

The converting unit 223 converts pieces of information for a plurality of shot regions, which form exposure apparatus information, into pieces of standard region information for a plurality of standard regions which form a standard region array to generate standardized apparatus information 409.

Figure 5B:
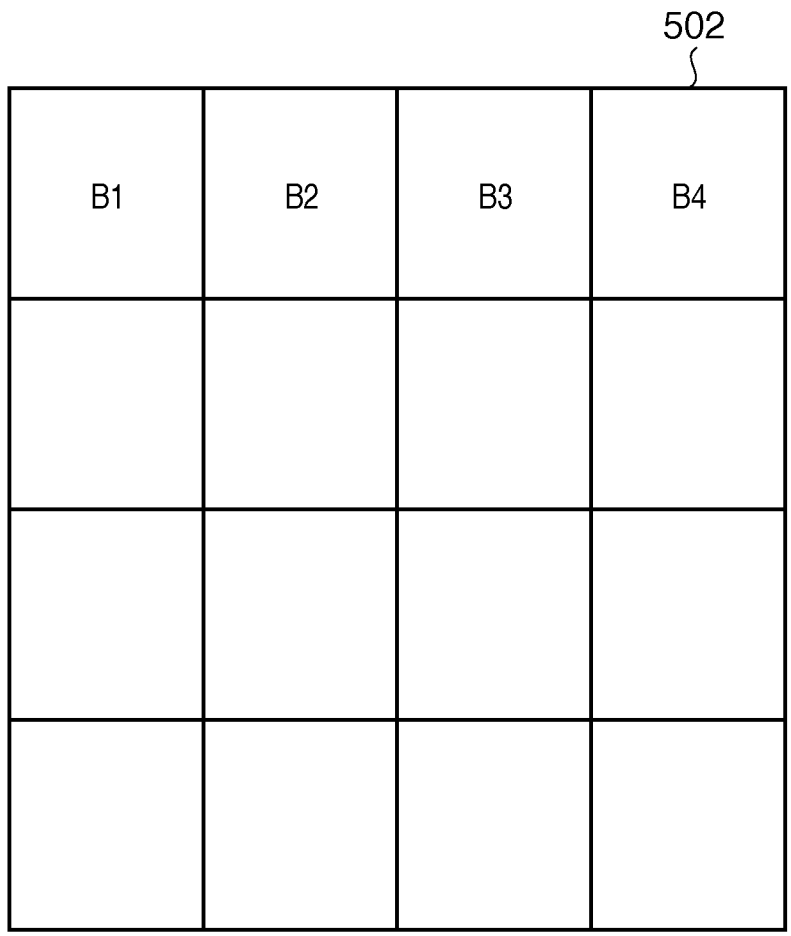
Figure 5C:
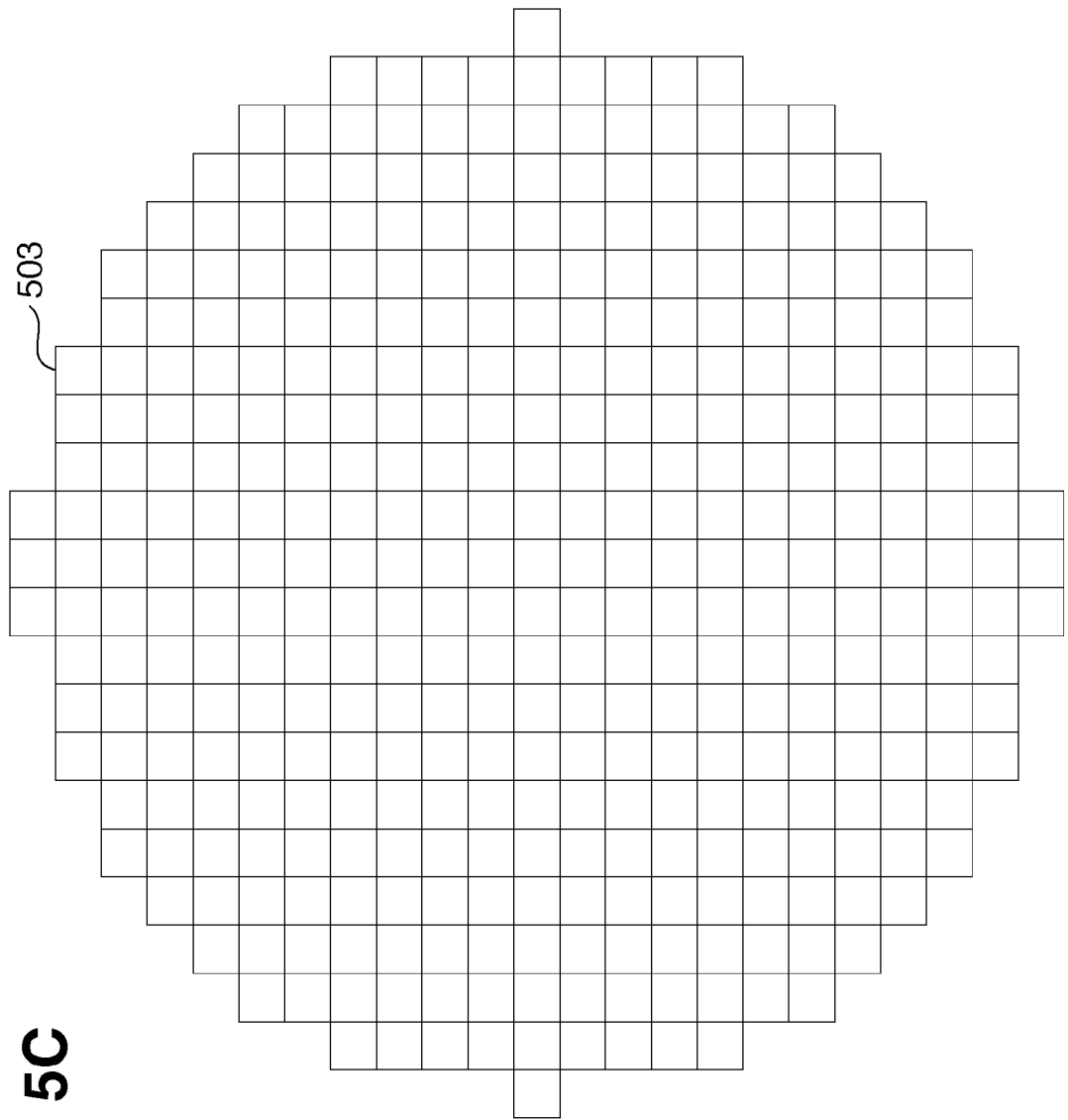
Figure 5E:
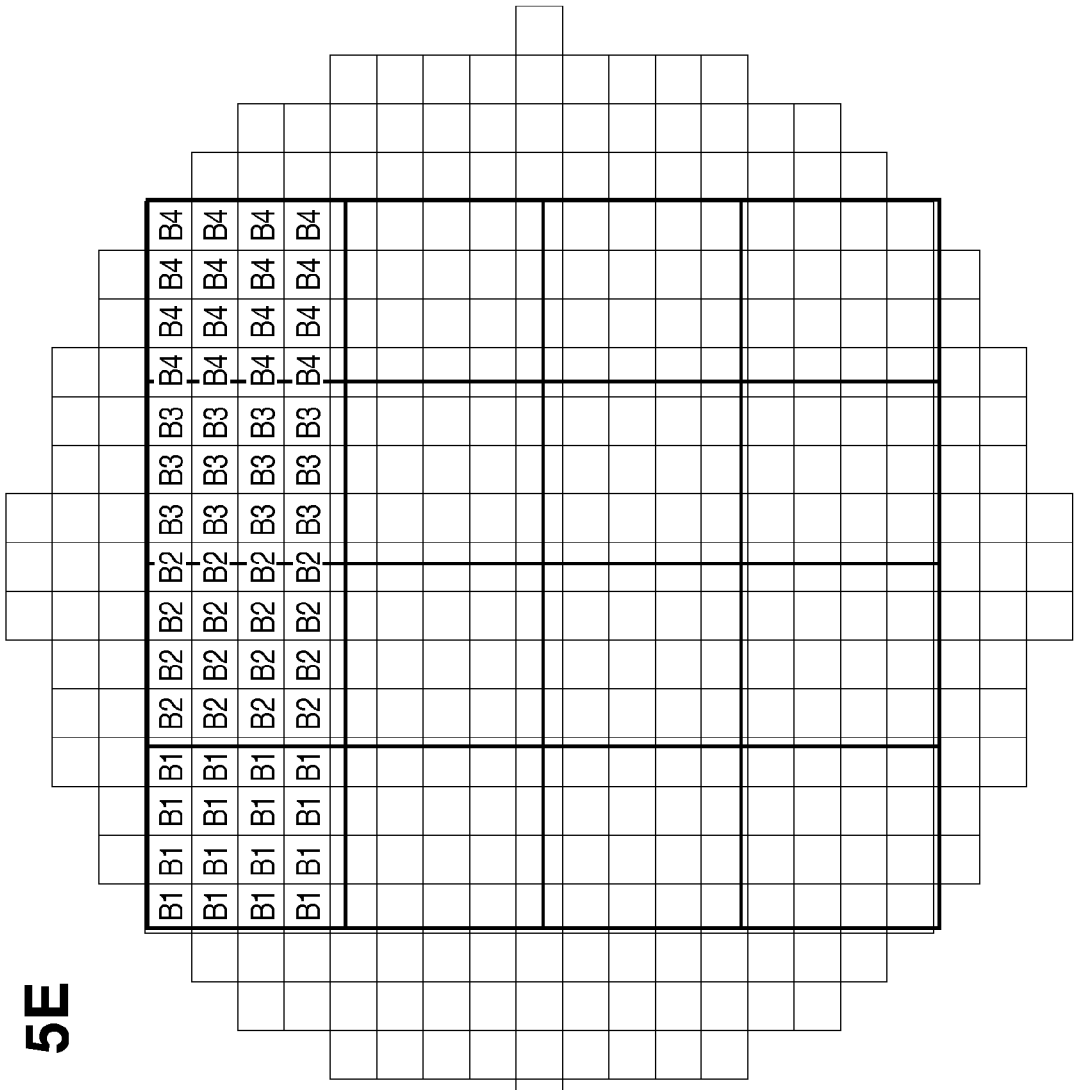

The converting unit 223 can execute conversion processing in accordance with various methods. FIGS. 5A to 5F are views schematically showing the first example of conversion processing by the converting unit 223. In the first example, information for a shot region including the central position of each standard region is used as information for each standard region which forms a standard region array. For example, pieces of shot region information A1 to A6, . . . for a plurality of shot regions arrayed as shown in FIG. 5A are converted as shown in FIG. 5D in accordance with a standard region array 503 as shown in FIG. 5C. For example, pieces of shot region information B1 to B4, . . . for a plurality of shot regions arrayed as shown in FIG. 5B are converted as shown in FIG. 5E in accordance with the standard region array 503 as shown in FIG. 5C.

Figure 5F:
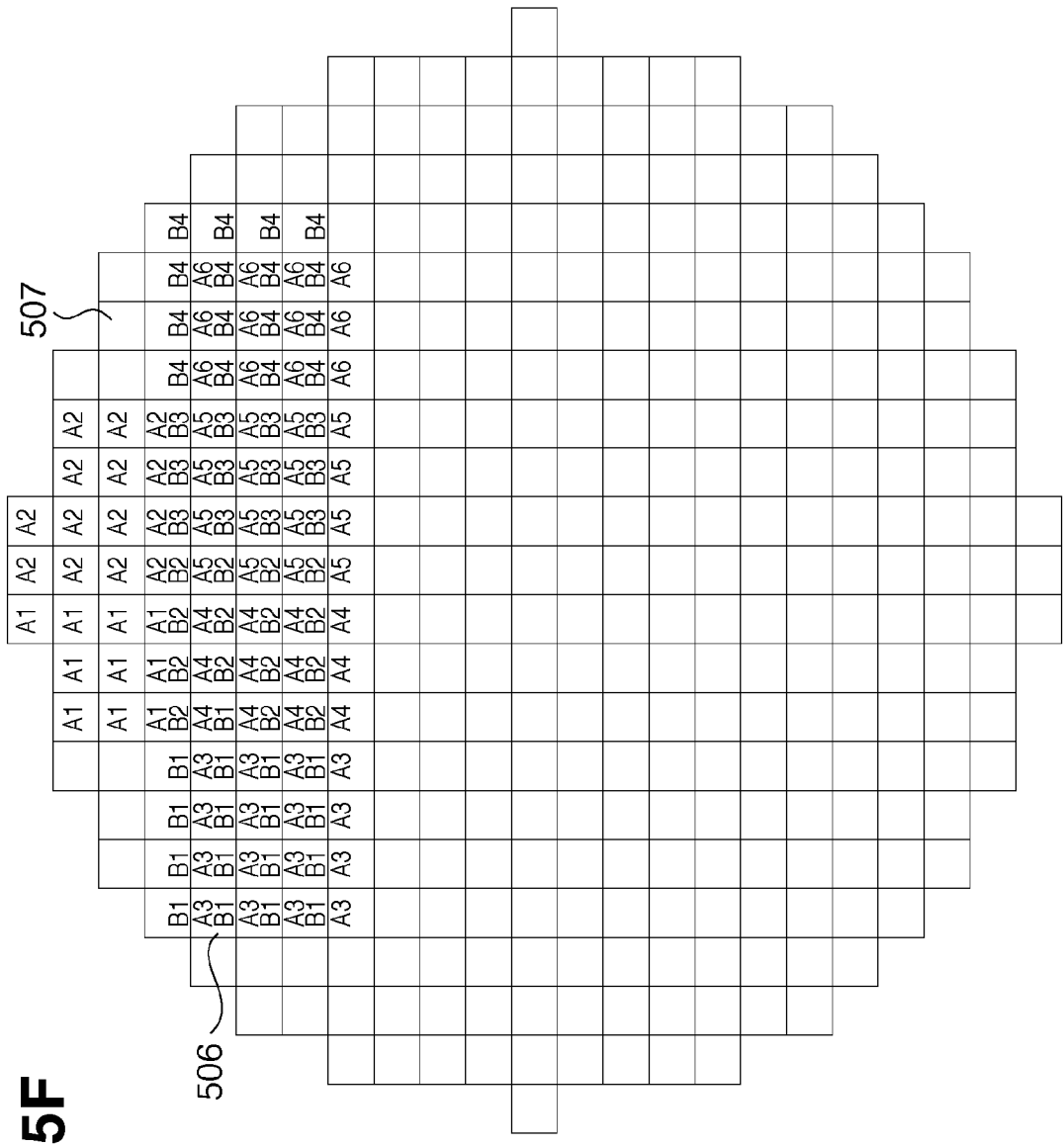

The converting unit 223 converts design-dependent apparatus information obtained by exposure according to the shot region array illustrated in FIG. 5A and that obtained by exposure according to the shot region array illustrated in FIG. 5B to obtain standardized apparatus information as shown in FIG. 5F. For a standard region 506, two pieces of standard region information A3 and B1 are obtained and can be statistically processed. For a standard region 507 for which no standard region information is obtained, it is possible to generate pieces of standard region information based on pieces of standard region information for other standard regions, for example, its peripheral standard regions.

FIGS. 6A to 6F are views schematically showing the second example of the conversion processing by the converting unit 223. In the second example, information for each shot region which forms a shot region array is used as information for a standard region including the central position of the shot region.

Figure 6A:
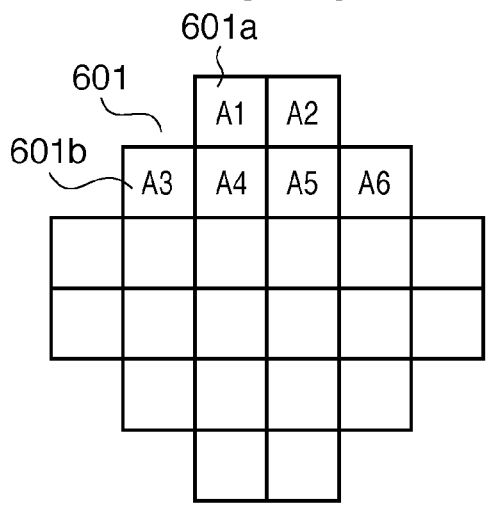
FIGS. 6A to 6F are views schematically showing the second example of the conversion processing by the converting unit.
Figure 6D:
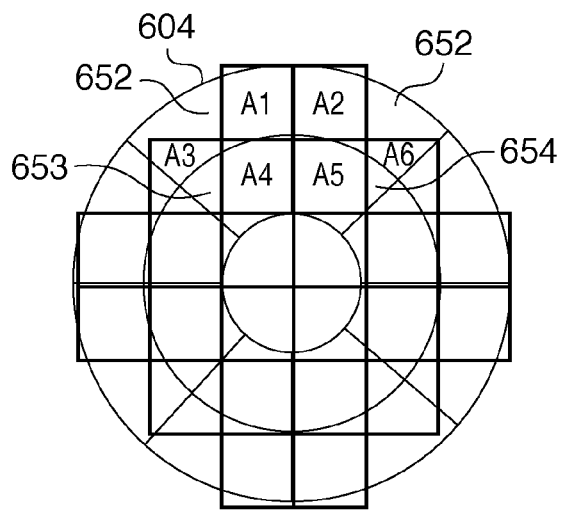
Figure 6B:
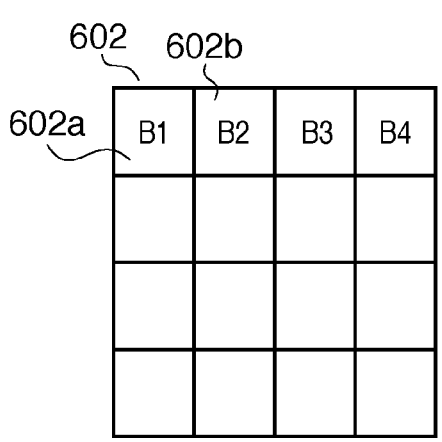
Figure 6E:
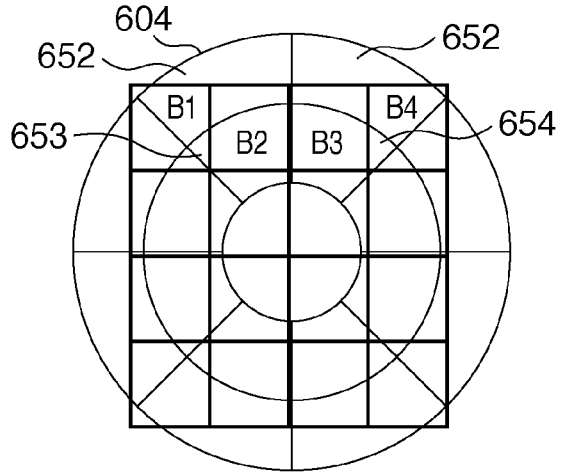
Figure 6C:
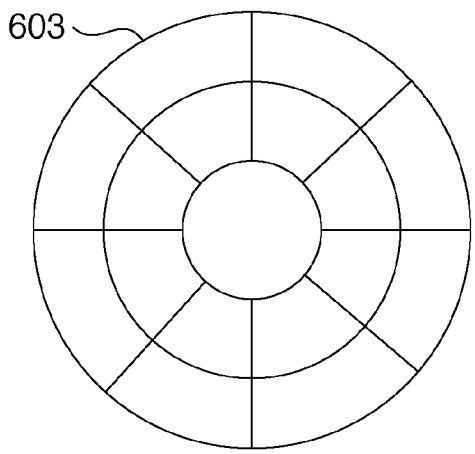

Assume, for example, a case in which exposure apparatus information is converted into pieces of standard region information using a standard region array 603 as shown in FIG. 6C. In this case, for example, pieces of information A1 and A3 for shot regions 601a and 601b of a shot region array as shown in FIG. 6A are used as information for a standard region 652 including the central positions of shot regions 602a and 602b, as shown in FIG. 6D. For example, pieces of information B1 and B2 for shot regions 602a and 602b of a shot region array as shown in FIG. 6B are used as pieces of information for the standard region 652 and a standard region 653 including the central positions of the shot regions 602a and 602b, respectively, as shown in FIG. 6E.

Figure 6F:
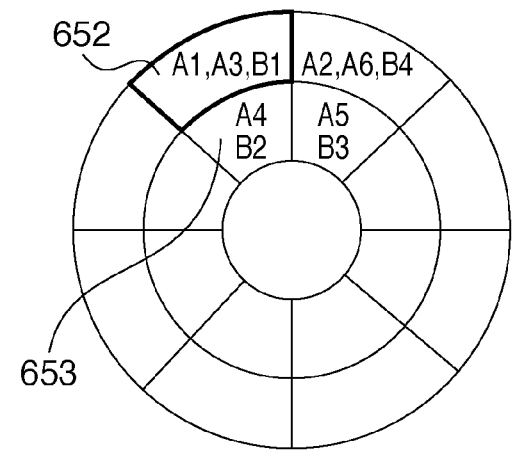

The converting unit 223 converts exposure apparatus information obtained by exposure according to the shot region array illustrated in FIG. 6A and that obtained by exposure according to the shot region array illustrated in FIG. 6B to obtain pieces of standard region information as shown in FIG. 6F. For the standard region 652, three pieces of information A1, A3, and B1 are obtained and can be statistically processed. For a standard region for which no information is obtained, it is possible to generate pieces of information based on pieces of standard region information for other standard regions, for example, its peripheral standard regions.

FIG. 7 is a flowchart illustrating the sequence of processing of analyzing design-dependent apparatus information (first apparatus information) by the information processing apparatus 202 shown in FIG. 2.

In step S701 (collection step), the information collecting unit 221 acquires design-dependent apparatus information from the exposure apparatus 100 via the communication interface 201 and the communication interface 17 of the exposure apparatus, and stores it in the database 231.

In step S702 (filtering step), the filtering unit 222 filters the design-dependent apparatus information stored in the database 231, in accordance with the filtering condition 225, thereby extracting necessary information. This is useful for analyzing the operation of the exposure apparatus under a designated condition. For example, extracting and statistically processing information for each scanning direction makes it possible to specify the operation of the exposure apparatus for each scanning direction and calculate a correction parameter for each scanning direction.

The filtering condition 225 can be set so as to extract at least one piece of information from pieces of information contained in exposure apparatus information. The filtering condition 225 can include a numerical value or numerical range if the information to be extracted contains a numerical value. The filtering condition 225 can include, for example, the scanning direction. The scanning direction can be defined as, for example, the up direction and down direction. The filtering condition 225 can be set via the input unit 232. An initial condition may be set to the filtering condition 225 in advance. The filtering condition 225 may be set even by selecting one of a plurality of conditions prepared in advance, as needed.

Figure 8:
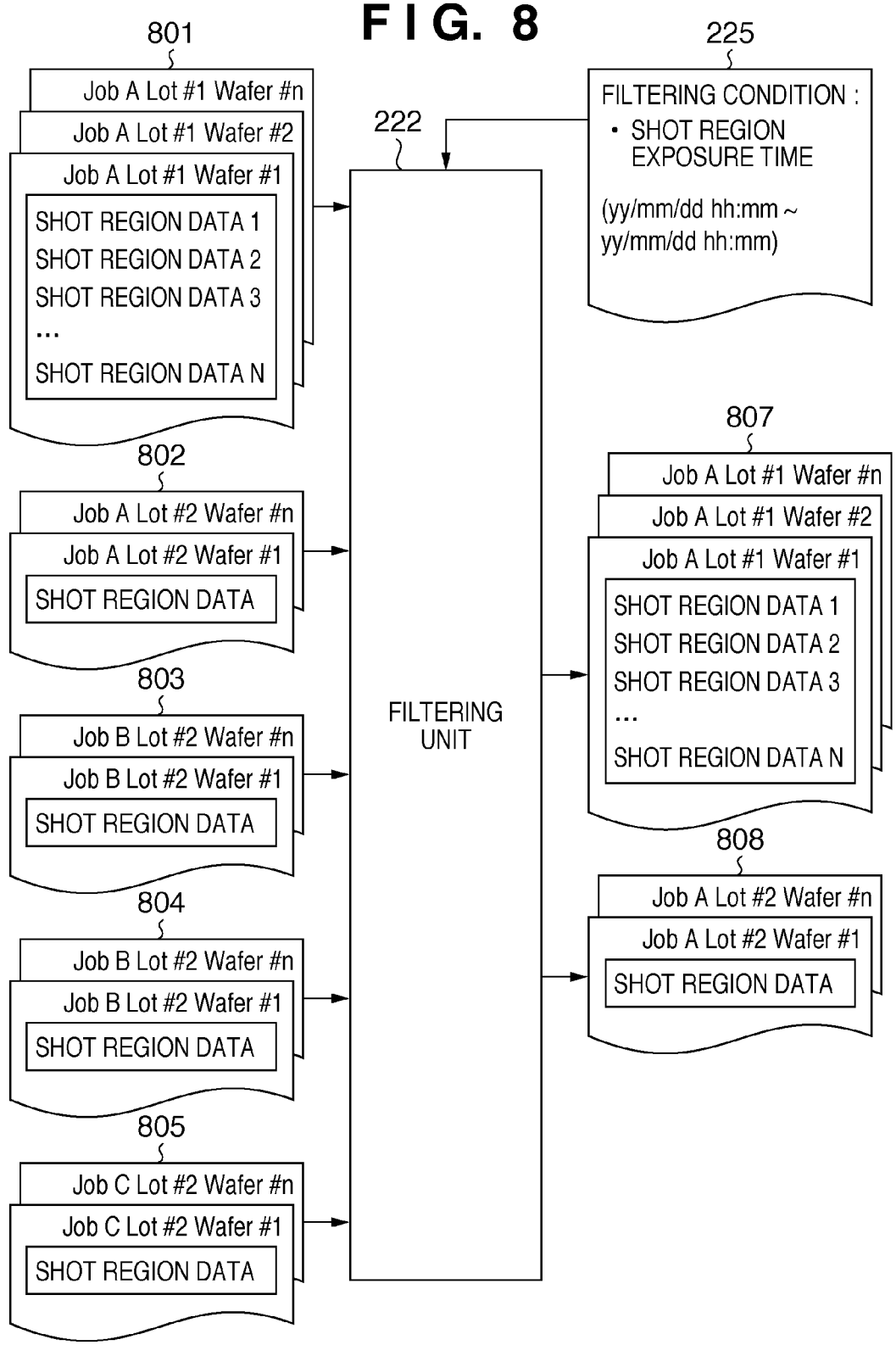
FIG. 8 is a view schematically showing an example of filtering processing by a filtering unit.

FIG. 8 is a view schematically showing an example of filtering processing by the filtering unit 222. Pieces of design-dependent apparatus information 801, 802, 803, 804, and 805 are obtained by exposing a plurality of lots. The information collecting unit 221 collects the pieces of design-dependent apparatus information 801, 802, 803, 804, and 805 in step S701.

The filtering unit 222 extracts information which meets a designated filtering condition 225 from each of the pieces of design-dependent apparatus information 801, 802, 803, 804, and 805. For example, if the shot region exposure time is set as the filtering condition, it is possible to designate the range of time to be extracted as the filtering condition. In this case, it is determined whether the exposure time of each shot region on each wafer falls within the time range designated as the filtering condition. Pieces of information 807 and 808 are extracted for a shot region exposed within the designated time range. If the filtering is not executed, all the design-dependent apparatus information stored in the database 231 is converted by the converting unit 223 and statistically processed by the statistical processing unit 224.

In step S703 (conversion step), the converting unit 223 converts the design-dependent apparatus information (first apparatus information) into standardized apparatus information (second apparatus information) in accordance with the designated conversion condition 226. The conversion condition 226 can be set via the input unit 232. An initial condition may be set to the conversion condition 226 in advance. The conversion condition 226 may be set even by selecting one of a plurality of conditions prepared in advance, as needed.

In step S704 (statistical processing step), the statistical processing unit 224 statistically processes pieces of standard region information contained in the standardized apparatus information obtained by the conversion processing in step S703 in accordance with the designated statistical processing condition 227, and outputs statistical result information 708. This statistical processing is typically done for each standard region. The statistical processing condition 227 can be set via the input unit 232. An initial condition may be set to the statistical processing condition 227 in advance. The statistical processing condition 227 may be set even by selecting one of a plurality of conditions prepared in advance, as needed.

The statistical processing unit 224 calculates, for example, the maximum value, minimum value, average, and standard deviation as the statistical processing result.

The statistical processing unit 224 can execute the statistical processing for each item of, for example, the shot region exposure control information 323.

The statistical result information 708 can be output to various devices or apparatuses by various methods. The statistical result information 708 can be displayed by, for example, combining pieces of standard region array information. This makes it possible to assign different colors (e.g., tone levels) for the respective ranges of numerical values as the statistical result.

As described above, according to a preferred embodiment of the present invention, it is possible to know the state of the exposure apparatus based on design-dependent apparatus information obtained by various exposure jobs for manufacturing devices of various design patterns or exposure operations according to various shot region arrays.

An application example of the above-described embodiment will be explained below.

(Apparatus Threshold Value)

An optimal abnormality detection threshold value can be calculated for each standard region in accordance with a statistical processing result for each standard region. Assume, for example, that the synchronization accuracy or focus accuracy degrades at a specific position depending on the parameter setting or the characteristic of an exposure apparatus. Even in this case, according to a preferred embodiment of the present invention, it is possible to predict the specific position and the synchronization accuracy or focus accuracy at this position in accordance with a statistical processing result for each standard region and change the abnormality detection threshold value at this position.

(Process Threshold Value)

The synchronization accuracy or focus accuracy often degrades at a specific position depending on the process involved. This is presumably because the wafer surface state, a shot region located in the periphery of the wafer, a portion of a wafer, on which a foreign substance readily adheres upon a process of some kind, or the like change in each process. It is possible to predict the specific position and the synchronization accuracy or focus accuracy at this position in accordance with a statistical processing result for each standard region and change the abnormality detection threshold value at this position for each process.

(Threshold Value Transfer)

Figure 9:
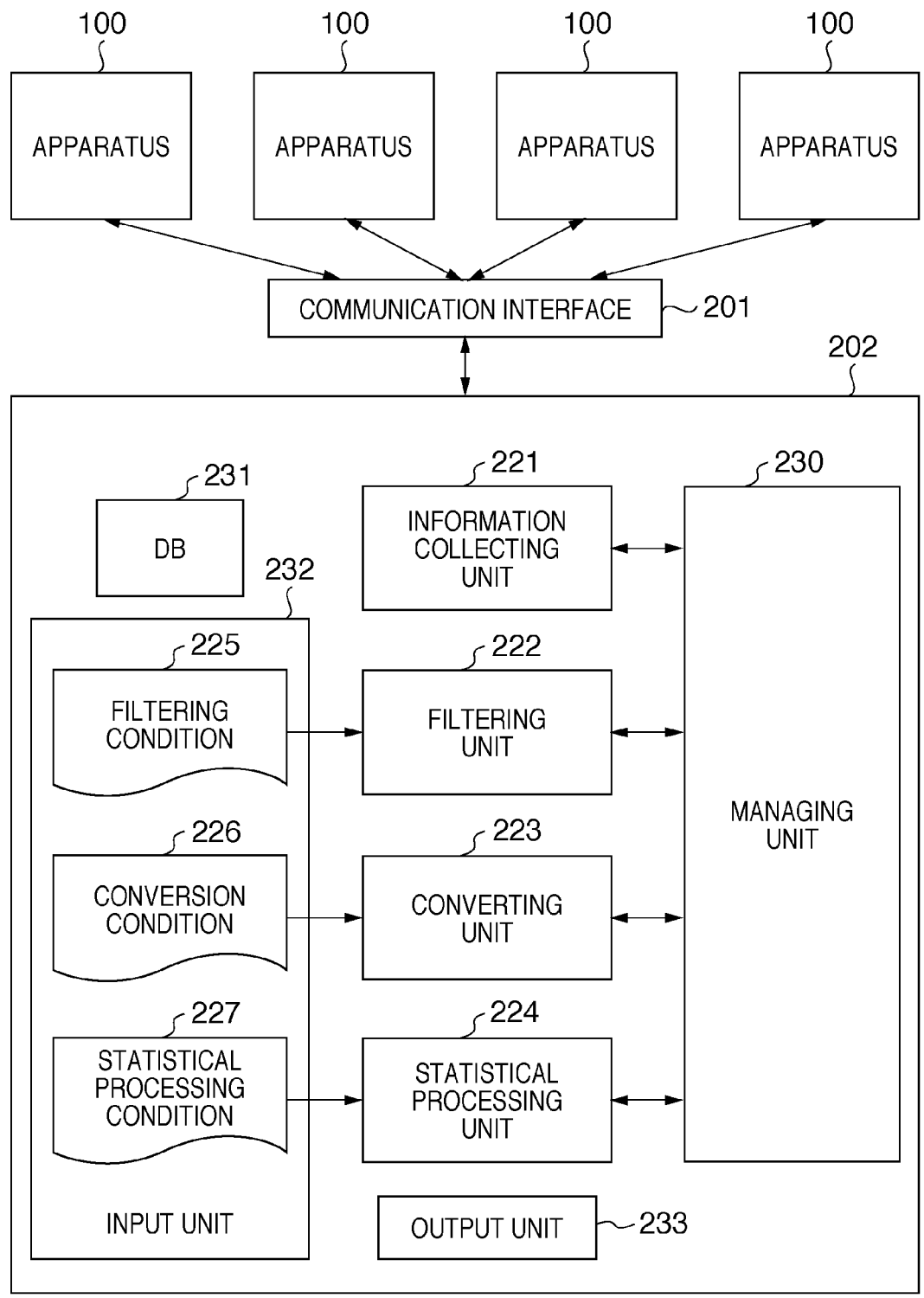
FIG. 9 is a block diagram showing an application example in which a managing system manages a plurality of exposure apparatuses.

FIG. 9 is a block diagram showing an application example in which a managing system manages a plurality of exposure apparatuses 100. An information processing apparatus (managing system) 202 manages the plurality of exposure apparatuses 100 based on design-dependent apparatus information provided from them. The managing system can inspect the variation between the plurality of exposure apparatuses 100 for each standard region. For example, the abnormality detection threshold value of a process for each standard region used in a certain exposure apparatus can be transferred to other exposure apparatuses by adding the apparatus variation for each standard region to the abnormality detection threshold value of the process for each standard region.

(Abnormality Feedback)

Figure 10:
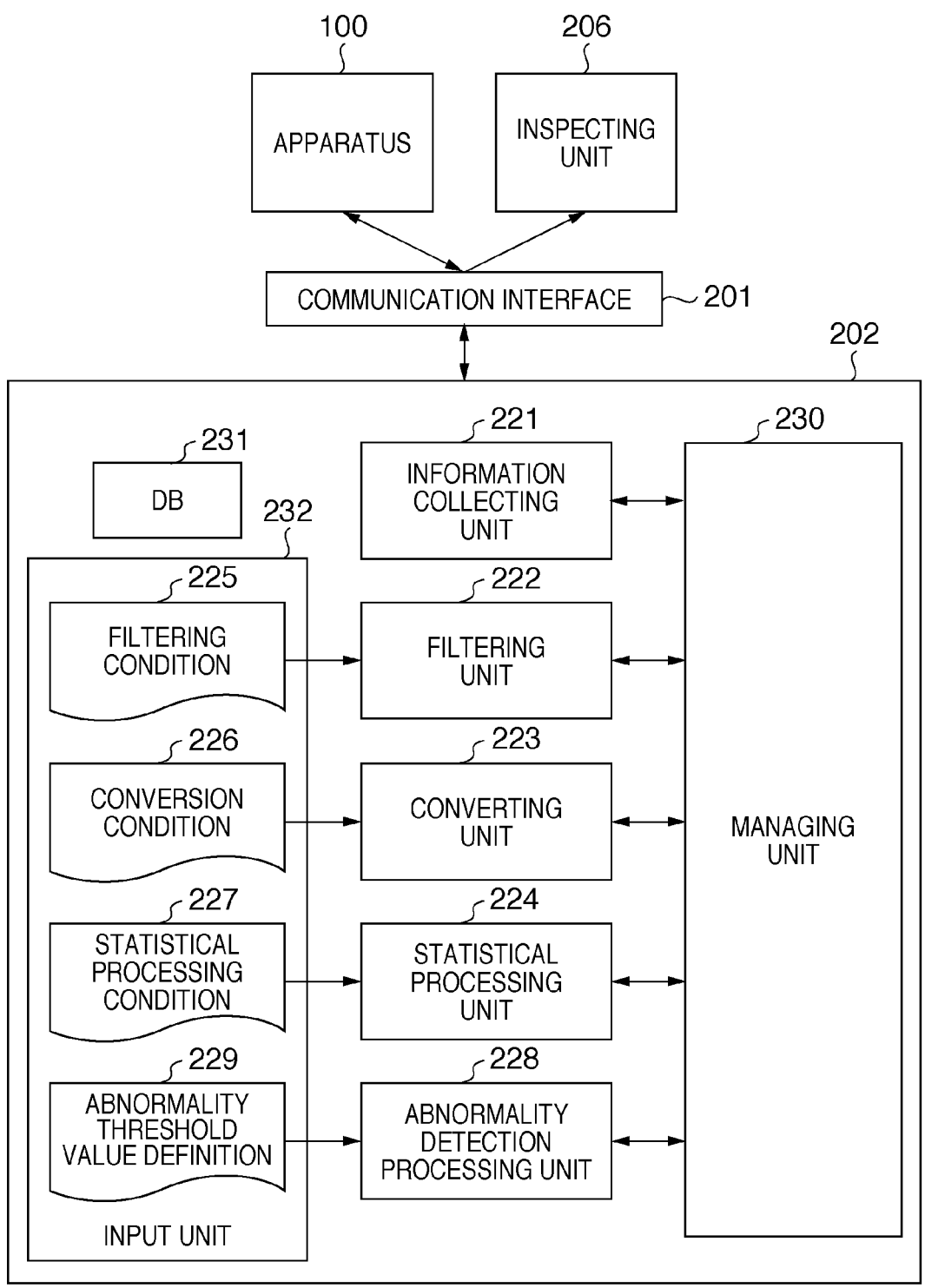
FIG. 10 is a block diagram showing an application example in which a managing system manages one or a plurality of exposure apparatuses and other apparatuses.

FIG. 10 is a block diagram showing an application example in which a managing system manages one or a plurality of exposure apparatuses 100 and other apparatuses. An information processing apparatus (managing system) 202 detects any abnormality for each standard region by an abnormality detection unit 228 in accordance with an abnormality inspection threshold value 229 determined for each standard region based on a statistical processing result for each standard region. The information processing apparatus 202 feeds back the abnormality detection result to an inspecting unit 206 via a communication interface 201. For example, the inspecting unit 206 selectively inspects a portion detected to suffer an abnormality, while it reduces the inspection measurement sampling number at a portion detected not to suffer any abnormality. This allows an efficient inspection process.

(Abnormality Cause Analysis)

An exposure apparatus often has a region in which the synchronization accuracy or focus accuracy degrades depending on the abnormality cause. It is possible to store, as a pattern, a statistical processing result for each standard region upon the occurrence of an abnormality in the past and compare the patterns by abnormality cause analysis, thereby specifying the abnormality cause.

(Feedback to Apparatus Setting)

If a certain region requires modification because it suffers a bad synchronization accuracy or focus accuracy, it is possible to feed back an abnormality detection result in this region to the apparatus setting so as to change an apparatus control parameter associated with the apparatus operation for this region. In this case, an optimal parameter may be calculated by comparing the apparatus control parameter with the states of identical regions in other apparatuses.

For example, statistical processing may be performed for each region by setting the scanning direction and scanning speed as the filtering condition so that the scanning direction offset or scanning speed is set based on a comparison between the regions or between identical regions in a plurality of apparatuses.

(Feedback to Process Setting)

If a certain region requires modification in a specific process because it suffers a bad synchronization accuracy or focus accuracy, it is possible to feed back an abnormality detection result in this region to the process setting so as to change a process parameter associated with the apparatus operation for this region. In this case, an optimal parameter may be calculated by comparing the process parameter with the states of identical regions in other apparatuses.

It is also possible to feed back an abnormality detection result in a certain region to the process setting so as to change the processing operation for this region in processes other than those which use an exposure apparatus.

(Long-term Monitoring)

Figure 11:
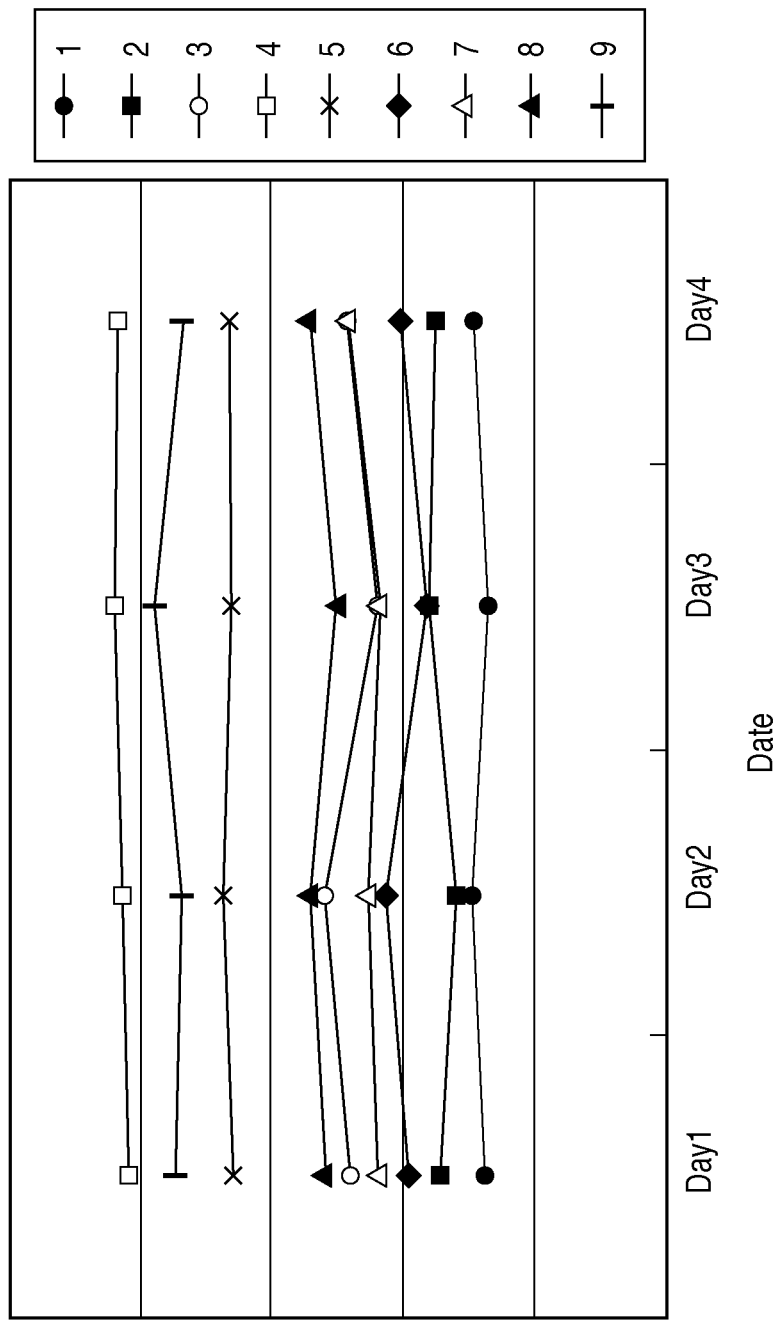
FIG. 11 is a graph showing long-term monitoring of a statistical processing result for each region.

As illustrated in FIG. 11, the statistical processing result of the synchronization accuracy or focus accuracy for each region is periodically recorded in a graph form and monitored. This makes it possible to detect an abnormality or predict an abnormality early based on the trend of a change in apparatus state.

(Re-conversion)

Figure 12:
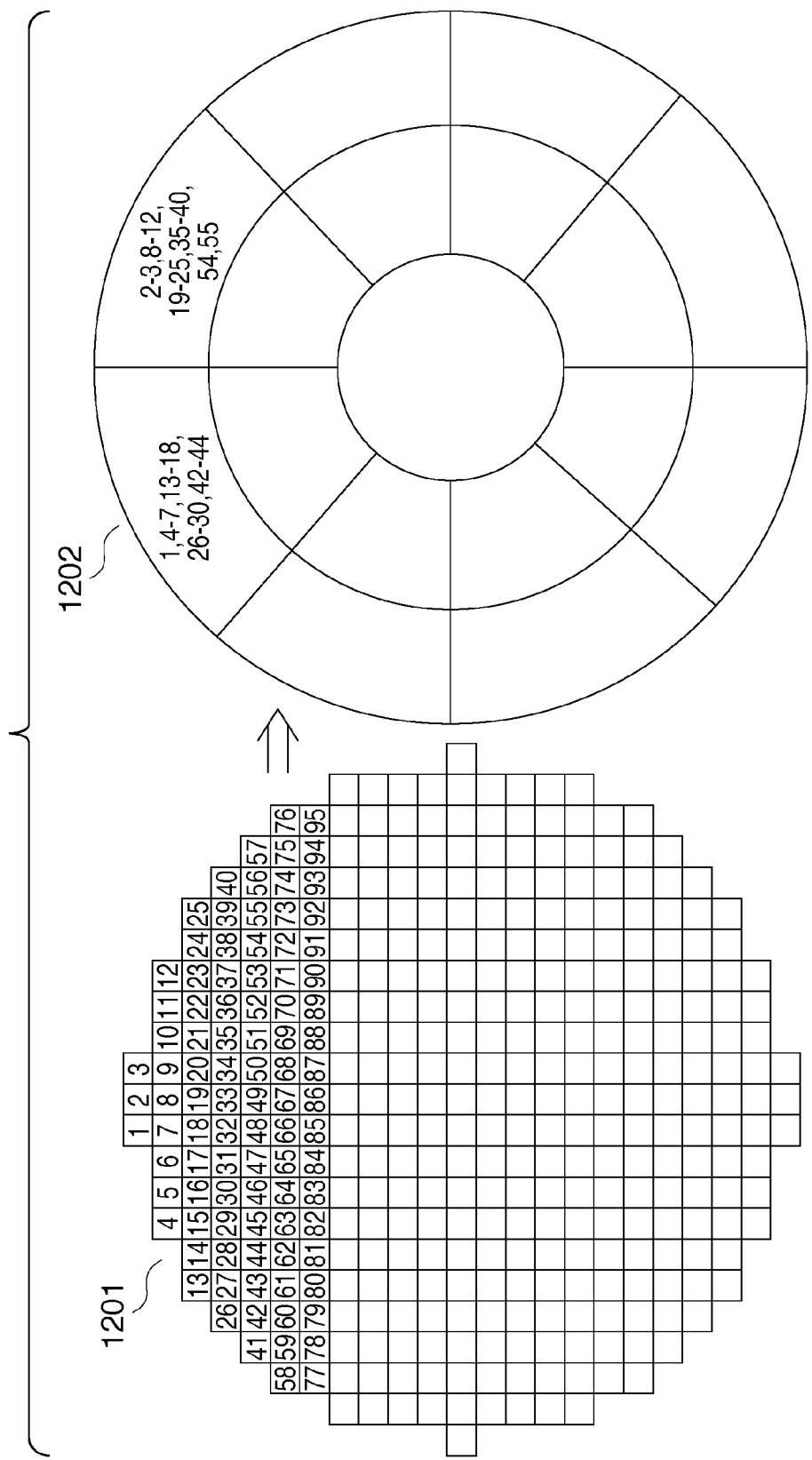
FIG. 12 is a view for explaining the re-conversion of apparatus information.

It is also possible to further convert standardized apparatus information 1201, which is converted in accordance with a standard region array as illustrated in FIG. 12, into standardized apparatus information 1202 according to another standard region array. The conversion method can be, for example, the above-described first or second example.

(Definition of Region Smaller Than Shot Region)

A region smaller than a shot region may be defined instead of generating information for each shot region in an exposure apparatus so that information is generated for each defined region.

(Re-conversion to Process Shot Region Array)

Figure 13:
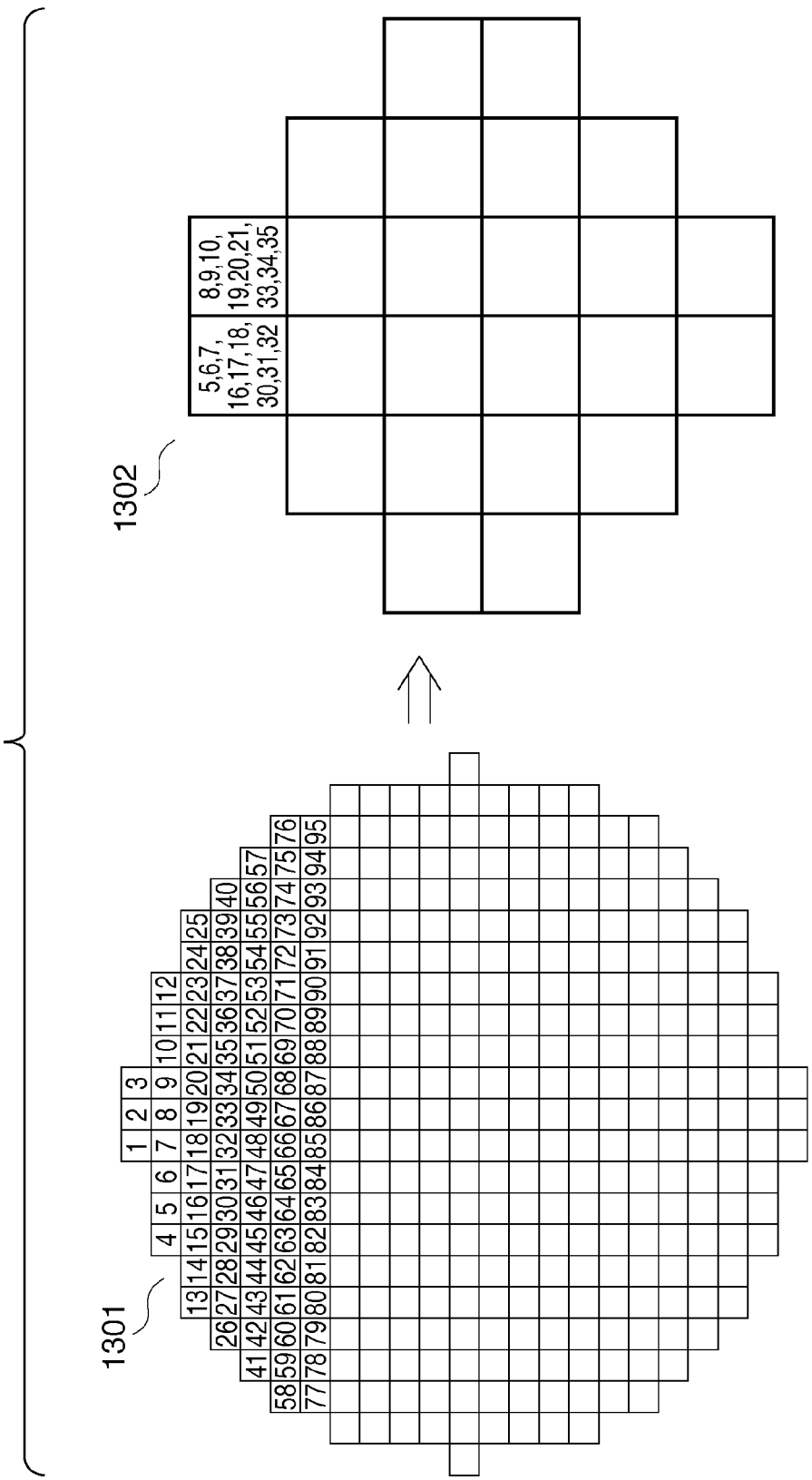
FIG. 13 is a view for explaining the re-conversion of apparatus information into a shot region array.

It is also possible to convert standardized apparatus information 1301 into apparatus information 1302 according to an arbitrary shot region array, as illustrated in FIG. 13. The conversion method can be, for example, the above-described first or second example.

Standardized apparatus information may be changed in accordance with the same array as a shot region array so that the focus accuracy or synchronization accuracy in a certain shot region is calculated based on the conversion result. An optimal parameter in this shot region may be calculated so that an abnormality detection result is fed back to the setting so as to change the control of an exposure apparatus based on this parameter. An abnormality detection result may be fed back to the setting so as to change the processing operation for this shot region in processes other than those which use an exposure apparatus.

(Detection of Abnormality Such as Adhesion of Foreign Substance)

Figure 16:
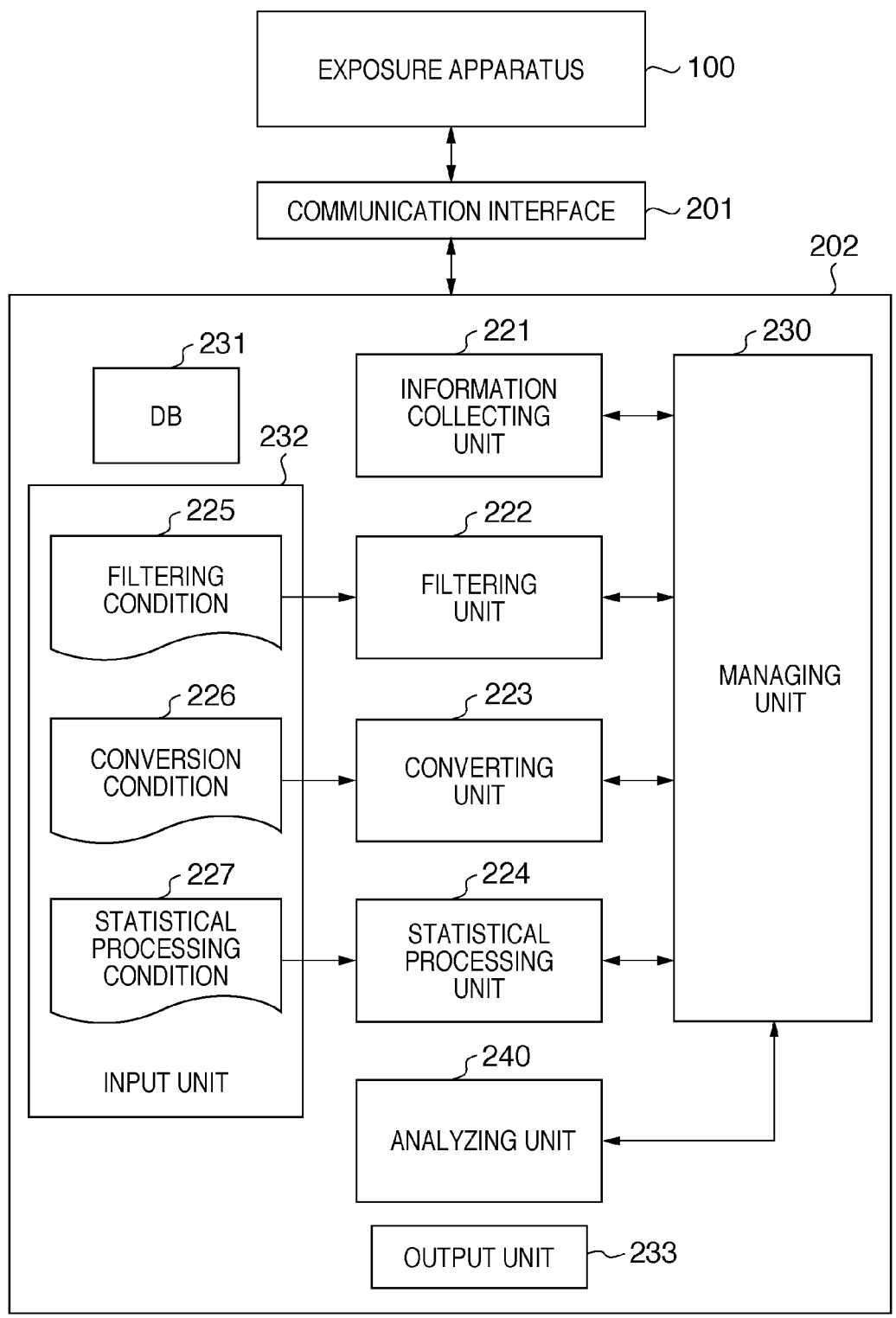
FIG. 16 is a block diagram showing an application example of the exposure system according to the preferred embodiment of the present invention.

FIG. 16 is a block diagram showing an application example of the exposure system according to the preferred embodiment of the present invention. An exposure system shown in FIG. 16 is configured by adding an analyzing unit 240 to the exposure system shown in FIG. 2.

Adhesion of a foreign substance onto, for example, a wafer chuck can be detected based on information obtained by conversion processing by a converting unit 223 and statistical processing by a statistical processing unit 224. For example, the user is allowed to determine adhesion of a foreign substance by visualizing a change with respect to a steady state and providing the visualized information, or the analyzing unit 240 can detect adhesion of a foreign substance upon being notified that the change has exceeded a threshold value.

Pieces of design-dependent apparatus information on various designs (processes) acquired from one exposure apparatus 100 by an information collecting unit 221 are filtered by a filtering unit 222, as needed, and are converted into standardized apparatus information by the converting unit 223. The statistical processing unit 224 statistically processes the standardized apparatus information to calculate the average in each standard region, which exhibits a phenomenon common to various designs (processes) (that is, a phenomenon unique to one exposure apparatus 100). In other words, the average exhibits the characteristic of one exposure apparatus 100.

Figure 14:
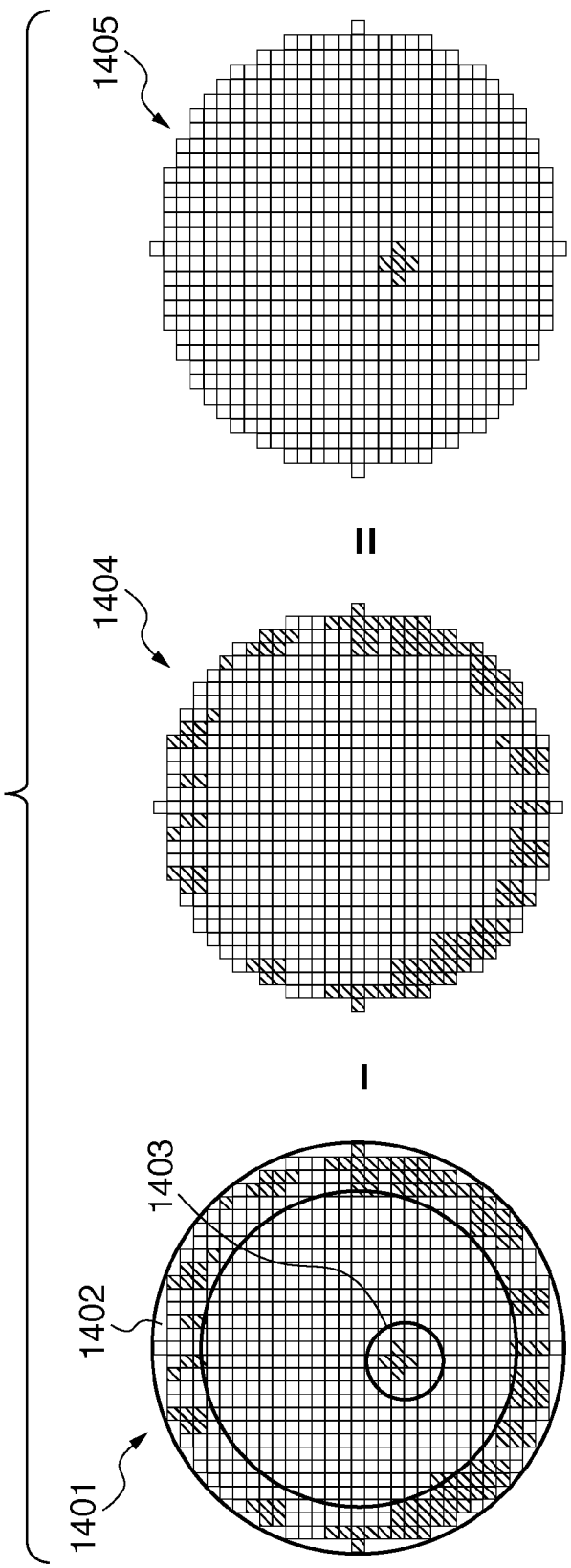
FIG. 14 is a view for explaining the principle of detecting an abnormality.

Referring to FIG. 14, reference numeral 1401 represents a display example of the result of collecting focus/leveling control information in one exposure apparatus, converting it into standard region information by the converting unit 223, and calculating the average in each standard region by the statistical processing unit 224. In this example, an output unit 233 visualizes the statistical processing result such that a point having a larger value is represented by a higher color density. In a wafer edge portion 1402, an area sufficient to measure the wafer surface cannot be ensured, so the control result in this portion is poorer than that in the central portion. The value is similarly large in a portion 1403 in which a foreign substance has adhered on a wafer chuck, and this portion is therefore represented by a high color density. However, this portion is hardly identified even by the visualization because it often mixes with a portion, which always has large values, such as the wafer edge portion.

Referring to FIG. 14, reference numeral 1405 represents the analysis result obtained by the analyzing unit 240. More specifically, reference numeral 1405 represents the result of calculating the difference between a result 1404 and the result 1401 obtained by converting pieces of focus/leveling control information in different exposure periods into pieces of standard region information (second apparatus information), and calculating the average in each standard region. Because the control result may be always poor in the wafer edge portion, the difference between these results is small in this portion. In contrast, a foreign substance is less likely to adhere onto a wafer chuck, so the difference between these results is large in the adhesion portion. The analyzing unit 240 sets, as a steady state, a value obtained by converting first apparatus information obtained from an exposure apparatus in a certain period into second apparatus information and statistically processing it. Also, the analyzing unit 240 calculates the difference between the value indicating a steady state and the value obtained by converting first apparatus information obtained from the exposure apparatus in another period into second apparatus information and statistically processing it. The analyzing unit 240 provides data for each standard region, which is obtained by converting the difference value calculation result into color information, to the output unit 233 as the analysis result. The output unit 233 outputs the analysis result to at least one of a display and a printer. This allows the user to find adhesion of a foreign substance (an example of abnormalities) based on the display. As a matter of course, it is also possible to detect adhesion of a foreign substance (an example of abnormalities) by detecting, by the analyzing unit 240 of an information processing apparatus 202, that the difference value has exceeded a threshold value.

The analyzing unit 240 may output, by the output unit 233 in comparable forms, pieces of second apparatus information obtained by converting pieces of first apparatus information in different periods by the converting unit 223.

This method is also applicable to detection of faults that have an adverse influence on the stage control accuracy of an exposure apparatus. The faults include, for example, the deformation of a mirror of a stage position measuring system, and physical problems that inhibit driving of a stage (for example, drag of a cable connected to the stage, and galling upon driving).

An example in which a change due to an abnormality such as adhesion of a foreign substance is monitored will be given. A day-to-day change can be monitored by, for example, setting the average in each standard region for a previous month as an index representing the steady state of the exposure apparatus, and calculating the difference between the index and the average in each standard region for a day. In other words, information representing the steady state of the exposure apparatus can be obtained by converting first apparatus information in a period (first period) longer than a period for which abnormality determination is performed (second period) into second apparatus information, and statistically processing it. Such reference information can be determined by calculation by the analyzing unit 240. Note that information representing the steady state of the exposure apparatus will be referred to as reference apparatus information, and information representing the state of the exposure apparatus in a period for which abnormality determination is performed will be referred to as determination target apparatus information hereinafter. The analyzing unit 240 may obtain a time-series change in the reference apparatus information and output it by the output unit 233.

Figure 15:
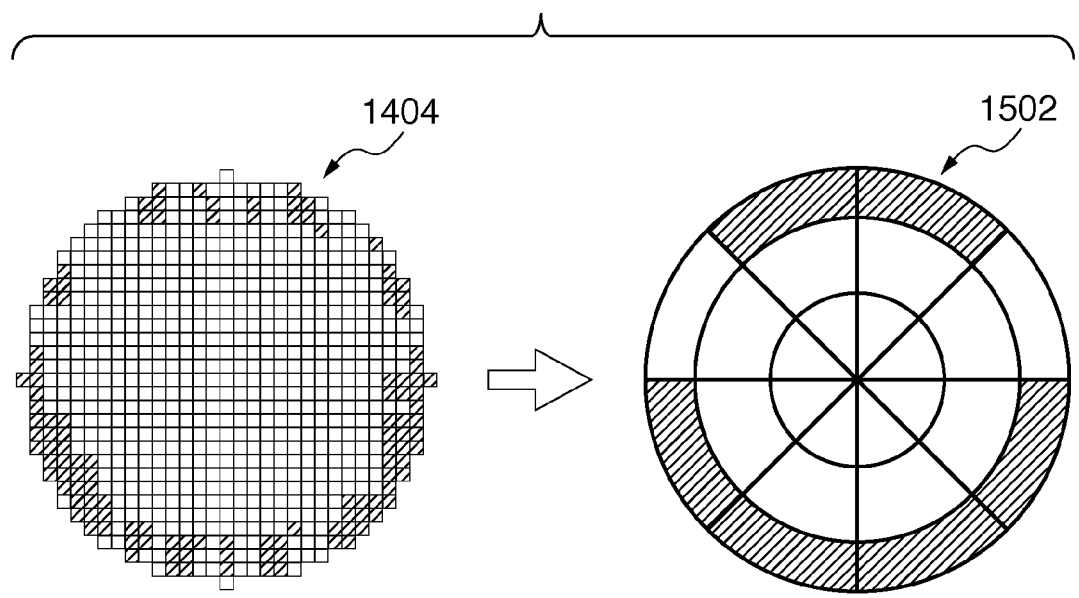
FIG. 15 is a view for explaining a method of determining the areas of standard regions.

As exemplified by reference numeral 1502 in FIG. 15, the area of a standard region to show the steady state of the exposure apparatus may be larger than that of a standard region to show the state of the exposure apparatus in a period for which abnormality determination is performed. If a standard region is relatively small, the control result in this region may appear in its adjacent standard region even when a factor involved in the generation of this result is the same. This problem can be solved by setting the area of a standard region to show the steady state of the exposure apparatus to be larger than that of a standard region to show the state of the exposure apparatus in a period for which abnormality determination is performed.

An extraction period to obtain reference apparatus information representing the steady state of the exposure apparatus may be determined based on the result of periodically generating a graph of the statistical processing result for each standard region, and monitoring it over a long period of time. For example, a period in which a result determined to have a temporal deviation by long-term monitoring is obtained is eliminated from a period to calculate a normal state.

(Feedback of Information to Exposure Apparatus)

In this application example, the statistical processing result for each standard region is fed back to a wafer stage control system 13 of an exposure apparatus 100. The value of each shot region information (shot region information will also be referred to as first region information and can include, for example, the synchronization accuracy, focus/leveling measurement value, and focus/leveling followability) includes the control characteristic of a wafer stage 7 and a characteristic for each process at the position of the corresponding shot region. It is possible to know the control characteristic of the wafer stage 7 corresponding to a position to drive the wafer stage 7 (to be often merely referred to as the position of the wafer stage 7) by converting shot region information (first region information) into standard region information (second region information) by a converting unit 223. Based on this control characteristic, an abnormality of the exposure apparatus 100 can be inspected, the control correction values corresponding to a plurality of positions to drive the wafer stage 7 can be determined, and the abnormality threshold values corresponding to a plurality of positions to drive the wafer stage 7 can be determined.

Figure 17:
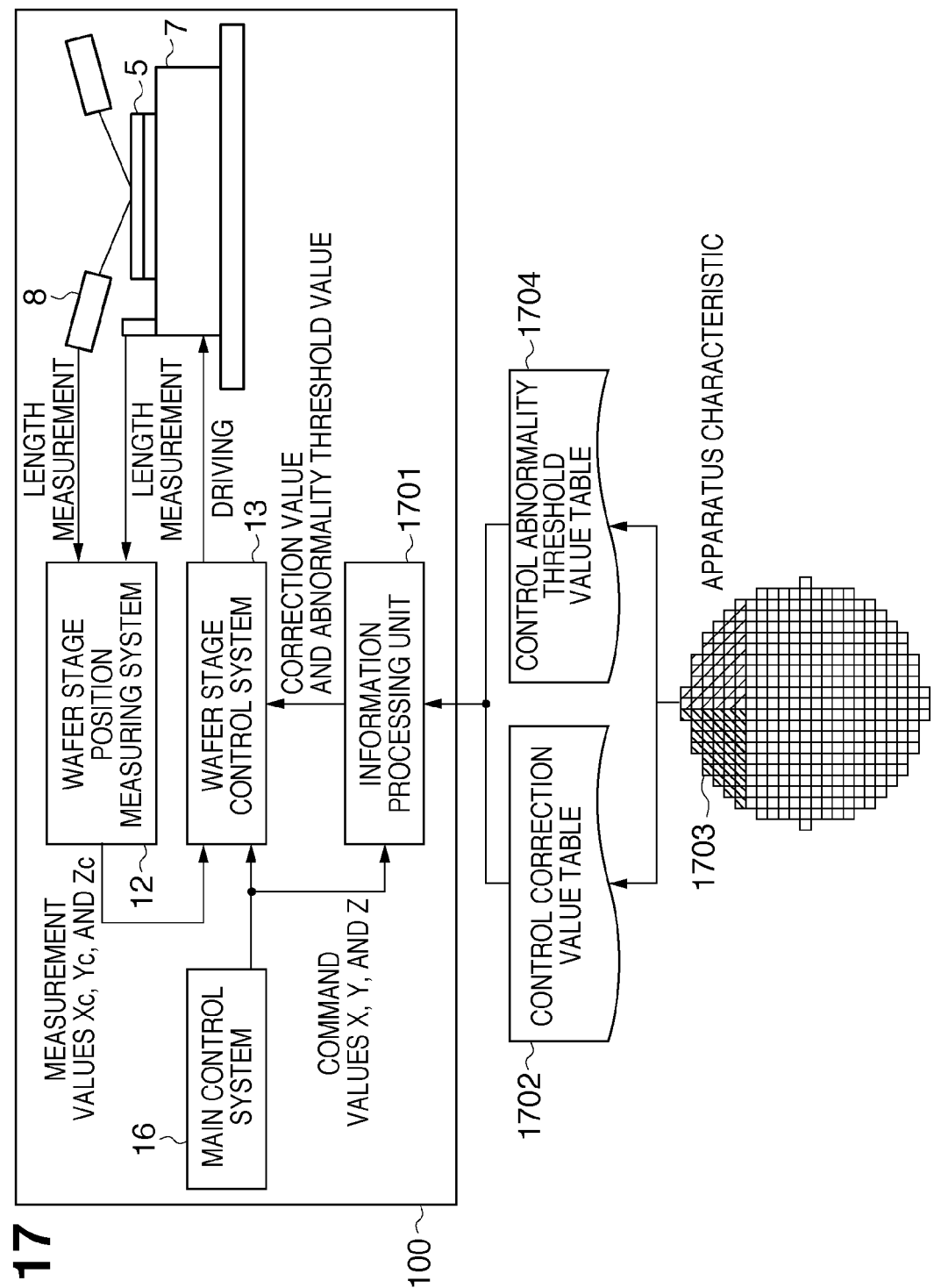
FIG. 17 is a block diagram showing a part of the arrangement of an exposure apparatus according to a preferred embodiment of the present invention.

FIG. 17 is a block diagram showing a part of the arrangement of an exposure apparatus 100 according to a preferred embodiment of the present invention. The exposure apparatus 100 includes an information processing unit 1701. The information processing unit 1701 can be provided with a control correction value table 1702 and control abnormality threshold value table 1704 by the information processing apparatus 202 described above. The information processing unit 1701 controls the wafer stage 7 based on the control correction value table 1702 and control abnormality threshold value table 1704.

The converting unit 223 of the information processing apparatus 202 converts shot region information into standard region information, thereby obtaining an apparatus characteristic 1703 at each position of a wafer stage 7 (the position of each standard region). The apparatus characteristic 1703 can include, for example, the X-coordinate range and Y-coordinate range of each standard region, and the control correction value and abnormality threshold value in these ranges of each standard region in the form of a data table.

The information processing unit 1701 receives the command values (only the X, Y, and Z components are shown) of the moving target position of the wafer stage 7 issued from a main control system 16, determines the correction value corresponding to the command values based on the control correction value table 1702, and sends the correction value to a wafer stage control system 13. The wafer stage control system 13 drives the wafer stage 7 based on the correction value and the command values of the moving target position of the wafer stage 7. This makes it possible to reduce a control error by the correction value determined at each position of the wafer stage 7. The information processing unit 1701 also determines the abnormality threshold value corresponding to the command values of the moving target position of the wafer stage 7 based on the control abnormality threshold value table 1704, and sends the abnormality threshold value to the wafer stage control system 13. The wafer stage control system 13 detects an abnormality based on the abnormality threshold value and the command values of the moving target position of the wafer stage 7.

A method of calculating a control characteristic unique to an exposure apparatus 100 after removing a shot control characteristic unique to a process from the value of shot region information (first region information) obtained by measurement by the exposure apparatus 100 during device production will be explained below.

The resist state and underlying pattern state change for each process, which has a unique characteristic. The control characteristic for each stage position is obtained by calculating the average of measurement results S serving as pieces of shot region information for a large number of processes.

The measurement result S for a certain shot region is given by:

$$S = M + P$$

where M is the control characteristic of the wafer stage control system 13 for the certain shot region, and P is the process-dependent characteristic for the certain shot region.

The average of the measurement results S for n processes is given by:

$$S/n = [(P1+M)+(P2+M)+\ldots+(Pn+M)]/n$$
$$= P1/n + P2/n + \ldots + Pn/n + M$$

If the number of processes n is sufficiently large, Pn/n is negligibly smaller than M. Then, we have an approximation:

$$S/n = M$$

The average of the measurement results S for a large number of processes represents the control characteristic M of the wafer stage control system 13.

Note that the shot region array changes for each process, so shot region information for each process is converted into standard region information according to the standard region array by the converting unit 223 of the information processing apparatus 202. The statistical processing unit 224 then calculates the average in each standard region.

Based on the control characteristic for each stage position represented by the average in each standard region described above, an abnormality of the exposure apparatus 100 can be inspected, the control correction value corresponding to each position of the wafer stage 7 can be determined, and the abnormality threshold corresponding to each position of the wafer stage 7 can be determined.

Figure 18:
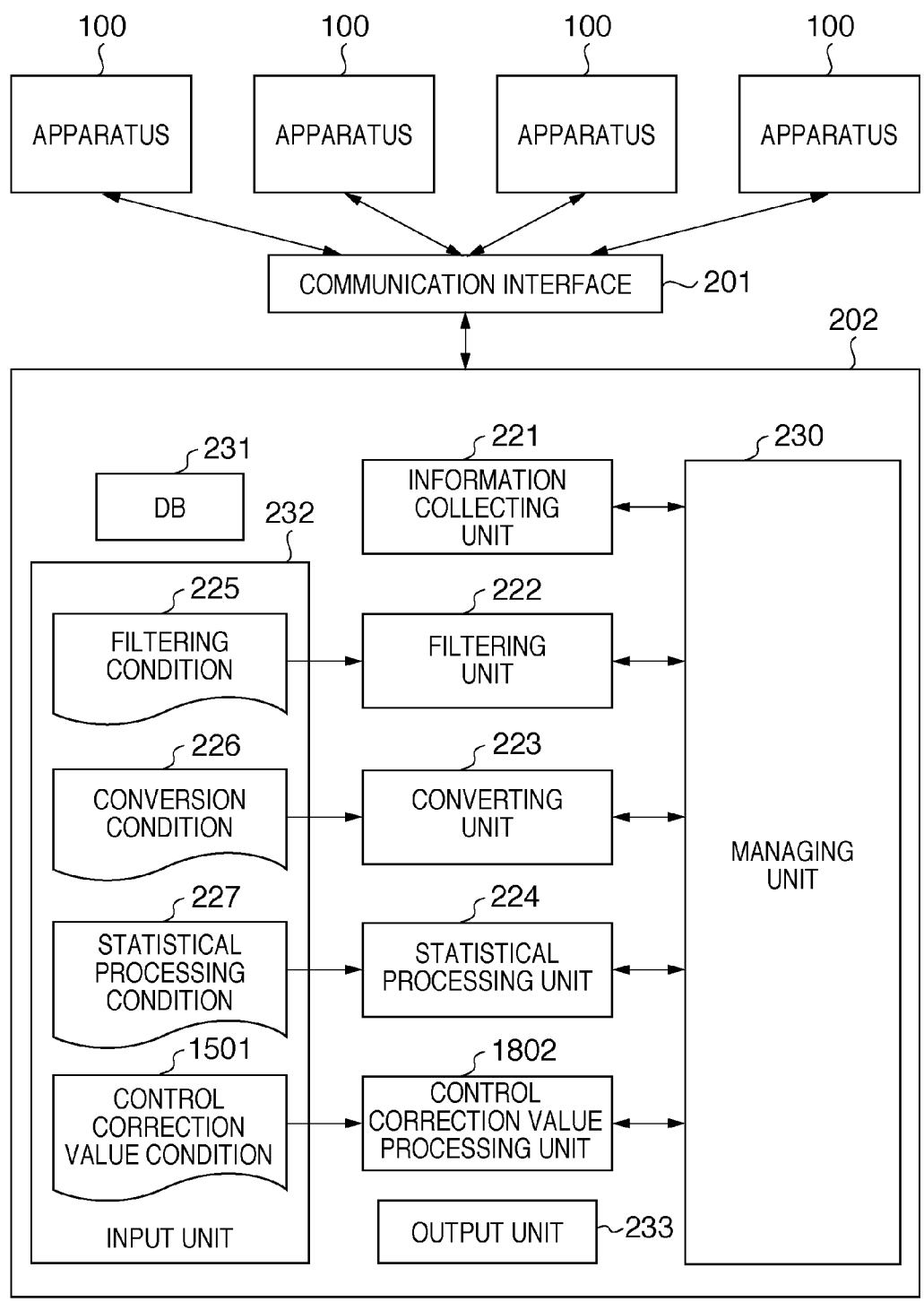
FIG. 18 is a block diagram showing an application example of the exposure system according to the preferred embodiment of the present invention.

FIG. 18 is a block diagram schematically showing the configuration of an exposure system in which an information processing apparatus 202 calculates the control correction value and feeds it back to the exposure apparatus 100 in order to control the wafer stage 7 of the exposure apparatus 100 with high accuracy.

The information processing apparatus 202 includes an input unit 232 for inputting the control condition, and a control correction value processing unit 1802. The control correction value processing unit (feedback unit) 1802 calculates the control correction value for each standard region based on the statistical processing result for each standard region obtained by a statistical processing unit 224, and outputs (feeds back) the calculation result to the exposure apparatus 100 as, for example, a control correction value table 1702.

Figure 19:
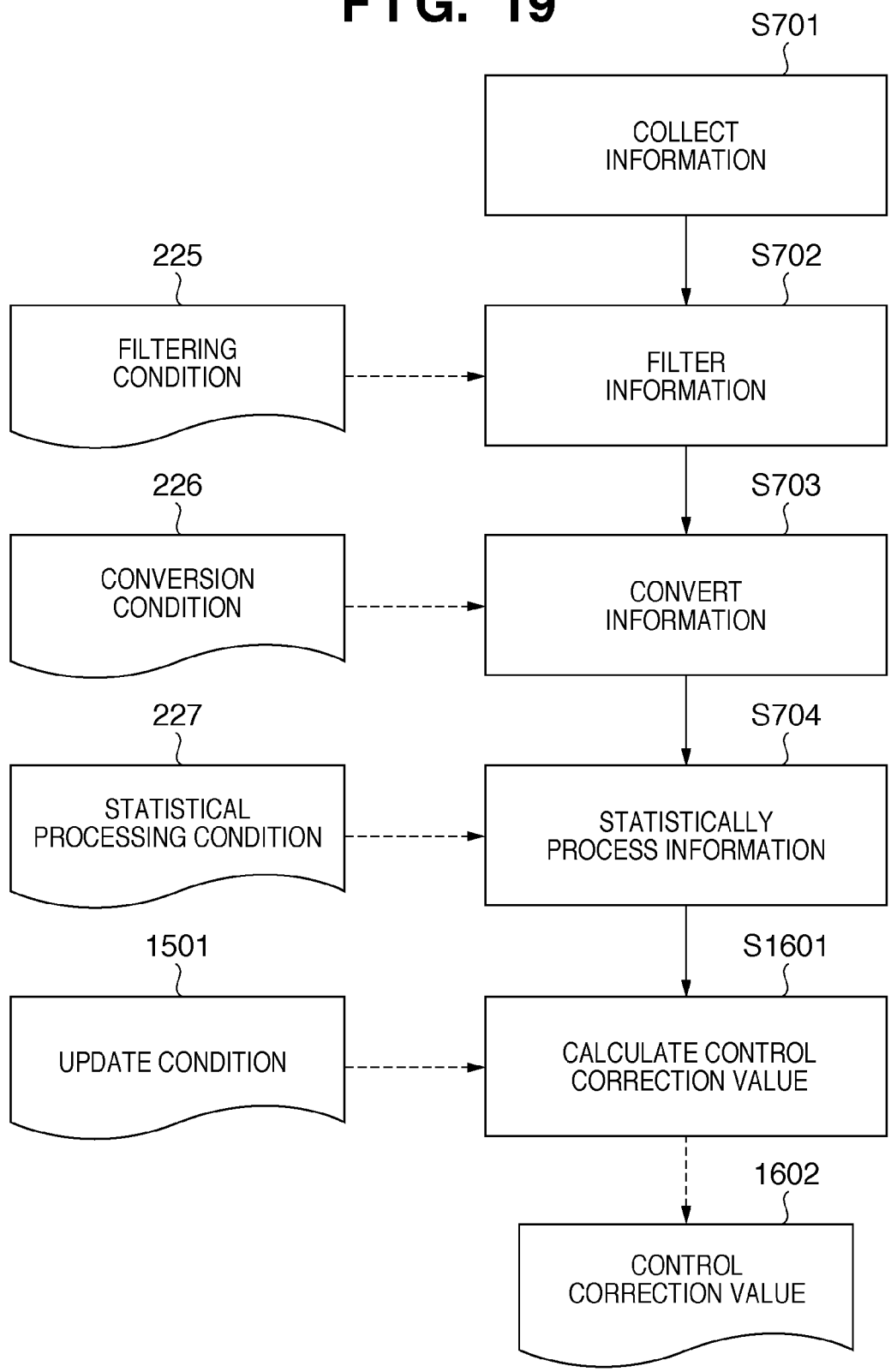
FIG. 19 is a flowchart illustrating the sequence of processing of calculating the control correction value.

FIG. 19 is a flowchart illustrating the sequence of processing of calculating the control correction value by the information processing apparatus 202 shown in FIG. 18.

In step S701 (collection step), an information collecting unit 221 acquires design-dependent apparatus information from the exposure apparatus 100 via a communication interface 201 and a communication interface 17 of the exposure apparatus 100, and stores it in a database 231.

In step S702 (filtering step), a filtering unit 222 filters the design-dependent apparatus information (control result 324) stored in the database 231, in accordance with a filtering condition 225, thereby extracting necessary information. The filtering condition used herein can be designated arbitrarily. The values involved in focus/leveling, the MAs in the X, Y, and θ directions, the MSDs in the X, Y, and θ directions, and the like can be designated as the filtering condition.

In step S703 (conversion step), a converting unit 223 converts the design-dependent apparatus information (first apparatus information) into standardized apparatus information (second apparatus information) in accordance with a designated conversion condition 226. The conversion condition 226 can be set via the input unit 232. An initial condition may be set to the conversion condition 226 in advance. The conversion condition 226 may be set even by selecting one of a plurality of conditions prepared in advance, as needed.

In step S704 (statistical processing step), the statistical processing unit 224 statistically processes the statistical value for each standard region in accordance with a statistical processing condition 227 designated for each exposure apparatus 100. A process of calculating the average in each standard region as the statistical processing value, for example, can be designated as the statistical processing condition 227.

In step S1601 (control correction value processing step), the control correction value processing unit 1802 outputs a control correction value 1602 in accordance with a control correction value condition 1501 from the statistical value for each standard region obtained in step S704 (statistical processing step). The control correction value 1602 can be output (fed back) to the exposure apparatus 100 as, for example, the control correction value table 1702.

Assume, for example, that the control correction value is given by a polynomial function of an approximation surface, which assumes the X and Y coordinates as the factors. In this case, it is possible to approximate the statistical value for each standard region using a polynomial having a predetermined order and a predetermined number of terms by the least-squares method, thereby calculating the coefficient of each term in the polynomial function. The data used for the calculation can be, for example, the statistical value for each standard region and the central position (X, Y) of the standard region. The order and the number of terms of the approximating polynomial are given by the control correction value condition 1501. For example, the correction value in the Z direction is calculated by a quadratic polynomial function Fz:

$$Fz(X,Y)=A\cdot X^2+B\cdot Y^2+C\cdot X\cdot Y+ D\cdot X+E\cdot Y+F$$

where A to F are coefficients to be calculated.

Alternatively, assume that the control correction value is given by a data table as illustrated in FIG. 17. In this case, a process of defining a table describing the X- and Y-coordinate ranges and calculating the control correction value from the statistical value for each standard region in these ranges, as illustrated in FIG. 23, may be designated as the control correction value condition 1501. For example, the average of the statistical values in standard regions each of which has its central position in the defined ranges may be determined as the control correction value in these ranges.

A process of multiplying the correction value described by a function or table as mentioned above by a coefficient so as to prevent overcorrection may be designated as the control correction value condition 1501. For example, a coefficient which adjusts the control correction value to 0.7 times the described value may be used.

A process of calculating a control offset of an apparatus by a comparison with other apparatuses may be designated as the control correction value condition 1501. For example, it is possible to designate a reference apparatus and a correlation with the reference apparatus as the control correction value condition 1501, and determine the control correction value for each standard region from the processing results for the reference apparatus and target apparatus, which are obtained in step S704 (statistical processing step).

The characteristic of the exposure apparatus may change due to time lapse, change of the operating method, and the like. To cope with this situation, the control correction value may be periodically calculated and changed if the characteristic has changed due to time lapse or change of the operating method.

Figure 20:
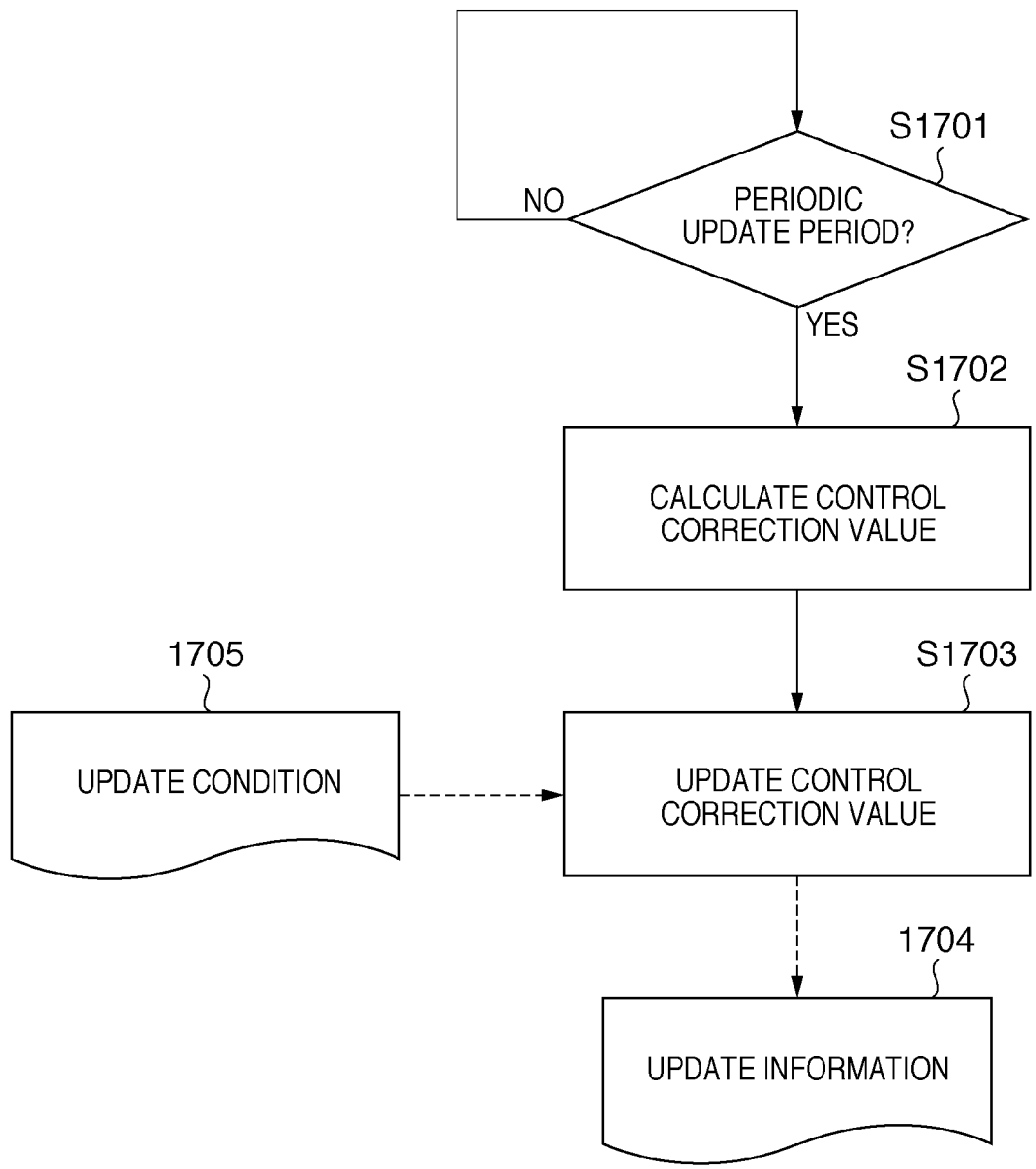
FIG. 20 is a flowchart illustrating an example in which the control correction value is calculated periodically.

FIG. 20 is a flowchart illustrating an example in which the control correction value is calculated periodically. In step S1701, it is determined whether the scheduled period has come. If YES in step S1701, the process advances to step S1702.

In step S1702, the processing illustrated in FIG. 19 is executed to calculate the control correction value, and the calculation result is stored in the DB 231.

In step S1703, the control correction value processing unit 1802 updates the control correction value based on the past control correction value stored in the DB 231 and a newly calculated control correction value, in accordance with an update condition 1705 input via the input unit 232. The update condition 1705 can include, for example, two coefficients (for example, 0.5 and 1.5) which serve to respectively determine the upper and lower limits of the range. Then, a process of updating, if a new control correction value falls outside the range having its upper and lower limits defined by multiplying the past control correction value by these coefficients, the past control correction value with the new control correction value can be designated as the update condition 1705.

In updating the control correction value, update information 1704 for updating the control correction value is sent from the information processing apparatus 202 to the exposure apparatus 100 via the communication interface 201.

Figure 21:
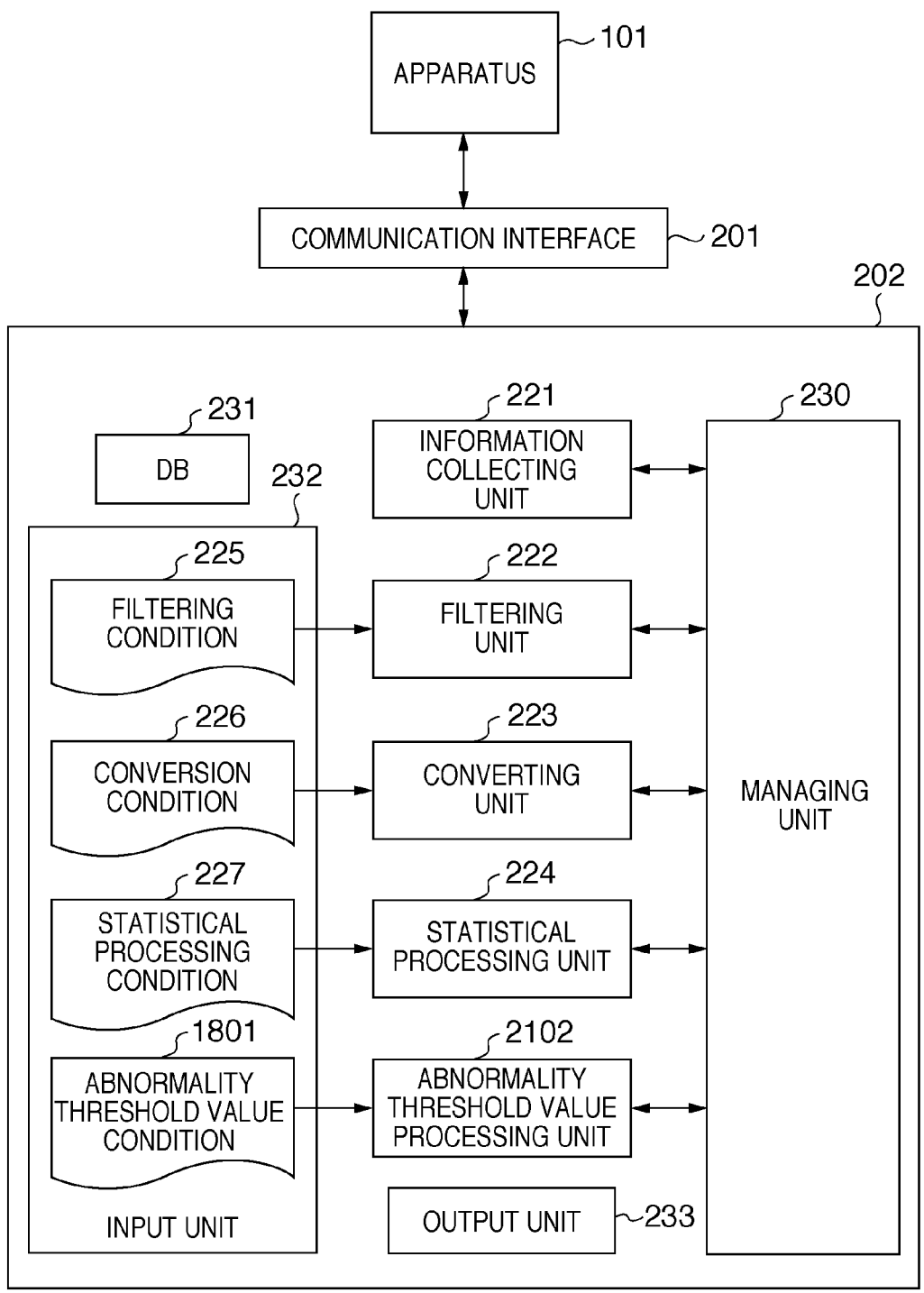
FIG. 21 is a block diagram showing an application example of the exposure system according to the preferred embodiment of the present invention.

Abnormality threshold value calculation by the information processing apparatus 202 will be exemplified next. FIG. 21 is a block diagram schematically showing the configuration of an exposure system in which an information processing apparatus 202 calculates the abnormality threshold value at each position of the wafer stage 7 in order to detect an abnormality of the accuracy of the wafer stage 7 of the exposure apparatus 100.

The information processing apparatus 202 includes an input unit 232 for inputting an abnormality threshold value condition 1801, and an abnormality threshold value processing unit 2102. The abnormality threshold value processing unit (feedback unit) 2102 calculates the abnormality threshold value for each standard region based on the statistical processing result for each standard region obtained by a statistical processing unit 224, and outputs (feeds back) the calculation result to the exposure apparatus 100 as, for example, a control abnormality threshold value table 1404.

Figure 22A:
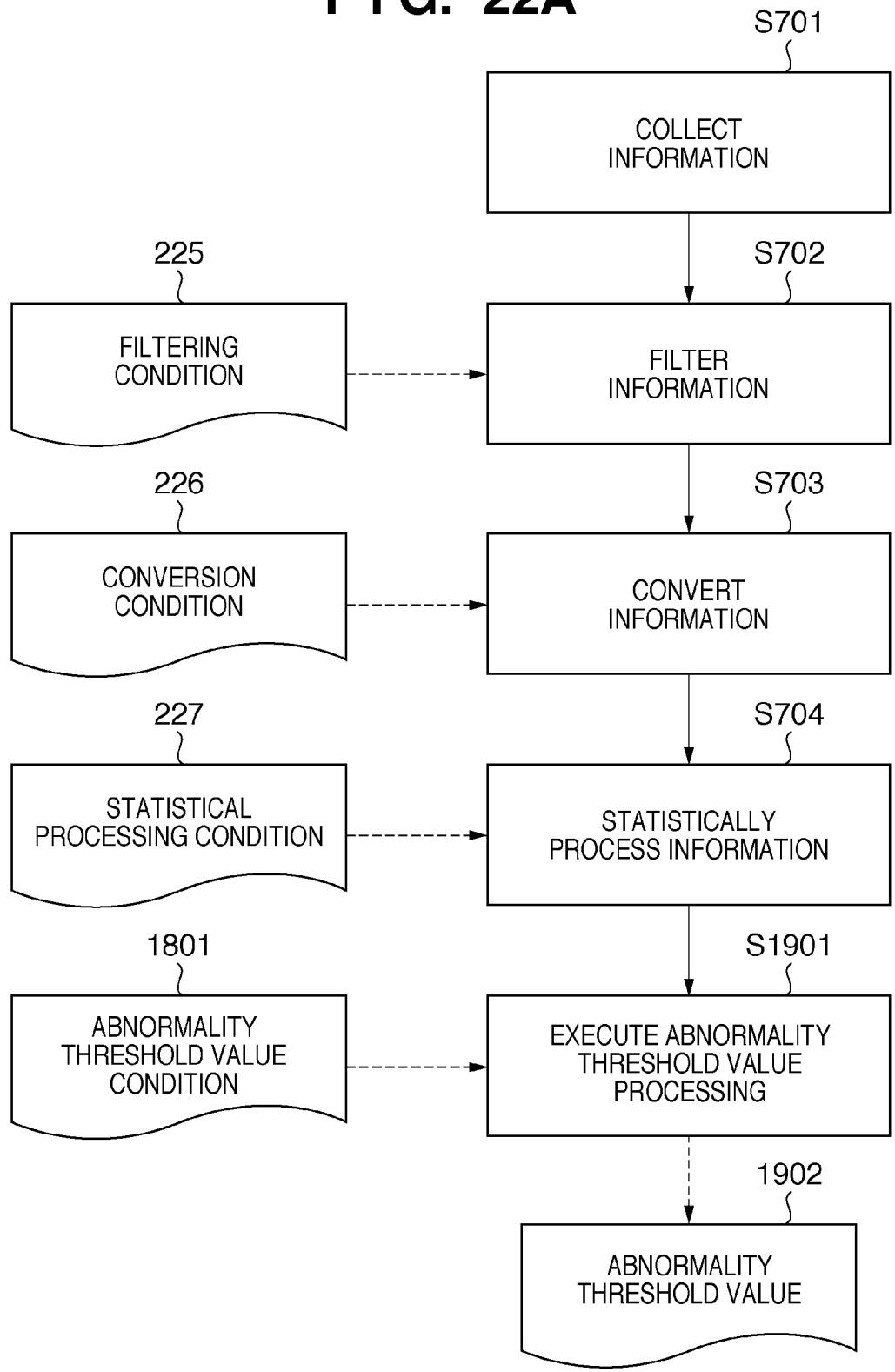
FIG. 22A is a flowchart illustrating the sequence of processing of calculating an abnormality threshold value.

FIG. 22A is a flowchart illustrating the sequence of processing of calculating the abnormality threshold value by the information processing apparatus 202 shown in FIG. 21.

In step S701 (collection step), an information collecting unit 221 acquires design-dependent apparatus information from the exposure apparatus 100 via a communication interface 201 and a communication interface 17 of the exposure apparatus 100, and stores it in a database 231.

In step S702 (filtering step), a filtering unit 222 filters the design-dependent apparatus information (control result 324) stored in the database 231, in accordance with a filtering condition 225, thereby extracting necessary information. The filtering condition used herein can be designated arbitrarily. For example, control errors of the values involved in focus/leveling, the MAs in the X, Y, and θ directions, the MSDs in the X, Y, and θ directions, and the like can be designated as the filtering condition.

In step S703 (conversion step), a converting unit 223 converts the design-dependent apparatus information (first apparatus information) into standardized apparatus information (second apparatus information) in accordance with a designated conversion condition 226. The conversion condition 226 can be set via the input unit 232. An initial condition may be set to the conversion condition 226 in advance. The conversion condition 226 may be set even by selecting one of a plurality of conditions prepared in advance, as needed.

In step S704 (statistical processing step), a statistical processing condition 227 is designated, and the statistical processing unit 224 calculates the statistical value for each standard region in accordance with the statistical processing condition 227. The 3σ value, maximum value, minimum value, and the like of the control errors extracted by filtering can be designated as the statistical processing condition 227 in order to check a variation in the values filtered for each standard region.

In step S1901 (abnormality threshold value processing step), the abnormality threshold value processing unit 2102 calculates the abnormality threshold value in accordance with the abnormality threshold value condition 1801 from the statistical value for each standard region obtained in step S704 (statistical processing step).

For example, the abnormality threshold value condition 1801 is a coefficient to calculate the abnormality threshold value. The abnormality threshold value for each standard region can be calculated in accordance with the coefficient from the statistical value for each standard region obtained in step S704 (statistical processing step).

Assume, for example, that the abnormality threshold value is given by a polynomial function of an approximation surface, which assumes the X and Y coordinates as the factors, in the same way as above. In this case, it is possible to approximate the statistical value for each standard region using a polynomial having a predetermined order and a predetermined number of terms by the least-squares method, thereby calculating the coefficient of each term in the polynomial function. The data used for the calculation can be, for example, the statistical value for each standard region and the central position (X, Y) of the standard region. The order and the number of terms of the approximating polynomial are given by the abnormality threshold value condition 1801.

Alternatively, assume that the abnormality threshold value is given by a data table as illustrated in FIG. 17, in the same way as above. In this case, a process of defining a table describing the X- and Y-coordinate ranges and calculating the abnormality threshold value from the statistical value for each standard region in these ranges can be designated as the abnormality threshold value condition 1801. For example, the variance of the statistical value in a standard region having its central position in the defined ranges may be used.

A process of multiplying the abnormality threshold value described by a function or table as mentioned above by a coefficient so as to prevent over-detection may be designated as the abnormality threshold value condition 1801. For example, a coefficient which adjusts the abnormality threshold value to 1.5 times the described value may be used.

In addition to a coefficient to calculate the abnormality threshold value, a threshold value adoption condition for determining whether to adopt the threshold value for each standard region may be designated as the abnormality threshold value condition 1801. Whether to adopt the abnormality threshold value is determined in accordance with the threshold value adoption condition for a region having a very large threshold value as compared with other regions.

This applies to portions such as the wafer peripheral portion, in which the accuracy need not be calculated because they do not allow easy control and therefore do not remain in a final product even upon being exposed. In these portions, whether to adopt the abnormality threshold value is determined because abnormality detection is unnecessary.

The limit of the abnormality threshold value, for example, can be determined as the threshold value adoption condition so that if the abnormality threshold value in a certain region exceeds the limit, it is not set. Alternatively, the statistical values may be calculated for a plurality of abnormality threshold values calculated for a plurality of regions to determine a region in which no abnormality threshold value is set, based on the magnitude relation between the statistical values and the threshold values set for the statistical values. Note that the statistical value can be, for example, the variance or standard deviation, and the threshold value set for the statistical value can be, for example, the upper limit (tolerance) of the variance or standard deviation.

The characteristic of the exposure apparatus may change due to time lapse, change of the operating method, and the like. To cope with this situation, the abnormality threshold value may be periodically calculated and changed if the characteristic has changed.

FIG. 22B is a flowchart illustrating an example in which the abnormality threshold value is calculated periodically. In step S2001, it is determined whether the scheduled period has come. If YES in step S2001, the process advances to step S2002.

In step S2002, the processing illustrated in FIG. 22A is executed to calculate the abnormality threshold value, and the calculation result is stored in the DB 231.

In step S2003, the abnormality threshold value processing unit 2102 updates the abnormality threshold value based on the past abnormality threshold value stored in the DB 231 and a newly calculated abnormality threshold value, in accordance with an update condition 2005. The update condition 2005 can include, for example, two coefficients (for example, 0.5 and 1.5) which serve to respectively determine the upper and lower limits of the range. Then, a process of updating, if a new abnormality threshold value falls outside the range having its upper and lower limits defined by multiplying the past abnormality threshold value by these coefficients, the past abnormality threshold value with the new abnormality threshold value can be designated as the update condition 2005.

In updating the abnormality threshold value, update information 2004 for updating the abnormality threshold value is sent from the information processing apparatus 202 to the exposure apparatus 100 via the communication interface 201.

(Use of Standard Region Information)

In this application example, a method of using standard region information to obtain information unique to a specific process, obtain information unique to a specific exposure apparatus, and obtain information for controlling a specific exposure apparatus to execute a specific process will be explained.

The value of each shot region information (shot region information will also be referred to as first region information and can include, for example, the synchronization accuracy, focus/leveling measurement value, and focus/leveling followability) obtained by measurement by an exposure apparatus 100 during wafer processing includes the control characteristic of a wafer stage 7 and a characteristic for each process at the position of the corresponding shot region (in other words, the position of the wafer stage 7). The resist state and underlying pattern state change for each process, which has a unique characteristic. In this application example, of the values of the shot region information, the amount of control deviation for each shot region unique to a process, which includes no components involved in control characteristics unique to individual exposure apparatuses, is obtained. It is possible to calculate, for example, an offset and the accuracy reliability for each shot region based on the amount of control deviation for each shot region unique to a process, and therefore to exploit the calculation results for offset setting for a new process and process setting offsets for other exposure apparatuses.

Figure 24:
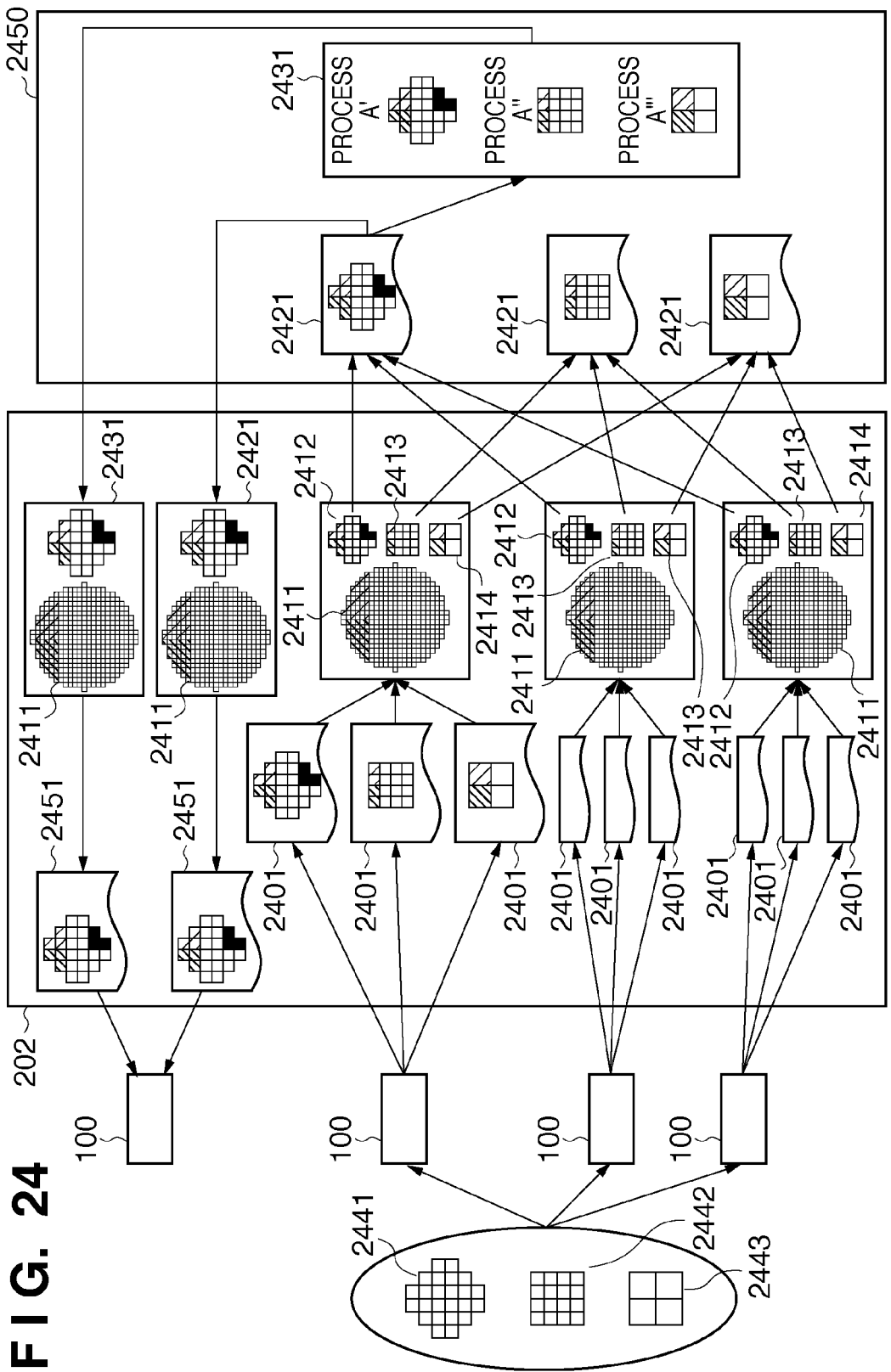
FIG. 24 is a view schematically showing a method of obtaining information unique to a process and using the information.

FIG. 24 is a view schematically showing a method of obtaining information unique to a process and using the information. Processes 2441, 2442, and 2443 have different shot region arrays, which are exposed by one or a plurality of exposure apparatuses 100. The value of a measurement result (shot region information) 2401 for each shot region obtained by measurement in the exposure processing includes the characteristics of an exposure apparatus 100 and process. An information processing apparatus 202 collects the measurement results for each shot region from a plurality of exposure apparatuses 100, isolates characteristics 2411 of the exposure apparatuses from the measurement results, and calculates process characteristics 2412. A shot control characteristic unique to a process does not include the control characteristics of individual exposure apparatuses, and therefore can be exploited for a process design.

A system 2450 which processes a process design uses the process characteristic 2412 as process design information 2421 serving as information on a shot control characteristic unique to a process design. The process design information 2421 includes, for example, the amount of control deviation for each shot region, in addition to information indicating the position of each shot region (the position of a wafer stage 7). The system 2450 can use information on a shot control characteristic unique to a certain process to determine an offset 2431 to be used for a new process which bears pieces of information on processing steps such as the shot region array, resist, and underlying pattern, that are the same as or similar to those of the certain process. Also, specifying a portion in which the pattern line width is large and that in which the alignment accuracy is poor based on the shot control characteristic makes it possible to, for example, change the pattern design and adjust the recipe in the manufacturing process.

When the information processing apparatus 202 combines (integrates) an offset 2431 unique to a new process and a characteristic 2411 of an exposure apparatus which executes the process for the first time, it can determine an offset 2451 to be set for the exposure apparatus. Likewise, when the information processing apparatus 202 combines (integrates) pieces of process design information 2421 obtained by executing a process by one or a plurality of exposure apparatuses with characteristics 2411 of other exposure apparatuses which execute the process for the first time, it can determine offsets 2441 to be set for the other exposure apparatuses.

A method of calculating a shot control characteristic unique to a process after removing a control characteristic unique to an exposure apparatus 100 from the value of each shot region information (first apparatus information) obtained by measurement by the exposure apparatus 100 during wafer processing will be explained below.

A measurement result S serving as shot region information is given by:

$$S = M + P + W$$

where M is the control characteristic of a wafer stage control system 13 for a certain shot region, P is a characteristic which depends on a process for the certain shot region (process characteristic), and W is a wafer-dependent characteristic (wafer characteristic).

The average of measurement results S obtained by executing a single process for i wafers is given by:

$$S/i = [(M + P + W1) + (M + P + W2) + \ldots + (M + P + Wi)]/i$$
$$= W1/i + W2/i + \ldots + Wi/i + M + P$$

If the number of wafers i is sufficiently large, Wi/i is negligibly smaller than M and P. Then, we have an approximation:

$$S/i = M + P$$

The average of the measurement results S serving as pieces of shot region information obtained by executing a single process for a large number of wafers includes the control characteristic M of the wafer stage control system 13, and the characteristic P unique to the process.

The average of the measurement results S for n processes assuming that a large number of wafers are provided for each process and S=M+P is given by:

$$S/n = [(P1 + M) + (P2 + M) + \ldots + (Pn + M)]/n$$
$$= P1/n + P2/n + \ldots + Pn/n + M$$

If the number of processes n is sufficiently large, Pn/n is negligibly smaller than M. Then, we have an approximation:

$$S/n = M$$

The average of the measurement results S obtained by executing a large number of processes for a large number of wafers represents the control characteristic M of the wafer stage control system 13.

Note that the shot region array changes for each process, so shot region information for each process is converted into standard region information according to the standard region array by a converting unit 223 of the information processing apparatus 202. A statistical processing unit 224 then calculates the average in each standard region.

When the standard region information according to the standard region array is further converted into shot region information according to the shot region array of a specific process, exposure apparatus information S' for each shot region of the specific process is given by:

$$S'=S/i-S/n=M+P-M=P$$

The exposure apparatus information S' represents the characteristic P of each shot region of the specific process.

Figure 25:
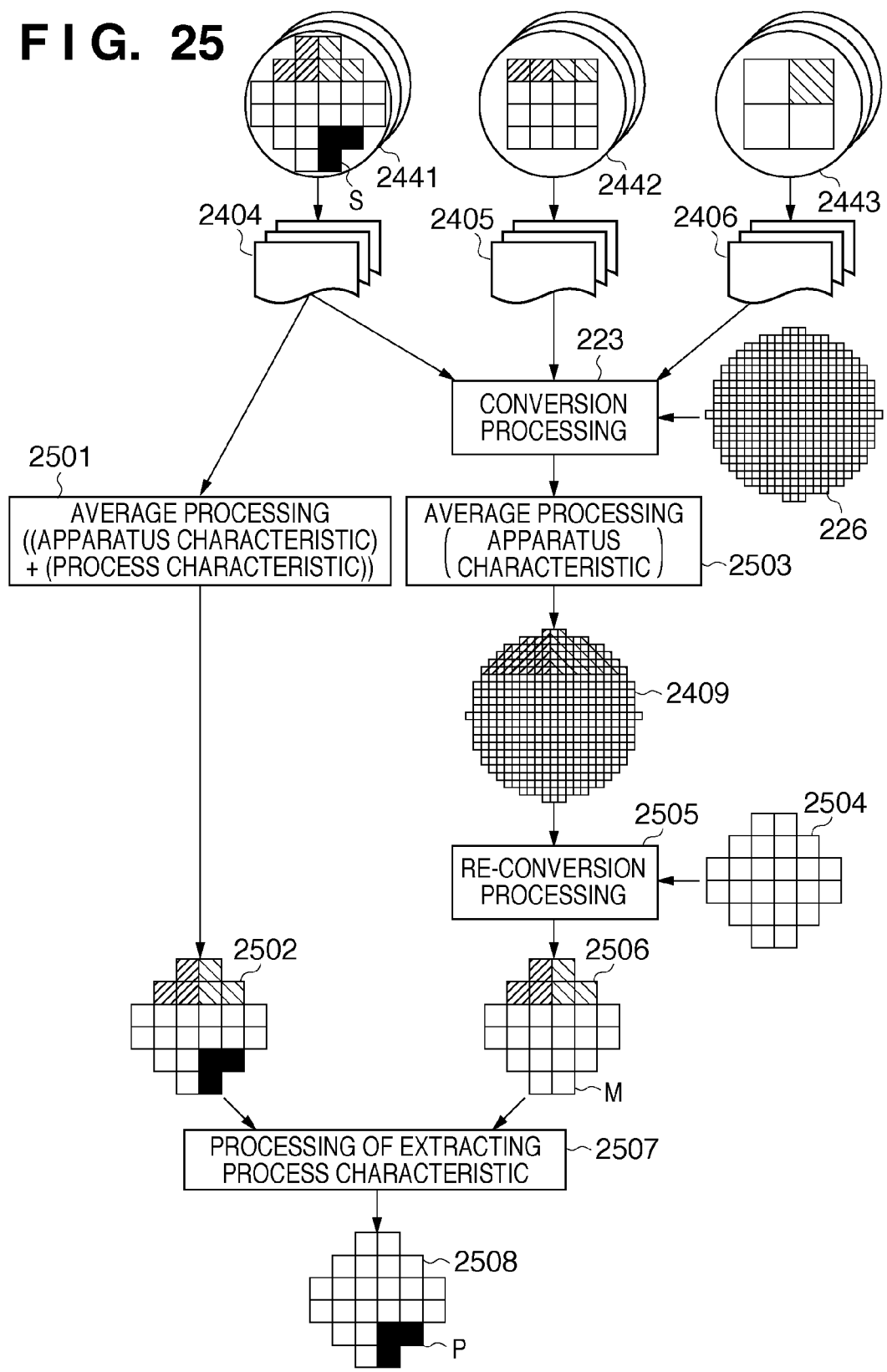
FIG. 25 is a flowchart schematically illustrating the sequence of processing of calculating a characteristic unique to a process.

FIG. 25 is a flowchart schematically illustrating the sequence of processing of calculating a characteristic unique to a process. FIG. 25 shows the sequence of calculating a characteristic P of a specific process in a certain shot region assuming that apparatus information obtained by executing the process 2441 for the certain shot region is the measurement result S.

First, a plurality of pieces of design-dependent apparatus information (to be also referred to as pieces of process-dependent apparatus information) 2404, 2405, and 2406 are obtained by an exposure operation of the executing processes 2441, 2442, and 2443. A result 2409 is obtained by converting the pieces of design-dependent apparatus information 2404, 2405, and 2406 into standardized apparatus information according to the standard region array in accordance with a conversion condition 226 by the converting unit 223, and executing average processing 1503 for each standard region by the statistical processing unit 224. The converting unit 223 executes re-conversion processing 1505 for the result 2409 in accordance with a conversion condition 2504 according to which conversion from the result into shot region information according to the same shot region array as that of the process 2441 is designated. Shot region information of a certain shot region in a result 2506 obtained by the re-conversion processing is the control characteristic M of the wafer stage control system 13 for the certain shot region.

The design-dependent apparatus information 2404 obtained by executing the process 2441 is also directly provided to the statistical processing unit 224. The statistical processing unit 224 also executes average processing 2501 for the design-dependent apparatus information 2404 (calculates the average in each shot region), thereby obtaining a result 2502.

A difference processing unit 2601 executes extraction processing 2507 of obtaining a process characteristic from the difference between the results 2506 and 2502, thereby obtaining a result 2508. The result 2508 is a characteristic P for each shot region when a specific process is executed.

A method of re-converting converted standardized apparatus information into design-dependent apparatus information according to the shot region array of a certain process will be explained below. FIGS. 32A to 32F are views illustrating a conversion method when the process layout design is the shot viewing angle itself. If standard regions of a standard region array 2701 are smaller than the shot regions in a process layout 2702, the conversion processing can be executed according to the first example described above. On the other hand, if standard regions are larger than the shot regions in the process layout 2702, as in a standard region array 2704, the conversion processing can be executed according to the second example described above.

FIGS. 33A to 33F are views illustrating a conversion method when the process layout design is a region obtained by finely dividing a region defined by the shot viewing angle. If standard regions of a standard region array 2801 are smaller than the shot regions in a process layout 2802, the conversion processing can be executed according to the first example described above. On the other hand, if standard regions are larger than the shot regions in the process layout 2802, as in a standard region array 2804, the conversion processing can be executed according to the second example described above.

Figure 26:
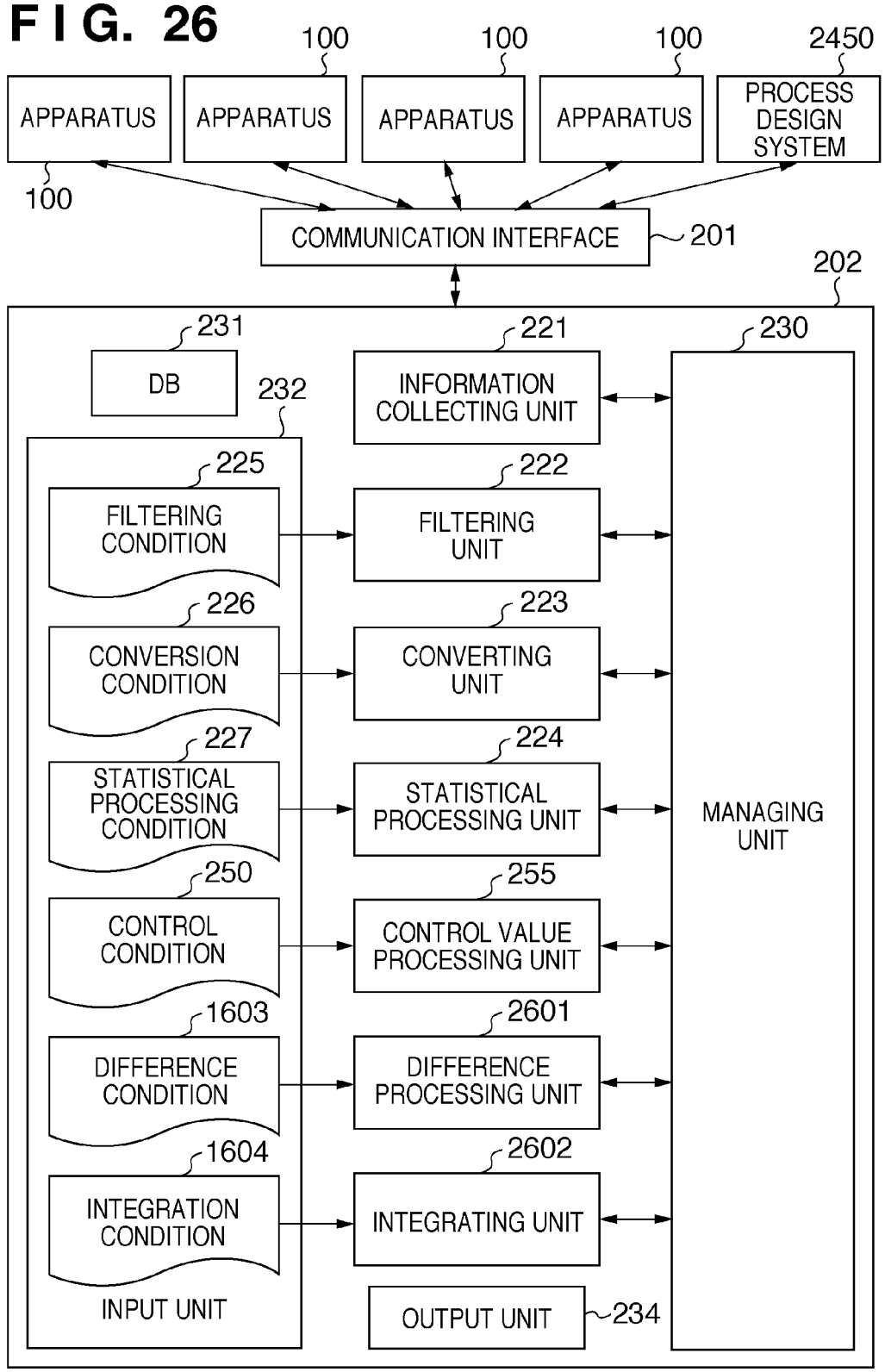
FIG. 26 is a block diagram showing an application example of the exposure system according to the preferred embodiment of the present invention.

Processing by an information processing apparatus 202 will be explained below. FIG. 26 is a block diagram schematically showing the configuration of an exposure system which calculates a characteristic unique to a process and feeds it back to a process design system or exposure apparatus.

The information processing apparatus 202 includes a difference processing unit 2601 and calculates the characteristic of a designated process based on the characteristic of a designated exposure apparatus and the statistical value of a designated process.

The control value calculated for each process layout region is fed back to a system 2450 which can design a process and processes a process design, via a communication interface 201.

The information processing apparatus 202 includes an integrating unit 2602, and integrates the characteristic of a designated exposure apparatus with the characteristic of a designated process and calculates the characteristic of the designated process for the designated exposure apparatus.

The information processing apparatus 202 includes a control value processing unit 255, and calculates the control value for each process layout region based on a control condition 250 input via an output unit 233 and the processing result obtained by the integrating unit 2602.

The control value calculated for each process layout region is fed back to the designated exposure apparatus 100 via the communication interface 201.

Figure 27:
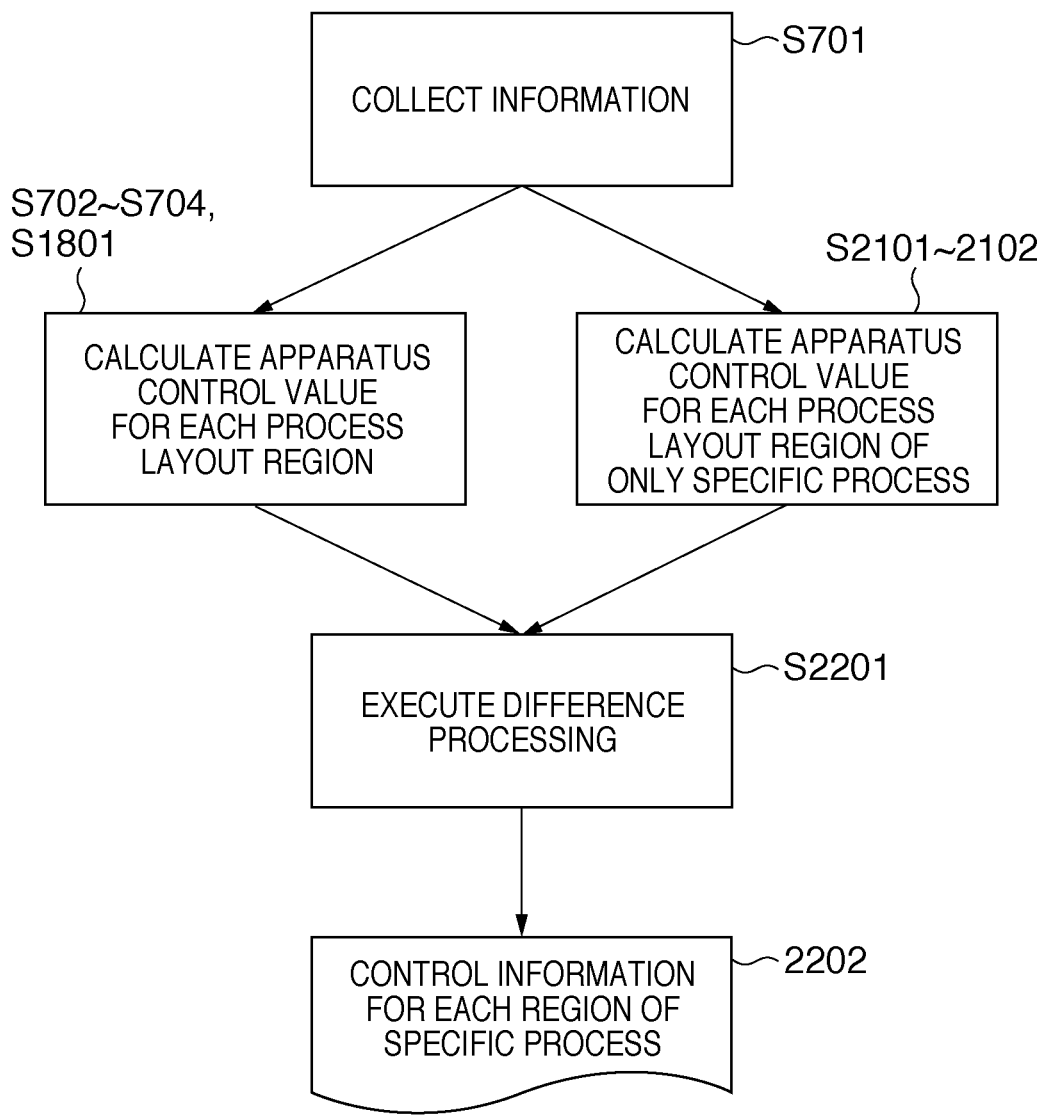
FIG. 27 is a flowchart illustrating the sequence of processing of calculating the control value for each process layout region of a specific process.
Figure 28:
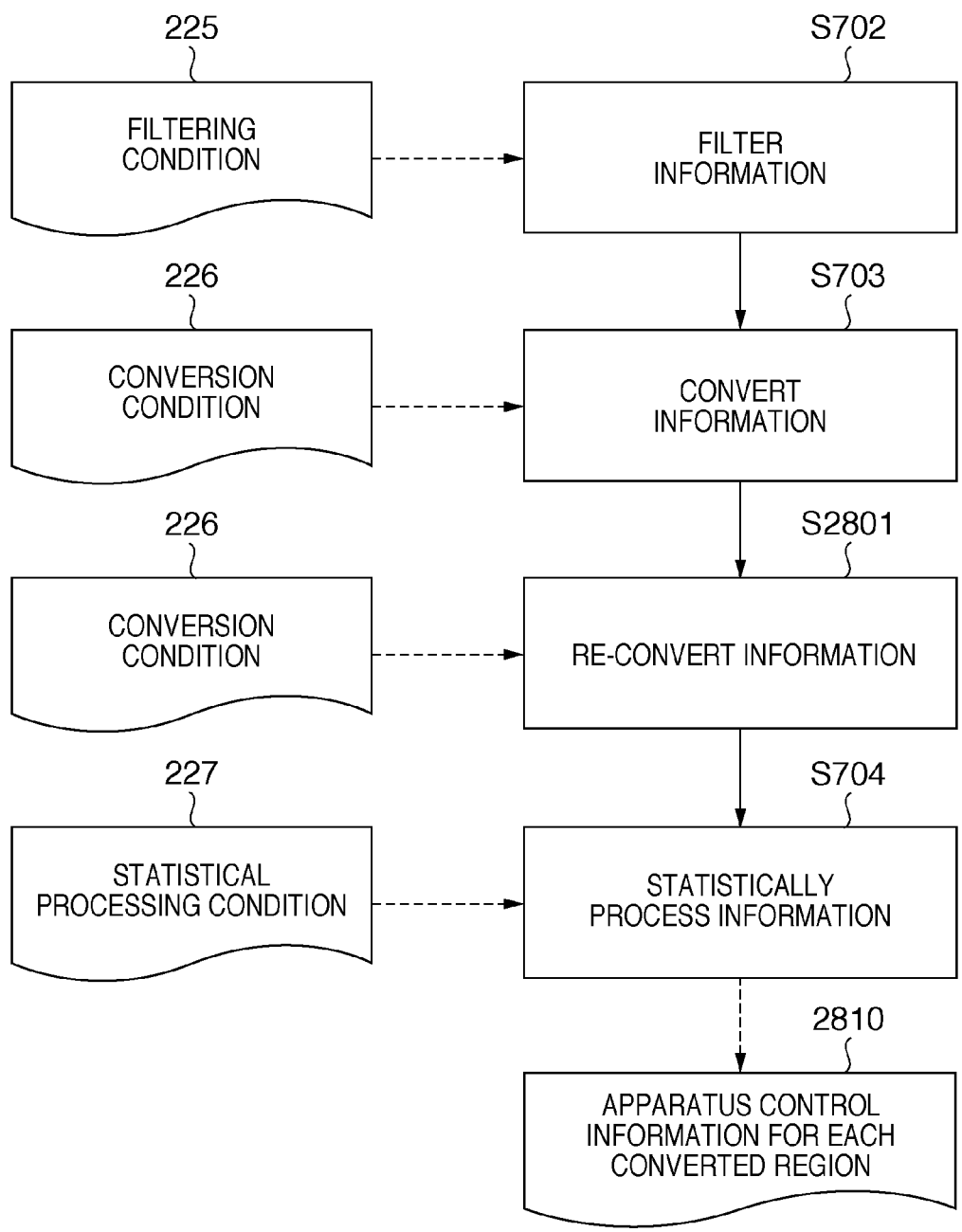
FIG. 28 is a flowchart for explaining the sequence of processing of calculating apparatus control information for each process layout region of a specific process.

FIG. 27 is a flowchart illustrating the sequence of processing of calculating the control value for each process layout region of a specific process. This method is used to extract the control characteristic in a specific process, which does not include the control characteristic of an exposure apparatus. FIG. 28 is a flowchart for explaining the sequence of processing of calculating apparatus control information for each process layout region of a specific process.

In step S701 (collection step), an information collecting unit 221 acquires design-dependent apparatus information from the exposure apparatus 100 via a communication interface 201 and a communication interface 17 of the exposure apparatus 100, and stores it in a database 231.

In step S702 (filtering step), a filtering unit 222 filters the design-dependent apparatus information (control result 324) stored in the database 231, in accordance with a filtering condition 225, thereby extracting necessary information. The filtering condition used herein can be designated arbitrarily. For example, control errors of the values involved in focus/leveling, the MAs in the X, Y, and θ directions, the MSDs in the X, Y, and θ directions, and the like can be designated as the filtering condition.

Note that a process, for which a special apparatus operation is executed, such as a test process may be removed from shot region specifying information 321 by regarding it as being inappropriate for the calculation of apparatus control information.

The filtering condition 225 can be determined so as to designate a plurality of exposure apparatuses which have exposed shot regions according to a specific process of interest.

In step S703 (conversion step), a converting unit 223 converts the design-dependent apparatus information (first apparatus information) into standardized apparatus information (second apparatus information) in accordance with a designated conversion condition 226. The conversion condition 226 can be set via the input unit 232. An initial condition may be set to the conversion condition 226 in advance. The conversion condition 226 may be set even by selecting one of a plurality of conditions prepared in advance, as needed.

Step S1801 (re-conversion step) is executed subsequent to step S703. In step S1801, the converting unit 223 converts the standardized apparatus information (second apparatus information) into information in the process layout region of a specific process for which the control value is calculated, in accordance with the conversion condition 226.

Step S704 (statistical processing step) is executed subsequent to step S1801 (re-conversion step). In step S704, the statistical value is calculated for each layout design region of a specific process in accordance with statistical processing designated as a statistical processing condition 227. For example, the average is calculated for each layout design region of a specific process as the statistical processing. The statistical processing result is used as the control characteristic of each exposure apparatus in difference processing (to be described later). Hence, the average calculation is executed for all exposure apparatus designated in accordance with the filtering condition 225. With this operation, apparatus control information for each region converted into a specific process design layout is obtained from design-dependent apparatus information (first apparatus information) of an exposure apparatus which has executed a plurality of processes.

Next, a control characteristic generated only in a specific process is derived. In step S2201 (difference processing step) of FIG. 27, a control characteristic 2202 generated only in a specific process is calculated. In this calculation, the value of apparatus control information 1802 for each converted region as the result obtained in step S704 is subtracted from the value of apparatus control information 2103 for each region based on the result of the specific process obtained in step S2102.

Figure 29:
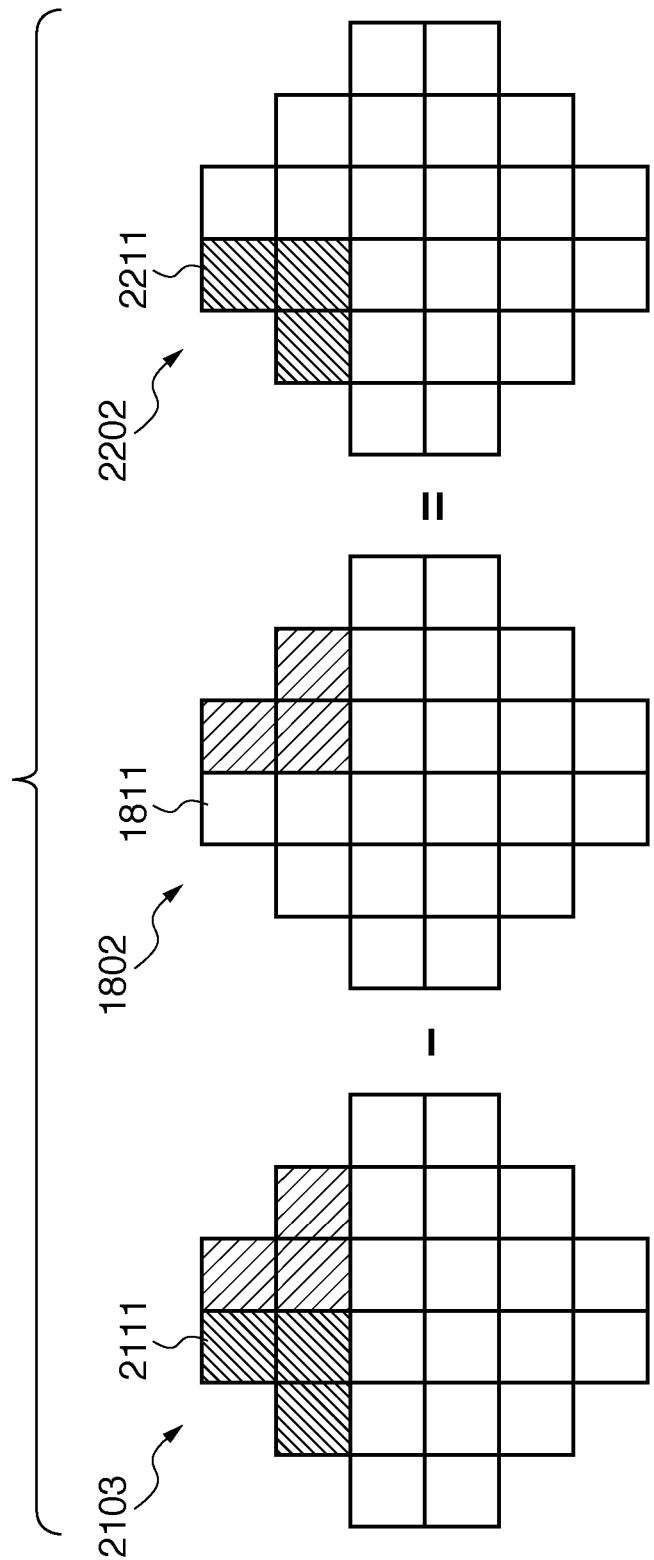
FIG. 29 is a view illustrating a method of obtaining the characteristic of a certain region.

As shown in FIG. 29, from the value of apparatus control information 2111 for each layout design region of the result 2103 obtained in step S2102, the value of apparatus control information in an identical layout design region 1811 of the result 1802 obtained in step S704 is subtracted. With this operation, a characteristic 2211 in this region is obtained. This calculation is executed for each layout design region. This difference processing is executed for each apparatus designed in accordance with the filtering condition 225.

The control characteristic 2202 generated only in the specific process, which is obtained in the above-described way, is sent to the system 2450 via the communication interface 201. Based on this result, the system 2450 can execute a trial calculation of, for example, the amount of control deviation for each shot region of a new process. For example, based on the control characteristics in the same process obtained by each exposure apparatus, the average control characteristic in this process can be calculated and used as the control characteristic in a new process having a similar shot array. It is also possible to calculate the control value in a new process in an arbitrary exposure apparatus by sending the obtained control characteristic to the information processing apparatus 202.

Figure 30:
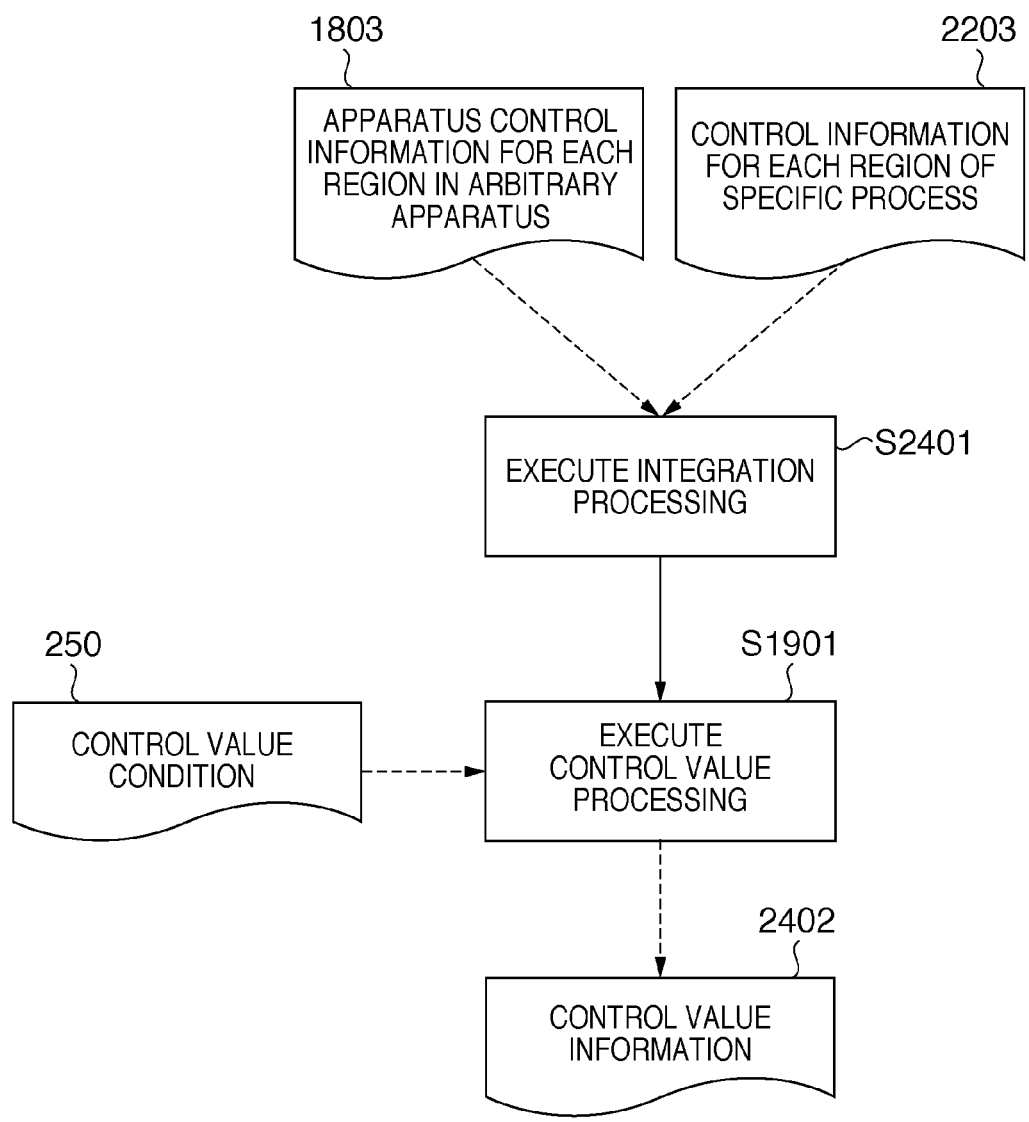
FIG. 30 is a flowchart for explaining a method of obtaining the control value in a specific process in a specific exposure apparatus.
Figure 32A:
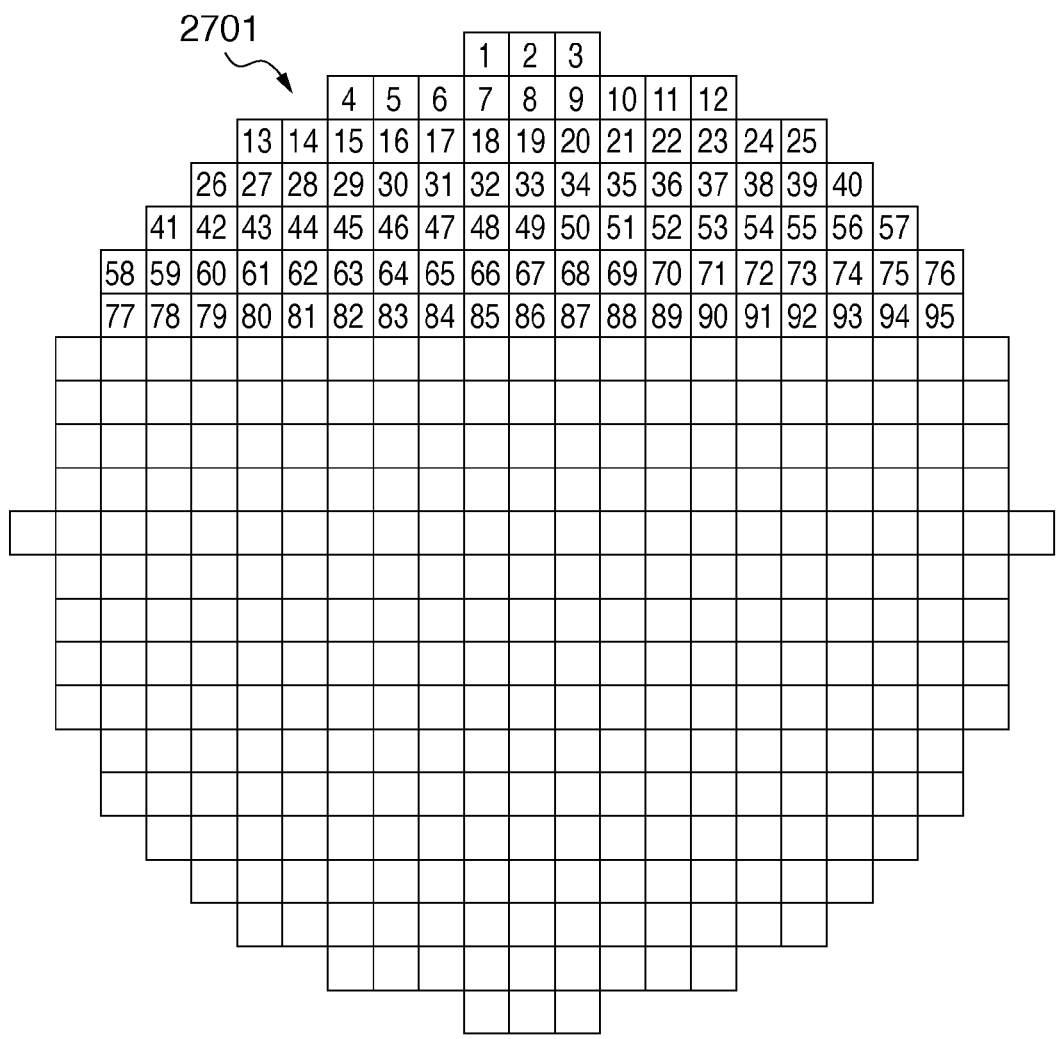
Figure 32B:
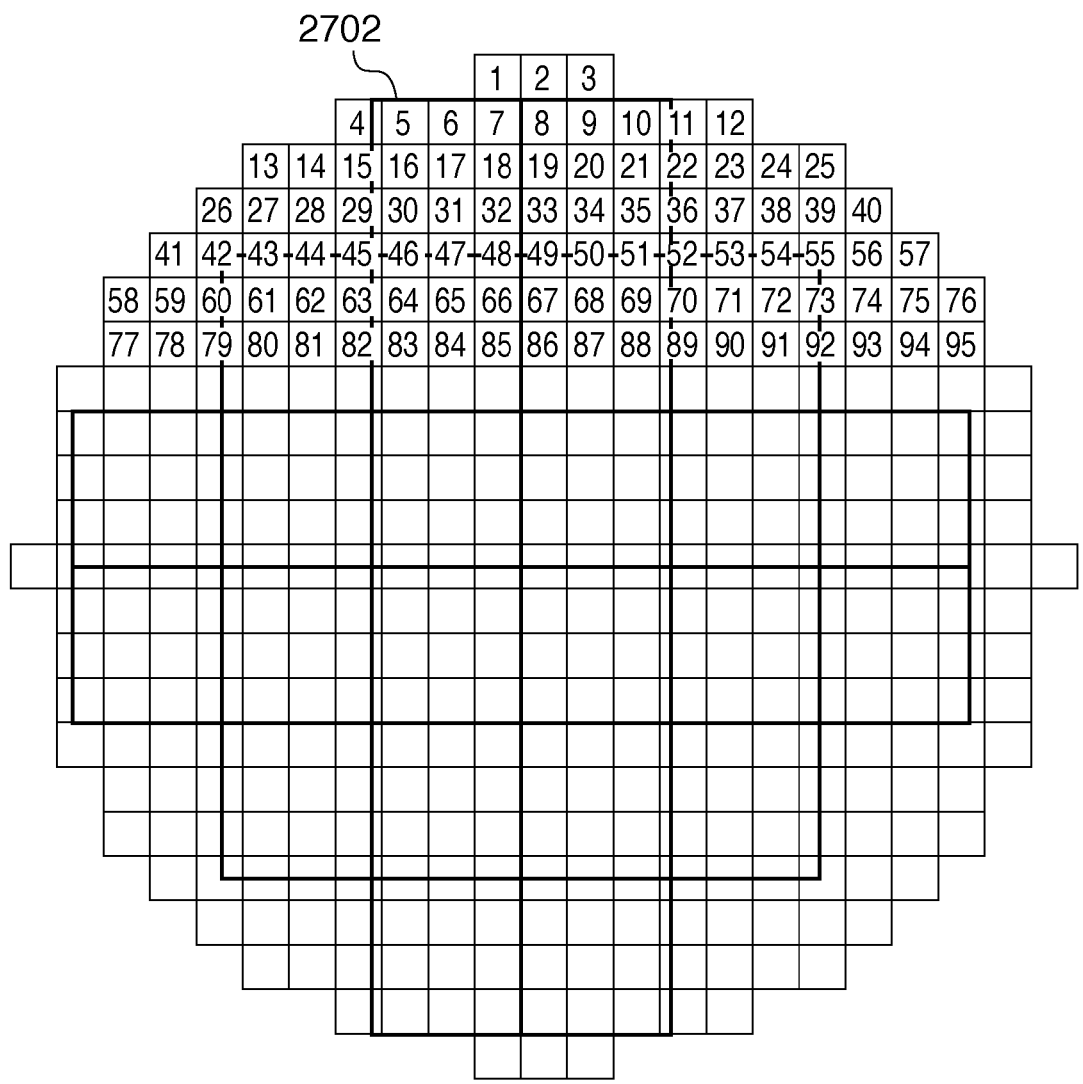
Figure 32F:
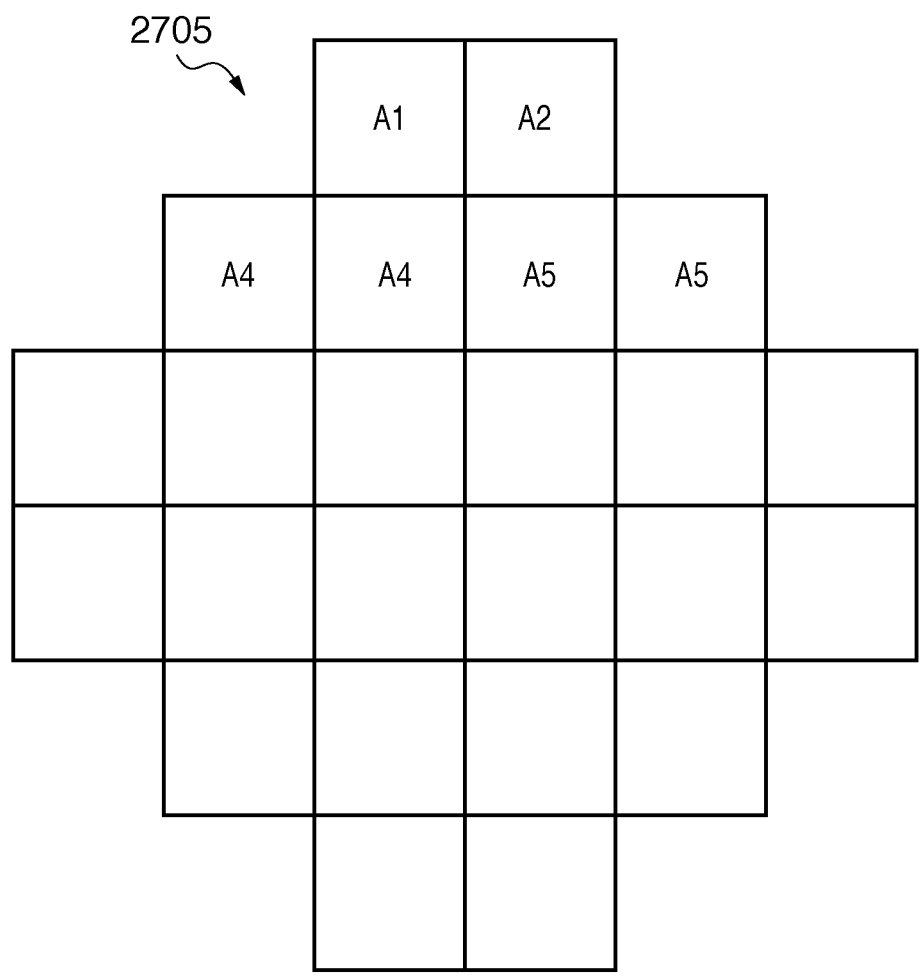
Figure 33A:
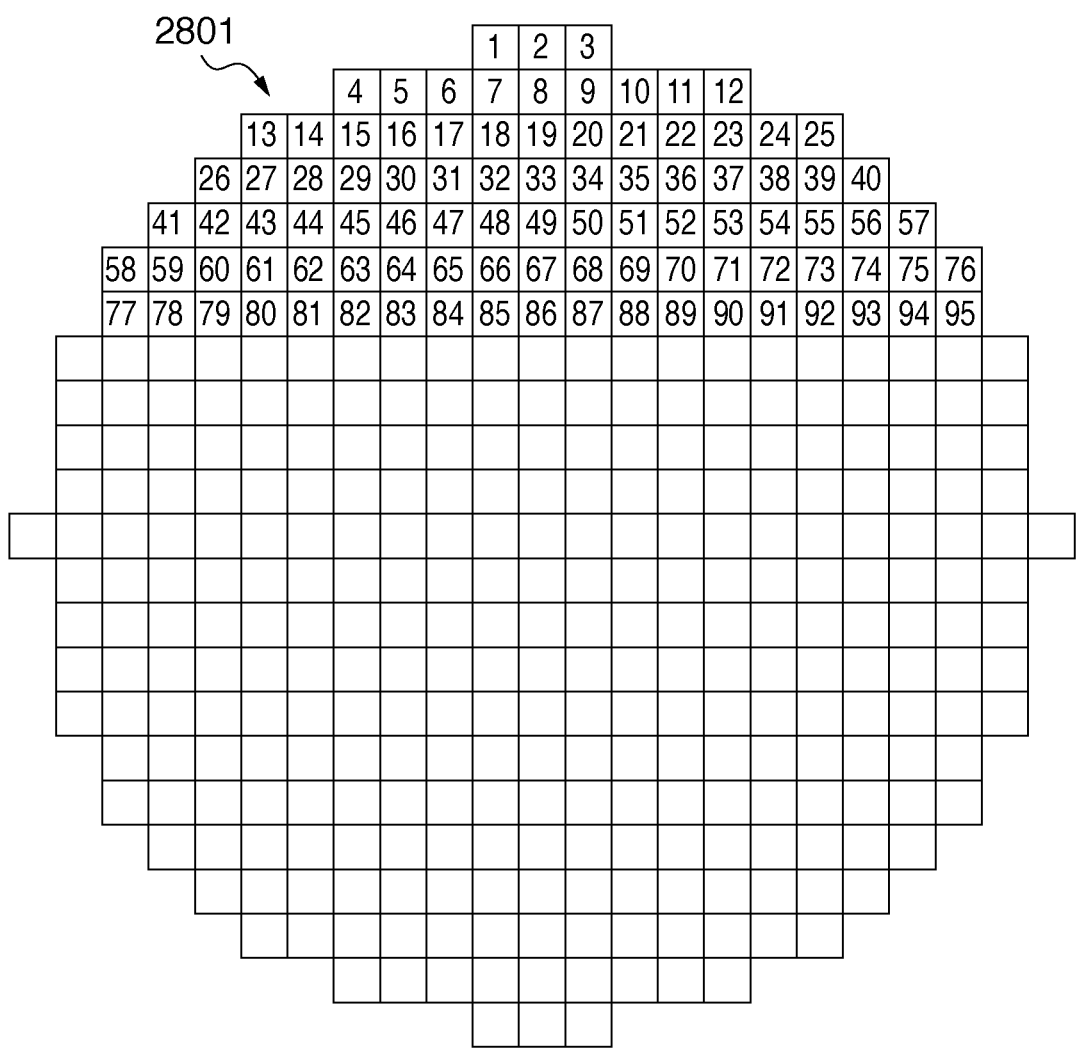
FIGS. 33A to 33F are views illustrating another conversion processing.
Figure 33B:
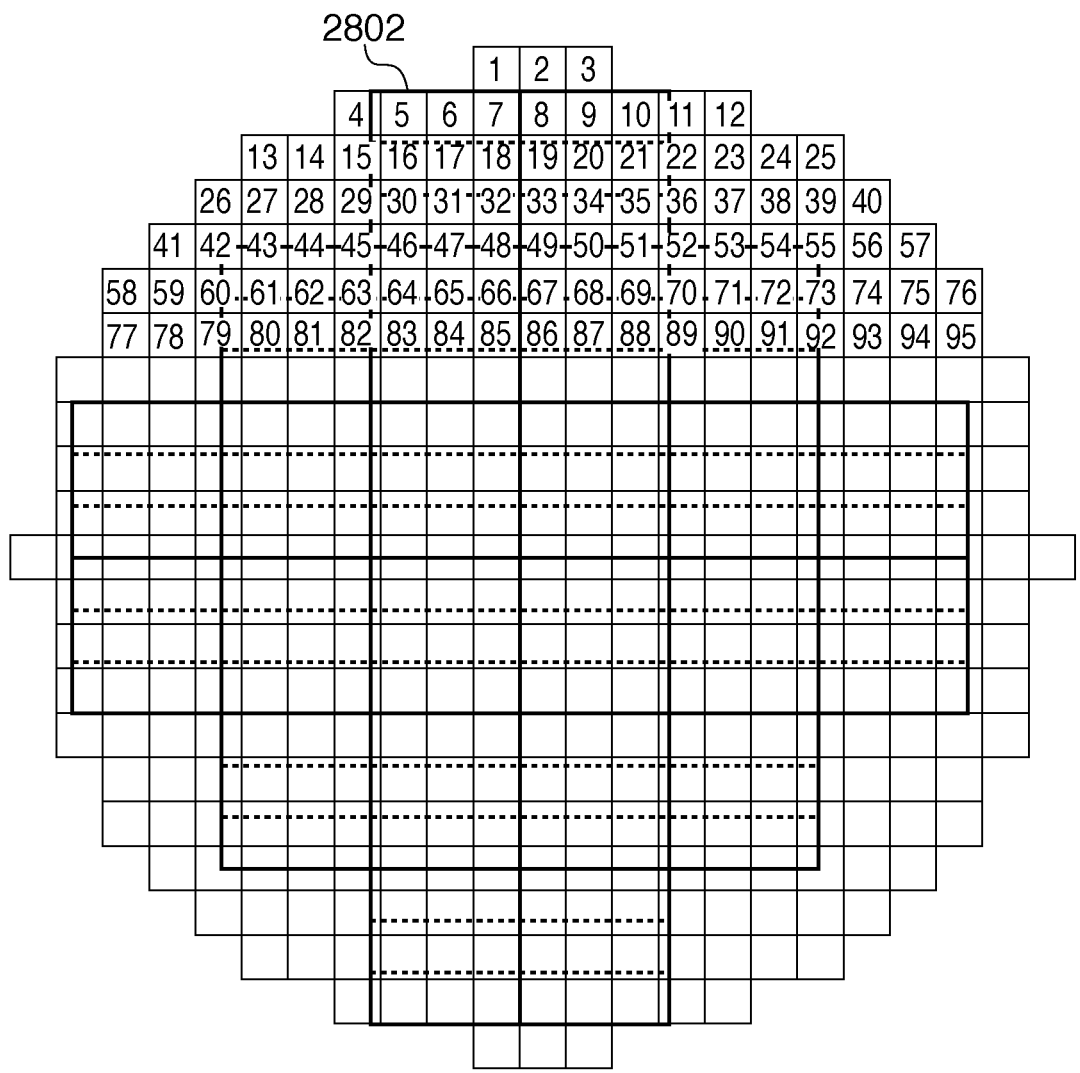
Figure 33C:
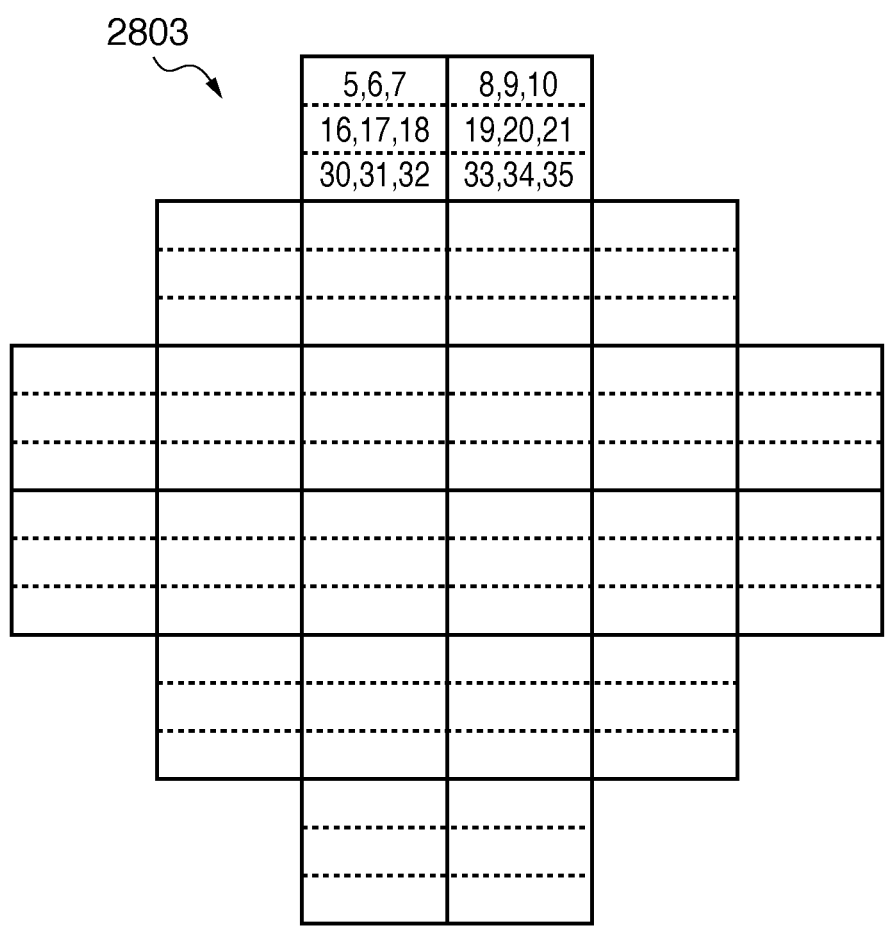
Figure 33D:
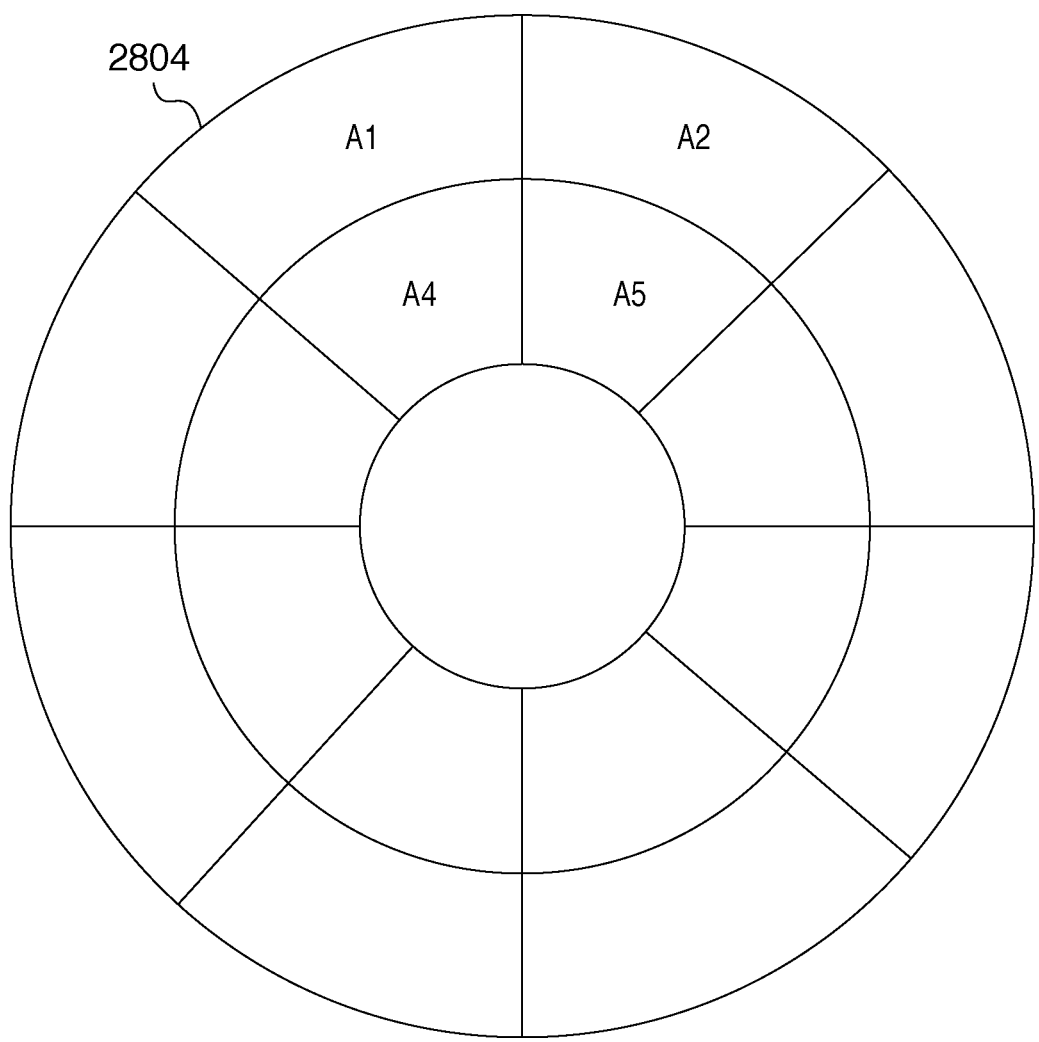
Figure 33E:
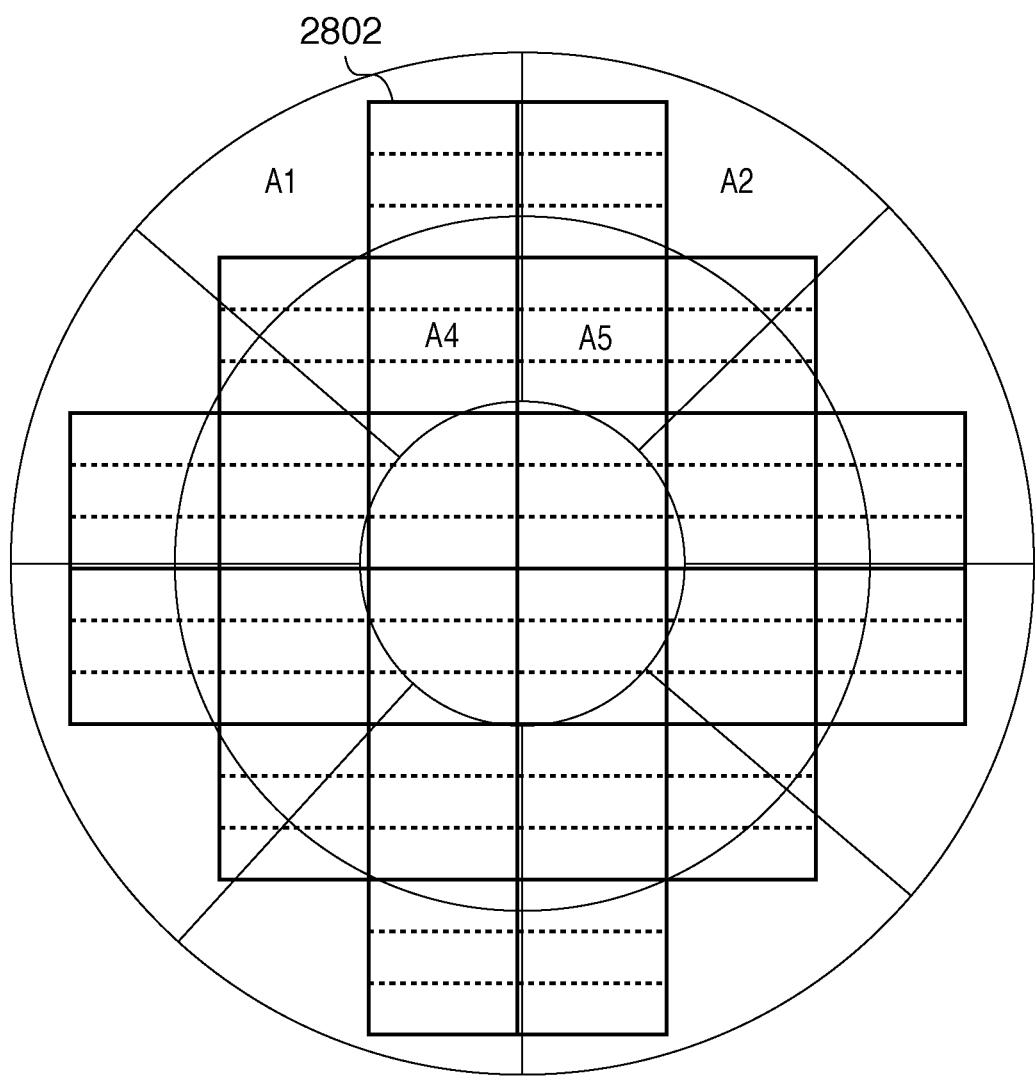
Figure 33F:
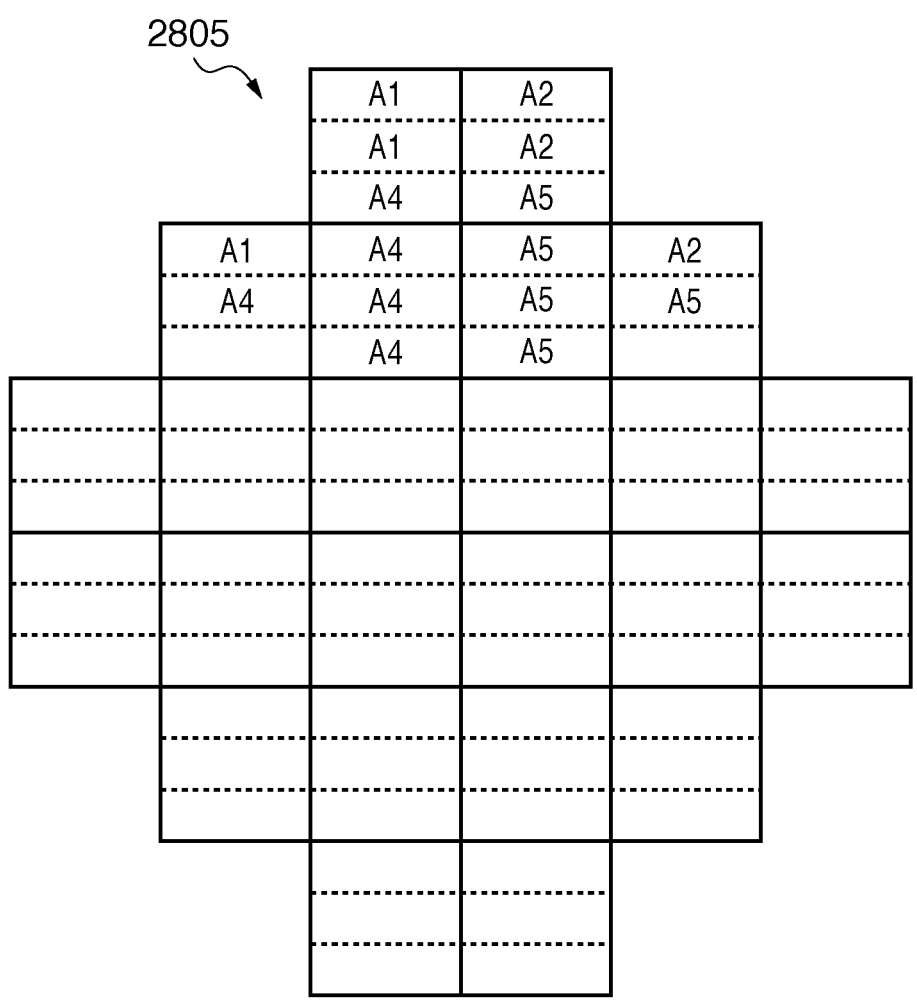

A method of obtaining the control value in a specific process in a specific exposure apparatus based on control information for each region of the specific process and apparatus control information for each region of the specific exposure apparatus will be explained below. FIG. 30 is a flowchart for explaining the sequence of this processing. FIG. 31 is a illustrating this processing.

Control information 2203 for each region of a specific process can be a control characteristic 2202 generated in a specific process, which is obtained by the processing of calculating the control value for each process layout region of a specific process described above. Alternatively, control information 2203 for each region of a specific process may be control information for each region of a process newly designed using a control characteristic 2202 generated in a specific process.

Apparatus control information 1803 for each region in an arbitrary exposure apparatus can be obtained in accordance with the processing in steps S702 to S704 and S1801 described above.

Note that the arbitrary exposure apparatus is designated as the filtering condition 225, and the region array of the specific process is designated in step S1801 (re-conversion step).

In integration processing step S2401, the apparatus control information 1803 for each converted region in the arbitrary apparatus is added to the control information 2203 for each region of the specific process.

As shown in FIG. 31, apparatus control information for each layout design region of the control information 2203 in the specific process is added with apparatus control information in an identical layout design region of the apparatus control information 1803 for each converted region in the arbitrary apparatus, thereby calculating the characteristic in this region. Executing this calculation for each layout design region makes it possible to determine apparatus control information 2402 in the specific process in an arbitrary exposure apparatus.

In step S1901 (control value processing step), the control value processing unit 255 outputs the control value for the apparatus control information 2402 in the specific process in the arbitrary apparatus, in accordance with the control condition 250. For example, the control condition 250 can be a coefficient (for example, 0.7), and a value obtained by multiplying the result for each region of the apparatus control information 2402 in the specific process by the coefficient can be set as a control offset.

The result of the apparatus control information 2402 is fed back to the exposure apparatus 100 via the communication interface 201, and is used as the control value for each layout design region of the specific process.

(Determination of Inspection Condition)

In this application example, information indicating a control deviation upon exposing a plurality of shot regions (design-dependent apparatus information containing shot region information) is converted into standardized apparatus information containing standard region information. By statistically processing this standardized apparatus information, an inspection region to execute inspection by inspection devices such as an overlay inspection device and pattern shape inspection device is determined.

The value of each shot region information (shot region information will also be referred to as first region information and can include, for example, the synchronization accuracy, focus/leveling measurement value, and focus/leveling followability) obtained by measurement by an exposure apparatus 100 during wafer processing includes the control characteristic of a wafer stage 7 and a characteristic for each process at the position of the corresponding shot region. However, by converting pieces of shot region information obtained by a plurality of processes into standard region information, and statistically processing it, a characteristic for each process can be removed from the standard region information. This makes it possible to detect a change in the control characteristic of the wafer stage 7 irrespective of whether the process is changed. A region in which a change in the control characteristic of the wafer stage 7 exceeds a tolerance is the one to be inspected by the inspection devices.

Pieces of shot region information (design-dependent apparatus information) obtained by different processes themselves are inappropriate for statistical processing by a statistical processing unit 224. For this reason, pieces of shot region information (design-dependent apparatus information) obtained by different processes are converted into standard region information (standardized apparatus information) by a converting unit 223, and it is statistically processed thereafter.

FIG. 34 is a view illustrating a method of determining the inspection region. In one example, an inspection region to be added to the current wafer is determined based on standardized apparatus information 3402 obtained from design-dependent apparatus information obtained by exposing the current wafer, and standardized apparatus information 3403 obtained from design-dependent apparatus information obtained by exposing the immediately preceding wafer. In this example, an inspection region 3404 added to wafer #2 of lot #1 can be set as an inspection region 3405 of wafer #1 of lot #2 having a different shot layout as well. This determination method is effective when an abnormality of control is likely to continuously occur in the same portion due to the influence of, for example, a foreign substance on the wafer stage 7 which holds the wafer.

An information processing apparatus 202 sends information indicating an inspection region 3406 to be added to the current wafer to a system having a function of changing the inspection conditions such as the inspection point of an inspection device 3411, for example, a management server 3501 which manages the manufacturing line. As a matter of course, if the information processing apparatus 202 has this function, such notification is unnecessary.

A measurement mark or measurement pattern in an additional inspection region 3407 can be set as an additional inspection point 3408 for each wafer. The management server 3501 combines the additional inspection point 3408 and an inspection point 3410 determined in each process, thereby determining an inspection point parameter change result 3409.

The inspection point parameter change result 3409 is sent to the inspection device 3411 to allow inspection which takes account of information including, for example, the control deviation result upon exposure.

A method of calculating a shot control characteristic unique to a process, which is obtained by removing a control characteristic unique to an exposure apparatus from the value of each shot region information (first apparatus information) obtained by measurement by the exposure apparatus 100 during wafer processing, will be explained next.

A measurement result S serving as shot region information is given by:

$$S = M + P + W$$

where M is the control characteristic of a wafer stage control system 13 for a certain shot region, P is a characteristic which depends on a process for the certain shot region (process characteristic), and W is a wafer-dependent characteristic (wafer characteristic).

The average of measurement results S obtained by executing a single process for i wafers is given by:

$$S/i = [(M + P + W1) + (M + P + W2) + \ldots + (M + P + Wi)]/i$$
$$= W1/i + W2/i + \ldots + Wi/i + M + P$$

If the number of wafers i is sufficiently large, Wi/i is negligibly smaller than M and P. Then, we have an approximation:

$$S/i = M + P$$

The average of the measurement results S serving as pieces of shot region information obtained by executing a single process for a large number of wafers includes the control characteristic M of the wafer stage control system 13, and the characteristic P unique to the process.

The average of the measurement results S for n processes assuming that a large number of wafers are provided for each process and S=M+P is given by:

$$S/n = [(P1 + M) + (P2 + M) + \ldots + (Pn + M)]/n$$
$$= P1/n + P2/n + \ldots + Pn/n + M$$

If the number of processes n is sufficiently large, Pn/n is negligibly smaller than M. Then, we have an approximation:

$$S/n = M$$

The average of the measurement results S serving as pieces of shot region information obtained by executing a large number of processes for a large number of wafers represents the control characteristic M of the wafer stage control system 13.

Note that the shot region array changes for each process, so shot region information for each process is converted into standard region information according to the standard region array by the converting unit 223 of the information processing apparatus 202. The statistical processing unit 224 then calculates the average in each standard region.

When the standard region information according to the standard region array is further converted into shot region information according to the shot region array of a specific process, exposure apparatus information S' for each shot region of the specific process is given by:

$$S' = S/i - S/n = M + P - M = P$$

The exposure apparatus information S' represents the characteristic P of each shot region of the specific process.

The standard region information can be compared irrespective of the process if the characteristic P of the shot region of a specific process and the control characteristic M of the wafer stage control system 13 are removed by the above-mentioned method.

Figure 35:
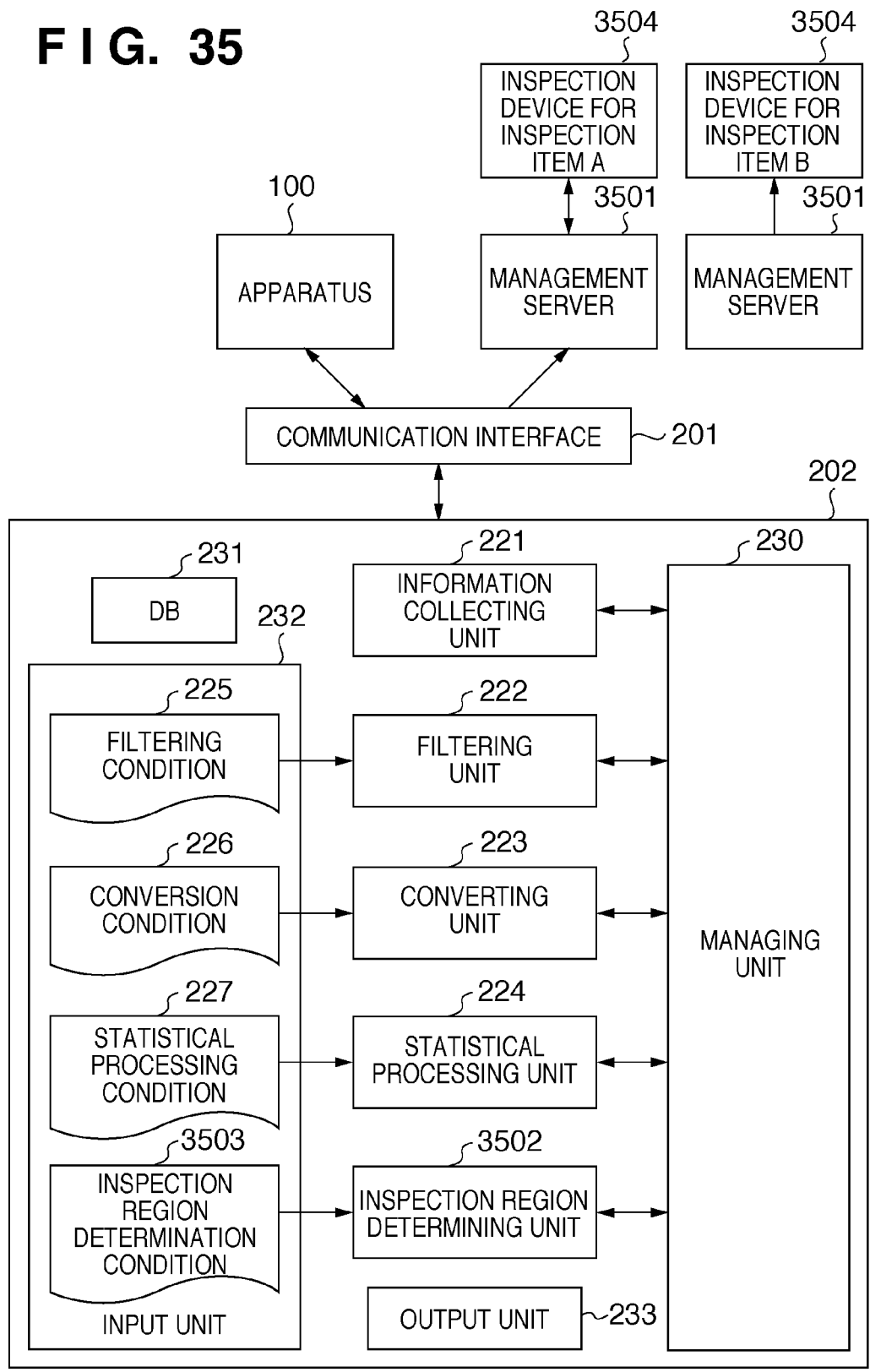
FIG. 35 is a block diagram showing an application example of the exposure system according to the preferred embodiment of the present invention.

FIG. 35 is a block diagram showing the configuration of a system for determining the inspection region. Although not shown, an information processing apparatus 202 may collect pieces of information from a plurality of exposure apparatuses 100.

An inspection region determining unit (inspection condition determining unit) 3502 determines the inspection region based on an inspection point determination condition 3503 input via an input unit 232, and the statistical processing result. The inspection region determined by the inspection region determining unit 3502 is sent, via a communication interface 201, to a system which can change the inspection point of an inspection device, for example, a management server 3501 which manages the manufacturing line. The management server 3501 issues an inspection point instruction to an inspection device 3504. One management server 3501 may issue instructions to a plurality of inspection devices 3504.

Figure 36:
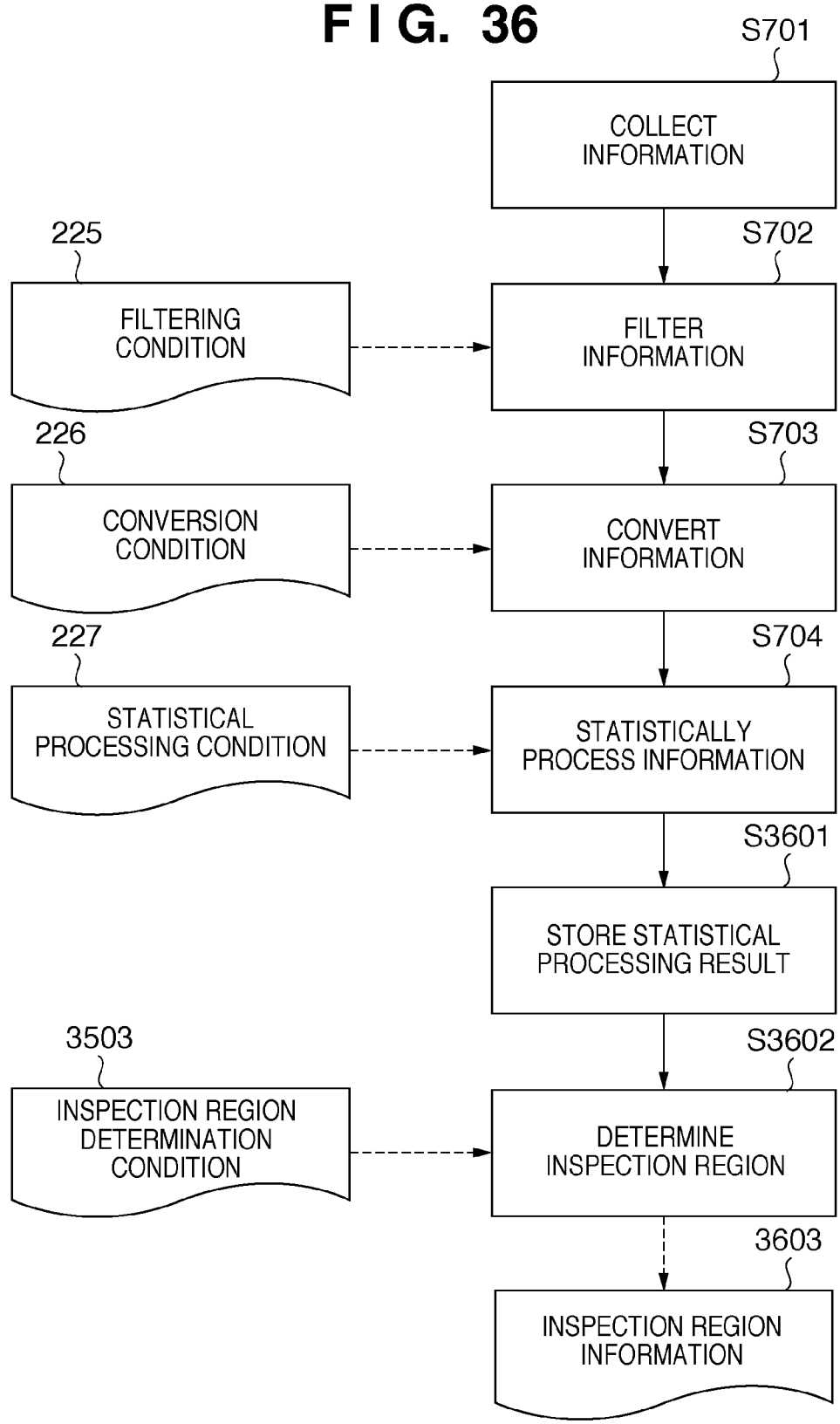
FIG. 36 is a flowchart illustrating the sequence of processing of determining addition or removal of an inspection region for each wafer.

FIG. 36 is a flowchart illustrating the sequence of processing of determining addition or removal of an inspection region for each wafer.

In step S701 (collection step), an information collecting unit 221 acquires design-dependent apparatus information from the exposure apparatus 100 via the communication interface 201 and a communication interface 17 of the exposure apparatus 100, and stores it in a database 231.

In step S702 (filtering step), a filtering unit 222 filters the design-dependent apparatus information (control result 324) stored in the database 231, in accordance with a filtering condition 225, thereby extracting necessary information. The filtering condition used herein can be designated arbitrarily. For example, control errors of the values involved in focus/leveling, the MAs in the X, Y, and θ directions, the MSDs in the X, Y, and θ directions, and the like can be designated as the filtering condition.

In step S703 (conversion step), a converting unit 223 converts the design-dependent apparatus information (first apparatus information) into standardized apparatus information (second apparatus information) in accordance with a designated conversion condition 226. The conversion condition 226 can be set via the input unit 232. An initial condition may be set to the conversion condition 226 in advance. The conversion condition 226 may be set even by selecting one of a plurality of conditions prepared in advance, as needed.

In step S704 (statistical processing step), a statistical processing condition 227 is designated, and a statistical processing unit 224 calculates the statistical value for each standard region in accordance with the statistical processing condition 227. The 3σ value, maximum value, minimum value, and the like of the control errors extracted by filtering can be designated as the statistical processing condition 227 in order to check a variation in the values filtered for each standard region.

In step S1601 (storage step), the statistical processing result is stored in the DB 231.

In step S1602 (inspection region determination step), the inspection region determining unit 3502 determines the inspection region in accordance with the inspection point determination condition 3503. Because the layout of regions has already been converted into a common standard region, an inspection region determination condition using the processing results of wafers having different processes can be set. For example, a region having a level higher than a determination level decided by calculating the moving average of the processing results of several immediately preceding wafers and multiplying the moving average by a coefficient (typically, a number more than 1) may be determined as an additional inspection region. Conversely, a region having a level lower than a determination level decided by multiplying the moving average by a coefficient (typically, a number less than 1) may be removed from the inspection region.

A region determined as the inspection region once may be used as the inspection region even for wafers in a number set thereafter.

Figure 37:
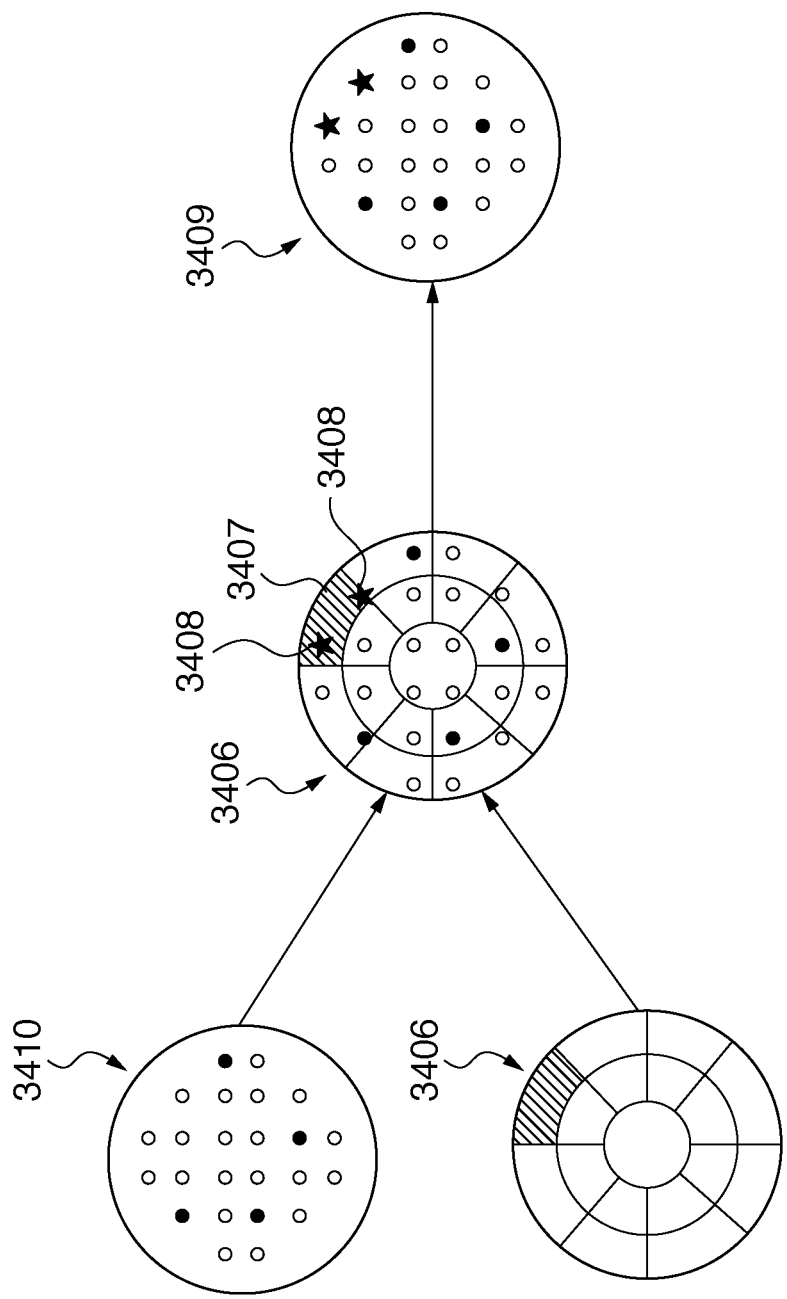
FIG. 37 is a view for exemplifying determination of inspection points.

The determined inspection region is sent to the management server 3501 via the communication interface 201. The determined inspection region is converted into an inspection point. As illustrated in FIG. 37, a measurement mark or measurement pattern which falls within a determined inspection region 3407 can be set as an inspection point 3408. An inspection point parameter change result 3409 can be obtained by combining the additional inspection point 3408 and an inspection point 3410 which has been determined already. The inspection point parameter change result 3409 can designate different inspection points in accordance with the inspection items and processes. The inspection regions can be converted into inspection points determined in accordance with the inspection items and processes. This conversion may be performed by either the information processing apparatus 202 or the control correction value condition 1501.

Figure 38:
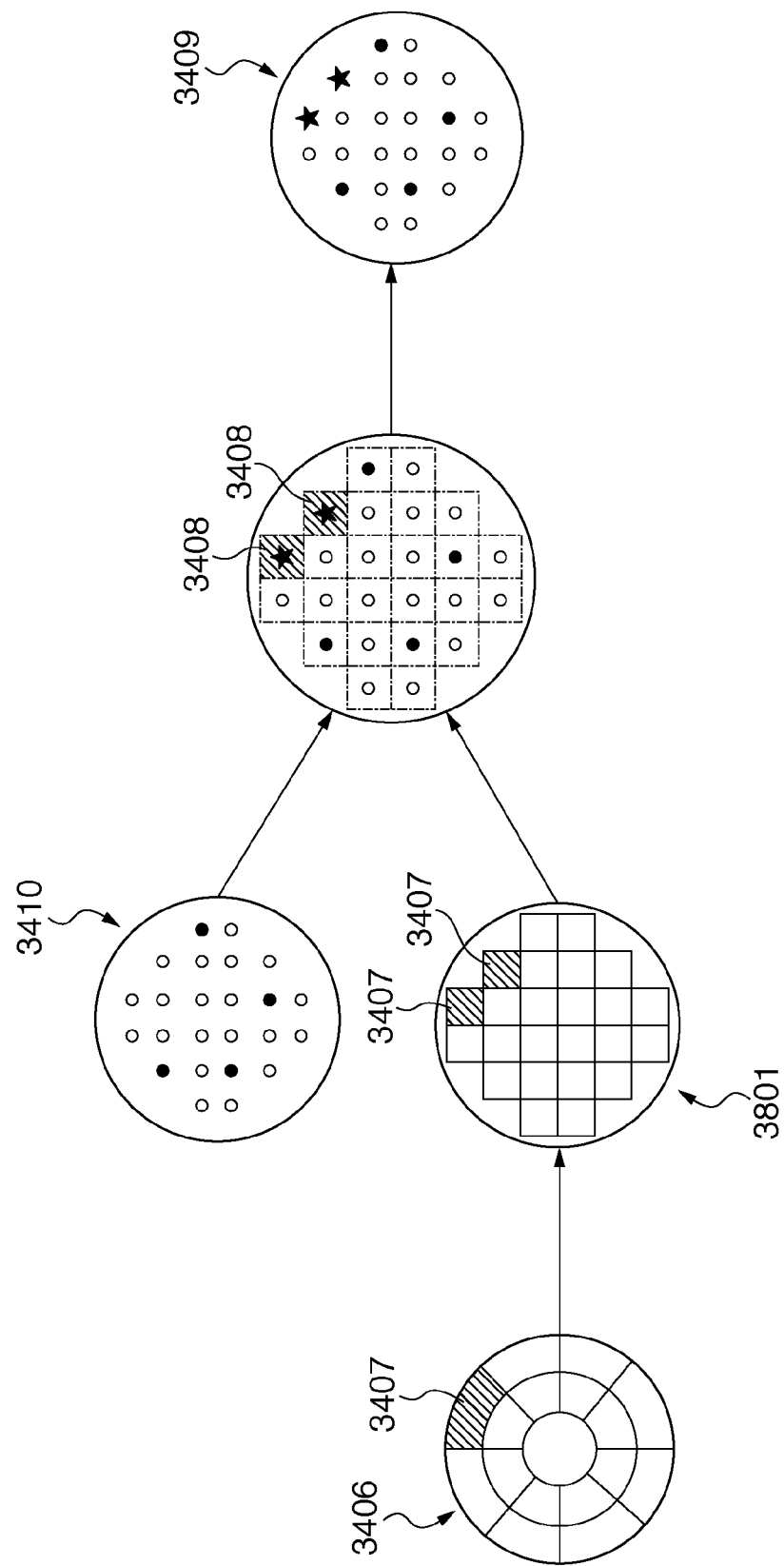
FIG. 38 is a view for exemplifying determination of inspection points.

Alternatively, the control correction value condition 1501 may generate additional inspection point information based on the shot layout information of a process of interest such as the shot number or shot position in the following way. That is, as shown in FIG. 38, the converting unit 223 of the information processing apparatus may re-convert the standard region array into a shot layout 3801 of a process of interest to obtain, for example, the shot number of the inspection region from the shot layout information, and send it to the management server.

An example in which the conversion by the converting unit 223 is used to determine the inspection point for a new process and to periodically update the inspection point will be explained below.

From the control result 324 (FIG. 3) of design-dependent apparatus information 3401 collected from the exposure apparatus by the information collecting unit 221, an item desired to be used for the inspection region determination is designated as the filtering condition 225. Using the information extracted in accordance with the filtering condition 225 by the filtering unit 222, the converting unit 223 converts the shot layout of a process into standardized apparatus information 3402 according to a common standard region array. Using the conversion result, the statistical processing unit 224 obtains a statistical result 3901 for each region based on all wafers extracted by the filtering. The statistical processing unit 224 designates, for example, 3σ as the statistical processing, and calculates 3σ for each standard region.

Based on the calculation result, the inspection region determining unit 3502 determines the inspection region in accordance with the average processing 1503. For example, it is possible to calculate the average of values in respective regions and determine a region having a value more than the average as the inspection region.

The determined inspection region is sent to the management server 3501 via the communication interface 201. The management server 3501 can add, as the measurement point, a measurement mark or measurement pattern to a measurement point parameter 3902 of a new process in the inspection region, thereby determining a measurement point parameter result 3409. Also, the inspection region may be periodically determined based on pieces of information on a plurality of lots from an exposure apparatus, and the measurement point parameter may be updated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-010997 filed on Jan. 21, 2008, and Japanese Patent Application No. 2008-046901 filed on Feb. 27, 2008, which are hereby incorporated by reference herein in their entirety.

What is claimed is:

1. An information processing apparatus for processing information generated by an exposure apparatus which exposes a substrate to radiant energy with respect to each of a plurality of shot regions on the substrate, at least one device being to be manufactured from each of the plurality of shot regions, the information processing apparatus comprising:
   a collecting unit configured to collect, from the exposure apparatus, first information obtained by the exposure apparatus with respect to each of a plurality of first regions which form a first array defined on the substrate via an exposure of each of the plurality of shot regions, each of the first regions being equal to or smaller than a corresponding one of the shot regions, and each of the shot regions including at least one of the first regions;
   a converting unit configured to convert at least a part of the collected first information into second information defined with respect to each of a plurality of second regions which form a standard array for use in evaluation of the exposure apparatus or the substrate, each of the first regions corresponding to at least one of the second regions;
   a statistical processing unit configured to statistically process the second information, the second information having been obtained with respect to information generated by the exposure apparatus with respect to a plurality of kinds of the first array, the plurality of kinds being different from each other in at least one of a dimension and position of each of the plurality of first regions on the substrate; and
   an analyzing unit configured to analyze the statistically processed information to obtain information about the evaluation of the exposure apparatus or the substrate.

2. The apparatus according to claim 1, wherein the analyzing unit is configured to calculate, with respect to each of the plurality of second regions, a difference between the statistically processed information obtained with respect to different periods to output the calculated difference.

3. The apparatus according to claim 1, wherein the analyzing unit is configured to output, in comparable forms, information on the statistically processed information obtained with respect to different periods.

4. The apparatus according to claim 1, wherein the analyzing unit is configured to calculate, with respect to each of the plurality of second regions, a difference between the statistically processed information obtained with respect to different periods, to output information on the calculated difference.

5. The apparatus according to claim 1, wherein
   the analyzing unit configured to set, as reference information, the statistically processed information obtained with respect to a first period, to set, as determination target information, the statistically processed information obtained with respect to a second period, to calculate a difference between the reference information and the determination target information with respect to each of the plurality of second regions, to output the calculated difference, and
   the first period is longer than the second period.

6. The apparatus according to claim 1, wherein
   the analyzing unit is configured to set, as reference information, the statistically processed information obtained with respect to a first period, to set, as determination target information, the statistically processed information obtained with respect to a second period, and to output, in comparable forms, information on the reference information and the determination target information, and
   the first period is longer than the second period.

7. The apparatus according to claim 1, wherein
   the analyzing unit is configured to set, as reference information, the statistically processed information obtained with respect to a first period, to set, as determination target information, the statistically processed information obtained with respect to a second period, to calculate a difference between the reference information and the determination target information with respect to each of the plurality of second regions, to output information on the calculated difference, and
   the first period is longer than the second period.

8. The apparatus according to claim 5, wherein the analyzing unit is configured to output information on a time-series change in the reference information.

9. The apparatus according to claim 6, wherein the analyzing unit is configured to output information on a time-series change in the reference information.

10. The apparatus according to claim 7, wherein the analyzing unit is configured to output information on a time-series change in the reference information.

* * * * *